(12) United States Patent
Ware et al.

(10) Patent No.: US 9,043,633 B2
(45) Date of Patent: *May 26, 2015

(54) MEMORY CONTROLLER WITH TRANSACTION-QUEUE-MONITORING POWER MODE CIRCUITRY

(71) Applicant: Rambus Inc., Sunnyvale, CA (US)

(72) Inventors: Frederick A. Ware, Los Altos Hills, CA (US); Robert E. Palmer, Chapel Hill, NC (US); John W. Poulton, Chapel Hill, NC (US); Andrew M. Fuller, Durham, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,687

(22) Filed: Nov. 18, 2014

(65) Prior Publication Data

US 2015/0074437 A1    Mar. 12, 2015

Related U.S. Application Data

(63) Continuation of application No. 13/132,094, filed as application No. PCT/US2009/050020 on Jul. 9, 2009, now Pat. No. 8,918,669.

(60) Provisional application No. 61/144,135, filed on Jan.
(Continued)

(51) Int. Cl.
  *G06F 1/04* (2006.01)
  *G06F 1/08* (2006.01)
  (Continued)

(52) U.S. Cl.
  CPC .............. *G06F 1/12* (2013.01); *G06F 9/3836* (2013.01); *G11C 7/04* (2013.01); *G11C 7/10* (2013.01);
  (Continued)

(58) Field of Classification Search
  CPC ... G06F 9/3836; G06F 12/0857; G06F 13/36; G06F 2201/88
  USPC ................................. 713/400, 500, 502, 600
  See application file for complete search history.

(56) References Cited

U.S. PATENT DOCUMENTS

| 5,615,376 A | 3/1997 | Ranganathan |
| 6,101,151 A | 8/2000 | Watanabe et al. |

(Continued)

FOREIGN PATENT DOCUMENTS

| EP | 1865648 | 12/2007 |
| JP | 62-154915 | 7/1987 |

(Continued)

OTHER PUBLICATIONS

CN Amendment Submitted Apr. 12, 2012 re CN Application No. 200980151567.6. 13 pages.

(Continued)

*Primary Examiner* — Michael J Brown
(74) *Attorney, Agent, or Firm* — Charles Shemwell

(57) ABSTRACT

An integrated-circuit memory controller outputs to a memory device a first signal in a first state to enable operation of synchronous data transmission and reception circuits within the memory device. A transaction queue within the memory controller stores memory read and write requests that, to be serviced, require operation of the synchronous data transmission and reception circuits, respectively, within the memory device. Power control circuitry within the memory controller determines that the transaction queue has reached a predetermined state and, in response, outputs the first signal to the memory device in a second state to disable operation of the synchronous data transmission and reception circuits within the memory device.

20 Claims, 33 Drawing Sheets

Related U.S. Application Data 12, 2009, provisional application No. 61/156,872, filed on Mar. 2, 2009, provisional application No. 61/177,467, filed on May 12, 2009, provisional application No. 61/117,478, filed on May 12, 2009, provisional application No. 61/447,596, filed on May 12, 2009, provisional application No. 61/177,599, filed on May 12, 2009, provisional application No. 61/177,606, filed on May 12, 2009.

(51) Int. Cl.
| | |
|---|---|
| *G06F 1/12* | (2006.01) |
| *G11C 7/04* | (2006.01) |
| *G11C 7/10* | (2006.01) |
| *G11C 7/22* | (2006.01) |
| *G11C 11/4076* | (2006.01) |
| *G11C 11/4096* | (2006.01) |
| *G06F 13/16* | (2006.01) |
| *G06F 1/32* | (2006.01) |
| *G06F 9/38* | (2006.01) |

(52) U.S. Cl.
CPC ............ *G11C 7/1051* (2013.01); *G11C 7/1066* (2013.01); *G11C 7/1072* (2013.01); *G11C 7/1078* (2013.01); *G11C 7/109* (2013.01); *G11C 7/1093* (2013.01); *G11C 7/22* (2013.01); *G11C 7/222* (2013.01); *G11C 7/225* (2013.01); *G11C 11/4076* (2013.01); *G11C 11/4096* (2013.01); *G11C 2207/2254* (2013.01); *G06F 13/1689* (2013.01); *Y02B 60/1228* (2013.01); *G06F 1/3225* (2013.01); *G06F 1/324* (2013.01)

(56) References Cited

U.S. PATENT DOCUMENTS

| | | | |
|---|---|---|---|
| 6,388,480 | B1 | 5/2002 | Stubbs et al. |
| 6,405,296 | B1 | 6/2002 | Hampel et al. |
| 6,496,043 | B1 | 12/2002 | Moss et al. |
| 6,556,505 | B1 | 4/2003 | Tojima et al. |
| 6,581,165 | B1 | 6/2003 | Weintraub |
| 6,678,832 | B1 | 1/2004 | Gotanda |
| 6,815,977 | B2 | 11/2004 | Sabbavarapu et al. |
| 7,298,179 | B2 | 11/2007 | Lewis |
| 7,759,998 | B2 | 7/2010 | Ishikawa |
| 8,121,237 | B2 | 2/2012 | Stott et al. |
| 8,918,669 | B2 * | 12/2014 | Ware et al. .................. 713/500 |
| 2001/0028599 | A1 | 10/2001 | Aikawa |
| 2002/0078316 | A1 | 6/2002 | Nakamura |
| 2002/0083359 | A1 | 6/2002 | Dow |
| 2002/0110212 | A1 | 8/2002 | Lysdal et al. |
| 2002/0141280 | A1 | 10/2002 | Hamamoto et al. |
| 2002/0150189 | A1 | 10/2002 | Ware et al. |
| 2004/0046611 | A1 | 3/2004 | Uneme |
| 2004/0130366 | A1 | 7/2004 | Lin et al. |
| 2005/0034009 | A1 | 2/2005 | Sutardja et al. |
| 2005/0179479 | A1 | 8/2005 | Nguyen et al. |
| 2005/0226201 | A1 | 10/2005 | McMillin |
| 2005/0242850 | A1 | 11/2005 | Kawasaki |
| 2005/0276322 | A1 | 12/2005 | Best |
| 2006/0028905 | A1 | 2/2006 | Johnson et al. |
| 2006/0234661 | A1 | 10/2006 | Toyota et al. |
| 2007/0133312 | A1 | 6/2007 | Roohparvar |
| 2008/0056030 | A1 | 3/2008 | Cho |
| 2008/0130396 | A1 | 6/2008 | Gomm et al. |
| 2008/0272814 | A1 | 11/2008 | Chiang et al. |
| 2009/0055781 | A1 | 2/2009 | Araya |

FOREIGN PATENT DOCUMENTS

| | | |
|---|---|---|
| JP | 03-259637 | 11/1991 |
| JP | 08-221315 A | 8/1996 |
| JP | 2000-100159 A | 4/2000 |
| JP | 2000-163972 A | 6/2000 |
| JP | 2000-215663 A | 8/2000 |
| JP | 2003-050739 A | 2/2003 |
| JP | 2003-058415 A | 2/2003 |
| JP | 2003-272380 A | 9/2003 |
| JP | 3542967 B2 | 7/2004 |
| JP | 2004-228844 A | 8/2004 |
| JP | 2007-012166 A | 1/2007 |
| JP | 2009-278478 A | 11/2009 |
| WO | WO-99-46687 A1 | 9/1999 |
| WO | WO-2008-075311 A2 | 6/2008 |

OTHER PUBLICATIONS

CN Response dated May 4, 2012 re Amendments in CN Application No. 200980151566.1. 11 pages.
EP Extended Search Report dated Mar. 6, 2014 in EP Application No. 09837752.6. 6 pages.
EP Extended Search Report re Application No. 09837751.8 dated Jan. 31, 2012. 8 pages.
EP Office Action dated Mar. 25, 2014 in EP Application No. 09837752.6. 1 page.
EP Office Communication dated Nov. 24, 2011 re Extended EP Search Report for EP Application No. 09837753.4. 8 pages.
EP Office Communication dated Feb. 17, 2012 re EP Application No. 09837751.8. 1 page.
EP Response dated Aug. 27, 2012 re EP Application No. 09837751.8, Includes New Claims and New Description pp. 1 and 1a. 16 pages.
EP Response dated Jun. 19, 2012 to EP Office Action of Dec. 13, 2011 in EP Application No. 09837753.4-1233. 24 pages.
EP Response dated Jun. 26, 2012 to the Official Communication dated Dec. 21, 2011 in EP Application No. 09837755.9, Includes New Claims 1-19 and New Descriptions for pp. 2 and 2a. 19 pages.
EP Supplementary European Search Report dated Nov. 7, 2011 re EP Application No. 09837755.9. 3 pages.
International Search Report and Written Opinion dated Feb. 22, 2010 in International Application No. PCT/US2009/050039. 10 pages.
JP Request for Examination and Voluntary Amendment dated Jun. 11, 2012 re JP Application No. 2011-545344. 6 pages.
PCT International Search Report and Written Opinion dated Jan. 25, 2010 in International Application No. PCT/US2009/050023. 10 pages.
PCT International Search Report and Written Opinion dated Jan. 27, 2010 in International Application No. PCT/US2009/050016. 12 pages.
PCT International Search Report and Written Opinion dated Jan. 29, 2010 in International Application No. PCT/US2009/050044. 9 pages.
PCT International Preliminary Report (Chapter 1) dated Jul. 21, 2011 in International Application No. PCT/US2009/050016. 7 pages.
PCT International Preliminary Report (Chapter 1) dated Jul. 21, 2011 in International Application No. PCT/US2009/050020. 5 pages.
Preliminary Report (Chapter II) dated Apr. 29, 2011 in International Application No. PCT/US2009/050039. 9 pages.
Response to Written Opinion under Article 34 dated Nov. 12, 2010 in International Application No. PCT/US2009/050039. 3 pages.
Yeung et al., "A 2.4 Gb/s/pin Simultaneous Bidirectional Parallel Link with Per-Pin Skew Compensation," IEEE Journal of Solid-State Circuits, vol. 35, No. 11, pp. 1619-1627, Nov. 2000. 10 pages.

* cited by examiner

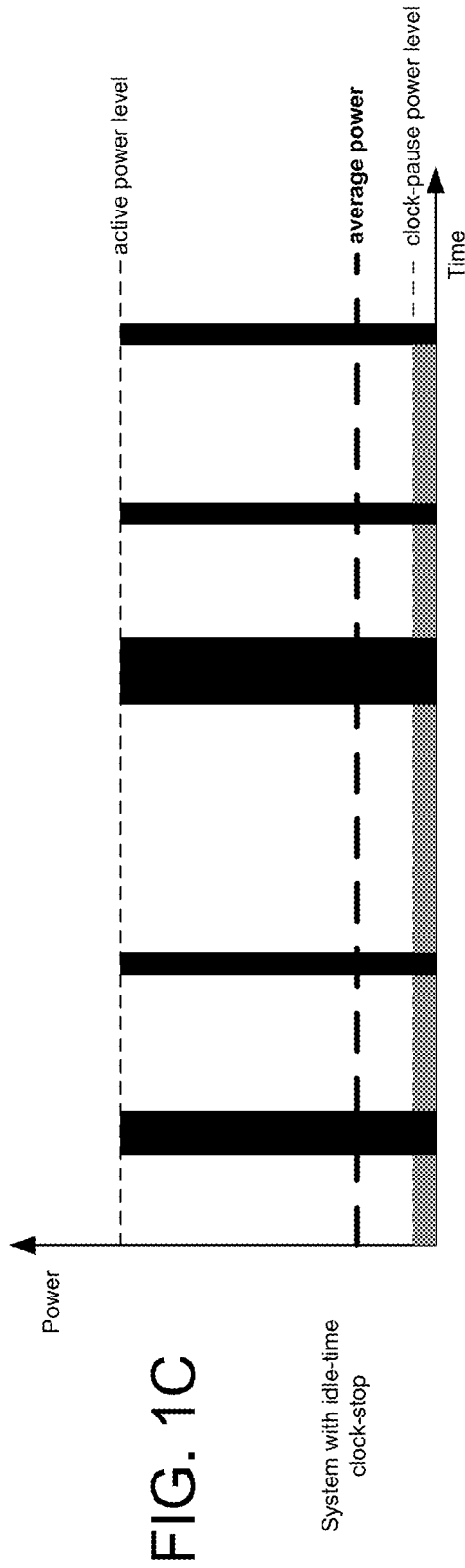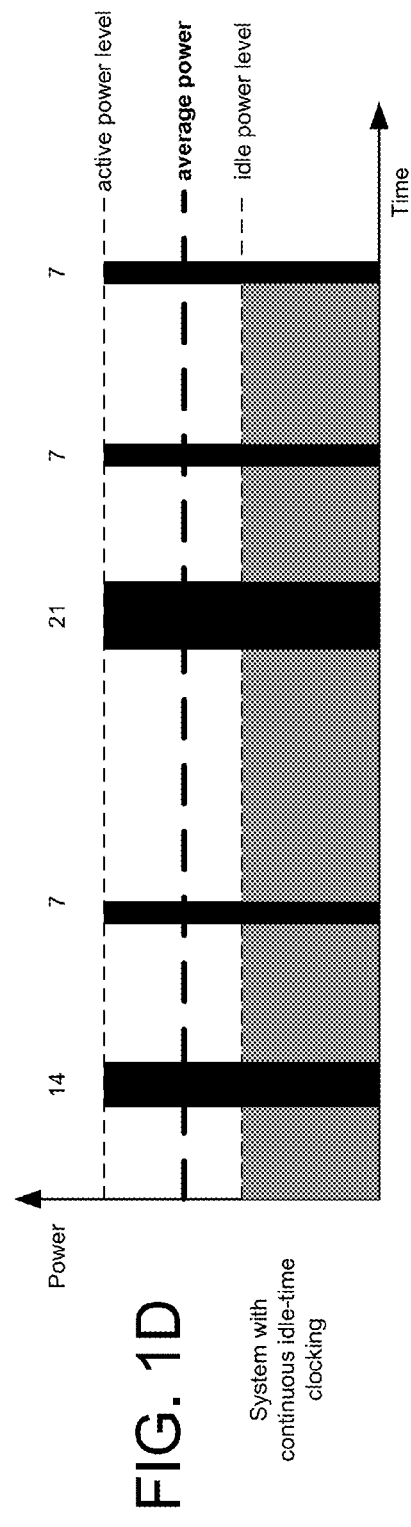

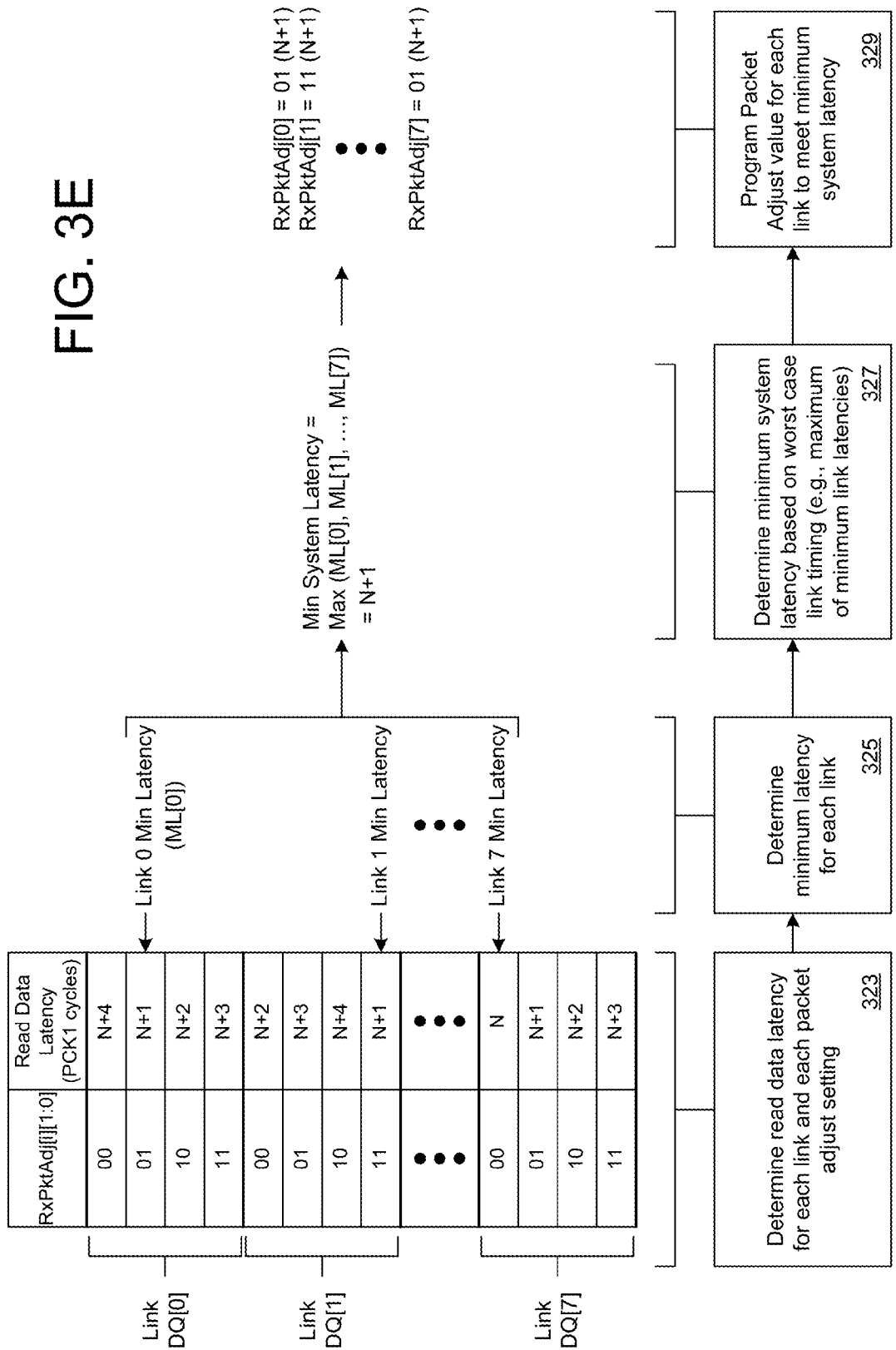

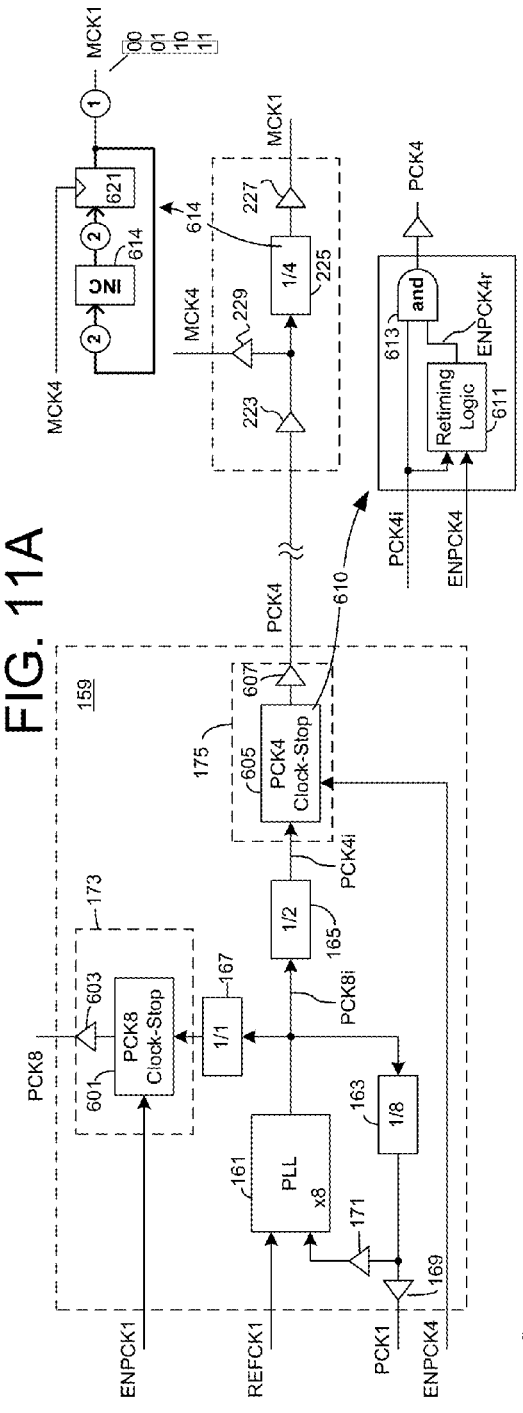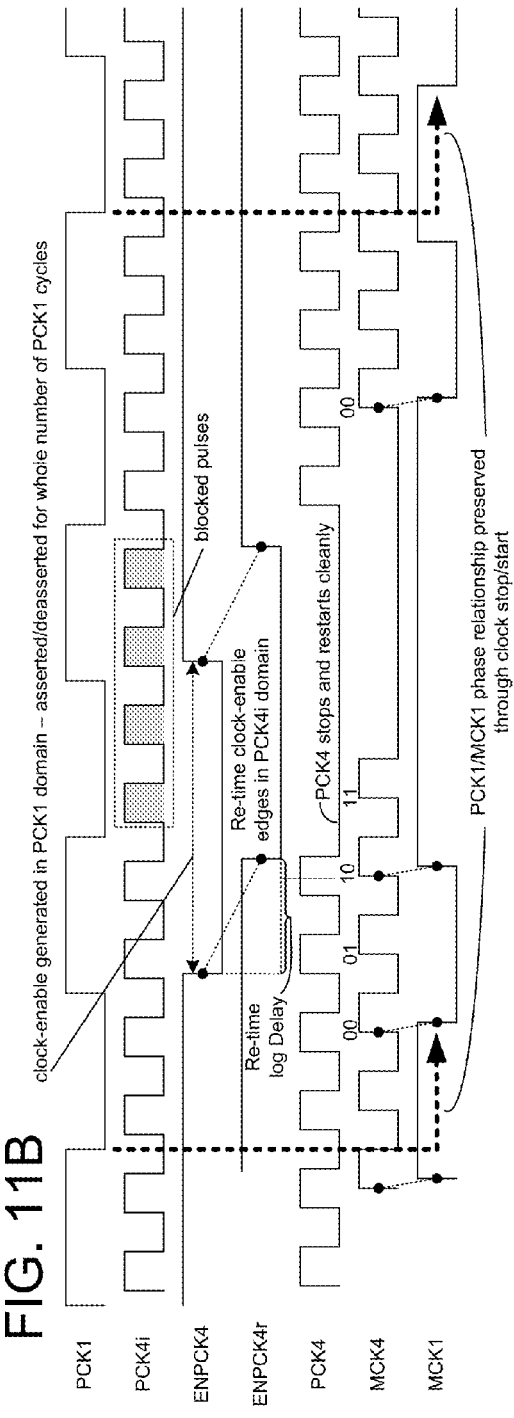

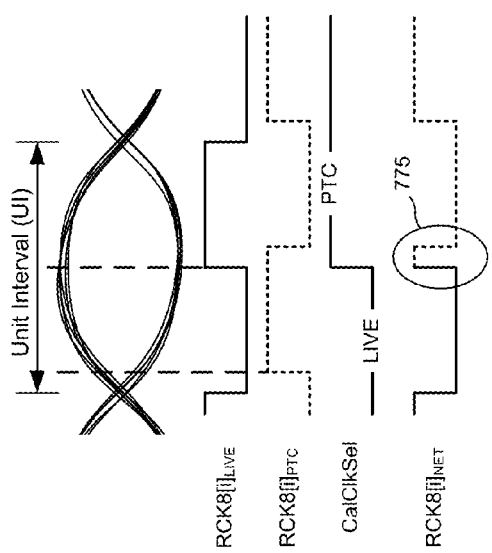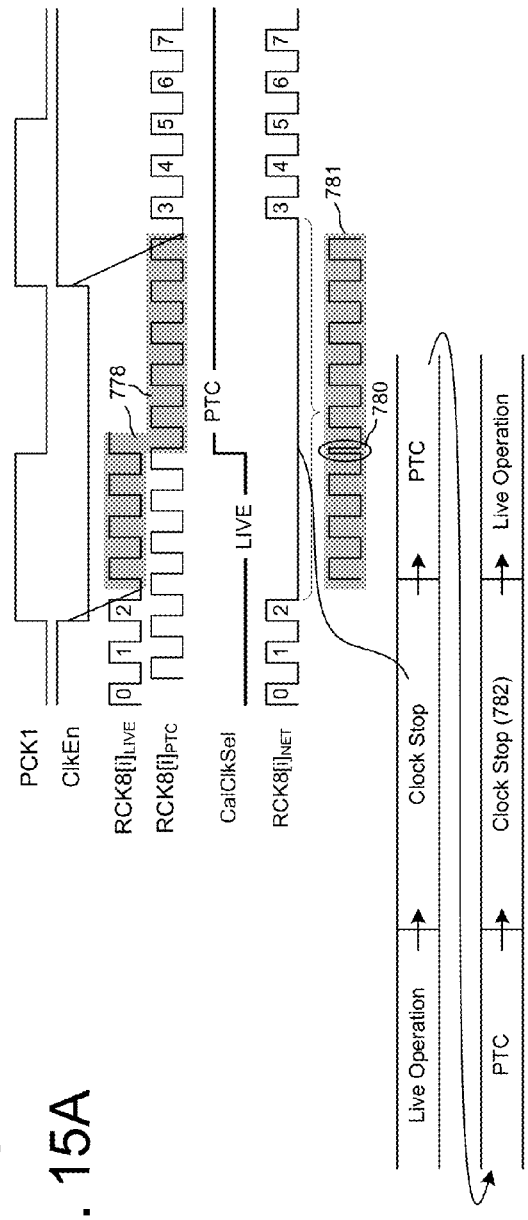

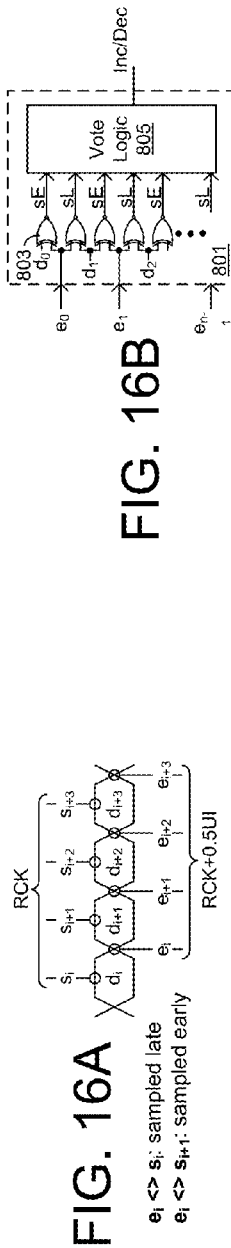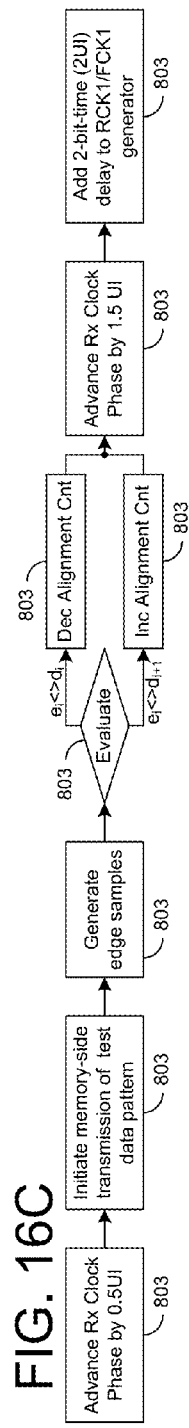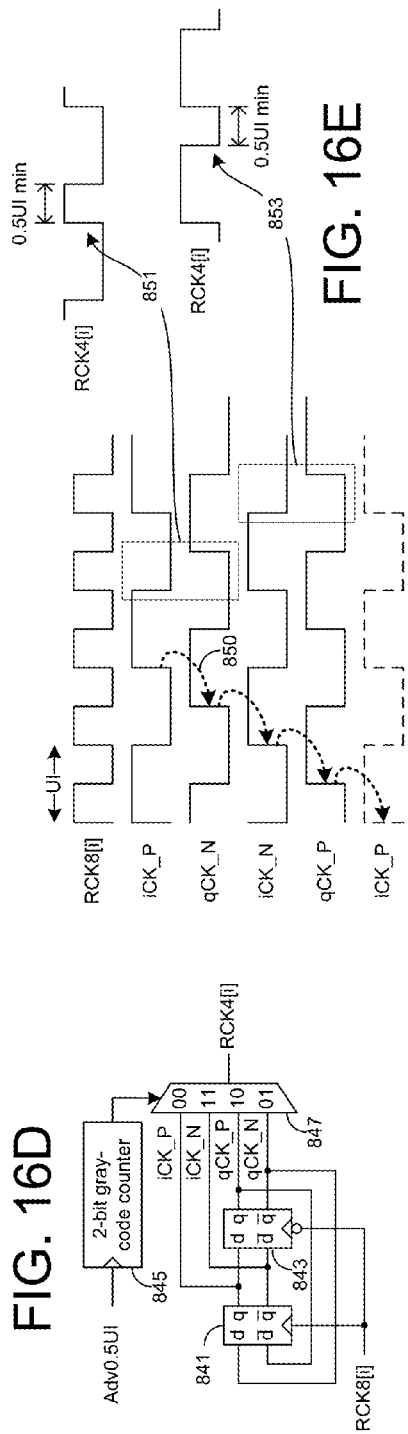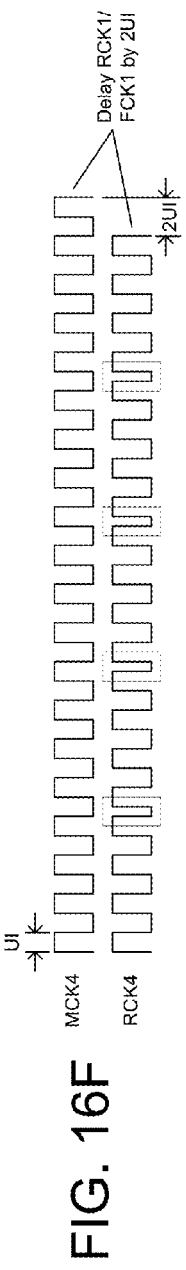

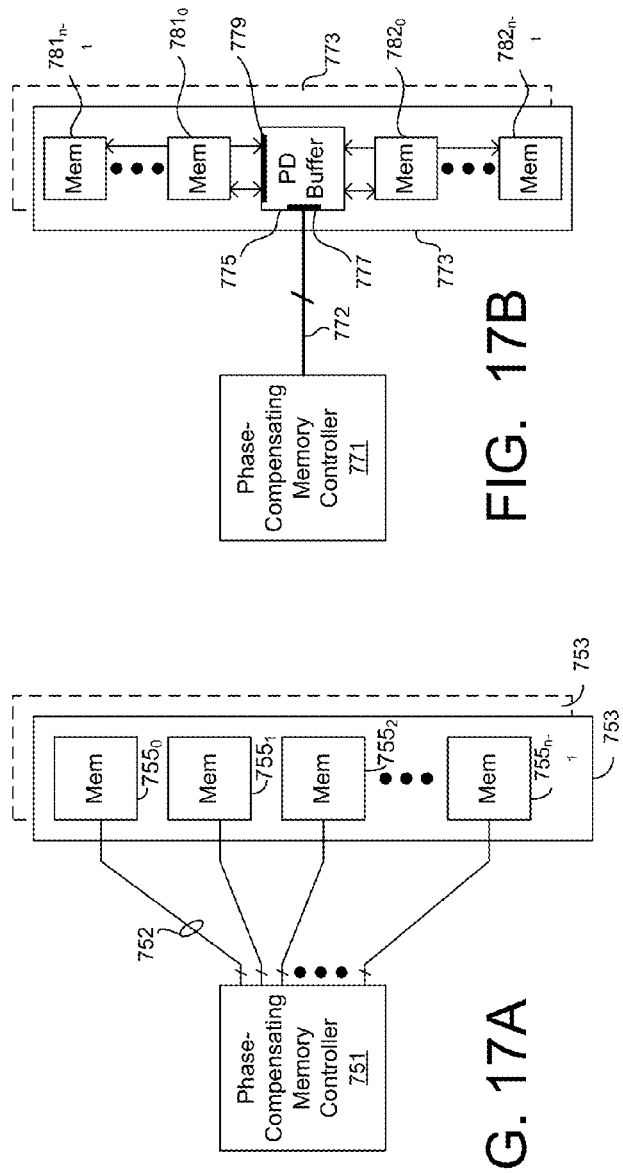
FIG. 17B
FIG. 17A
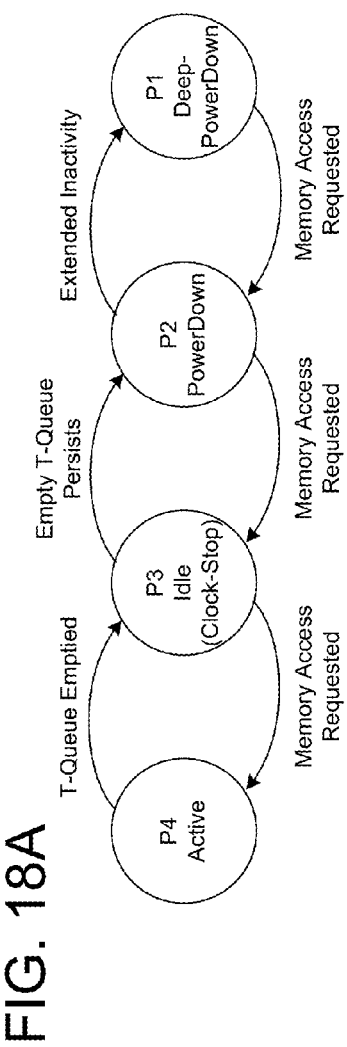
FIG. 18A

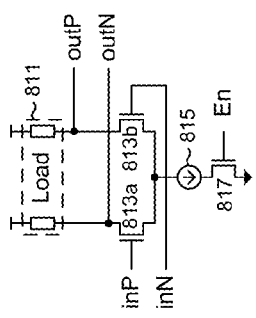
FIG. 18C
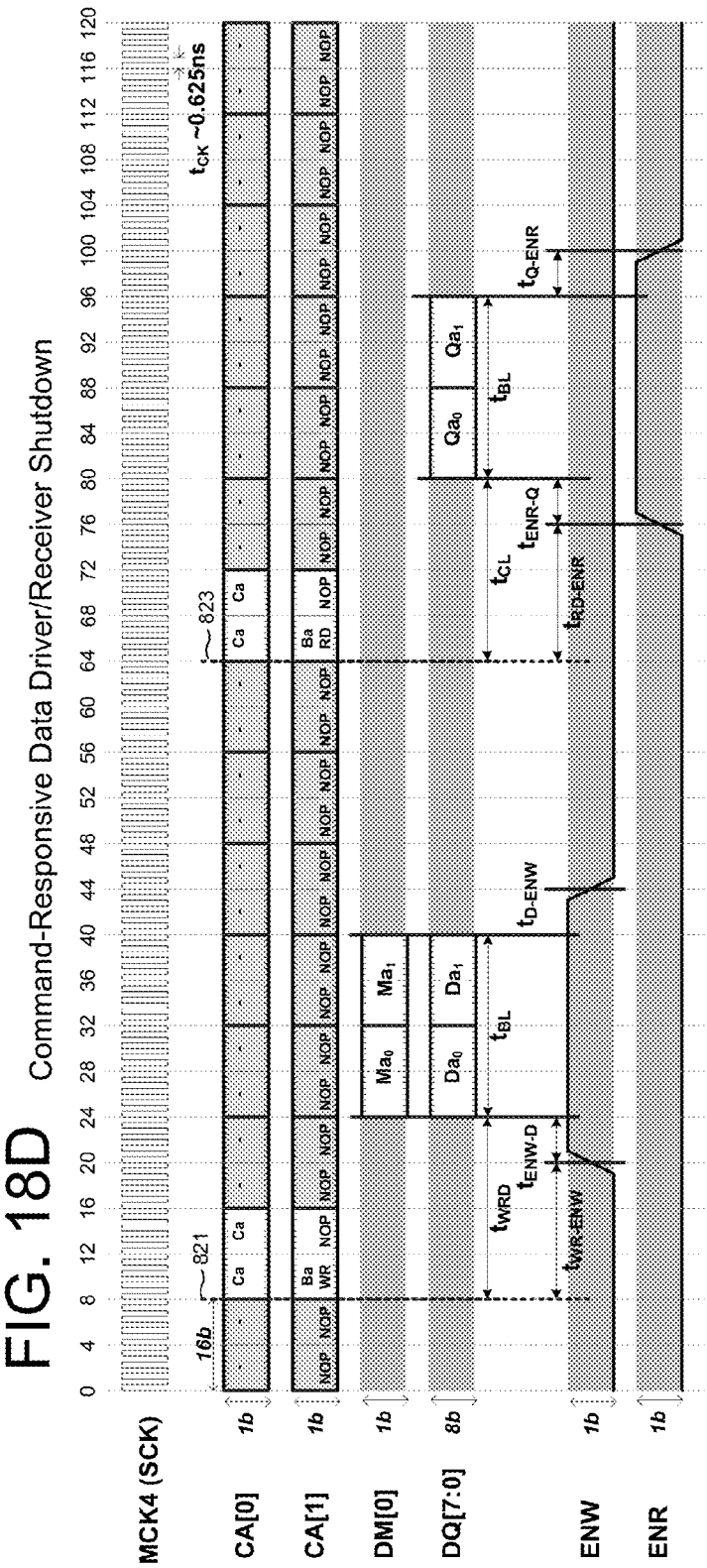
FIG. 18D  Command-Responsive Data Driver/Receiver Shutdown

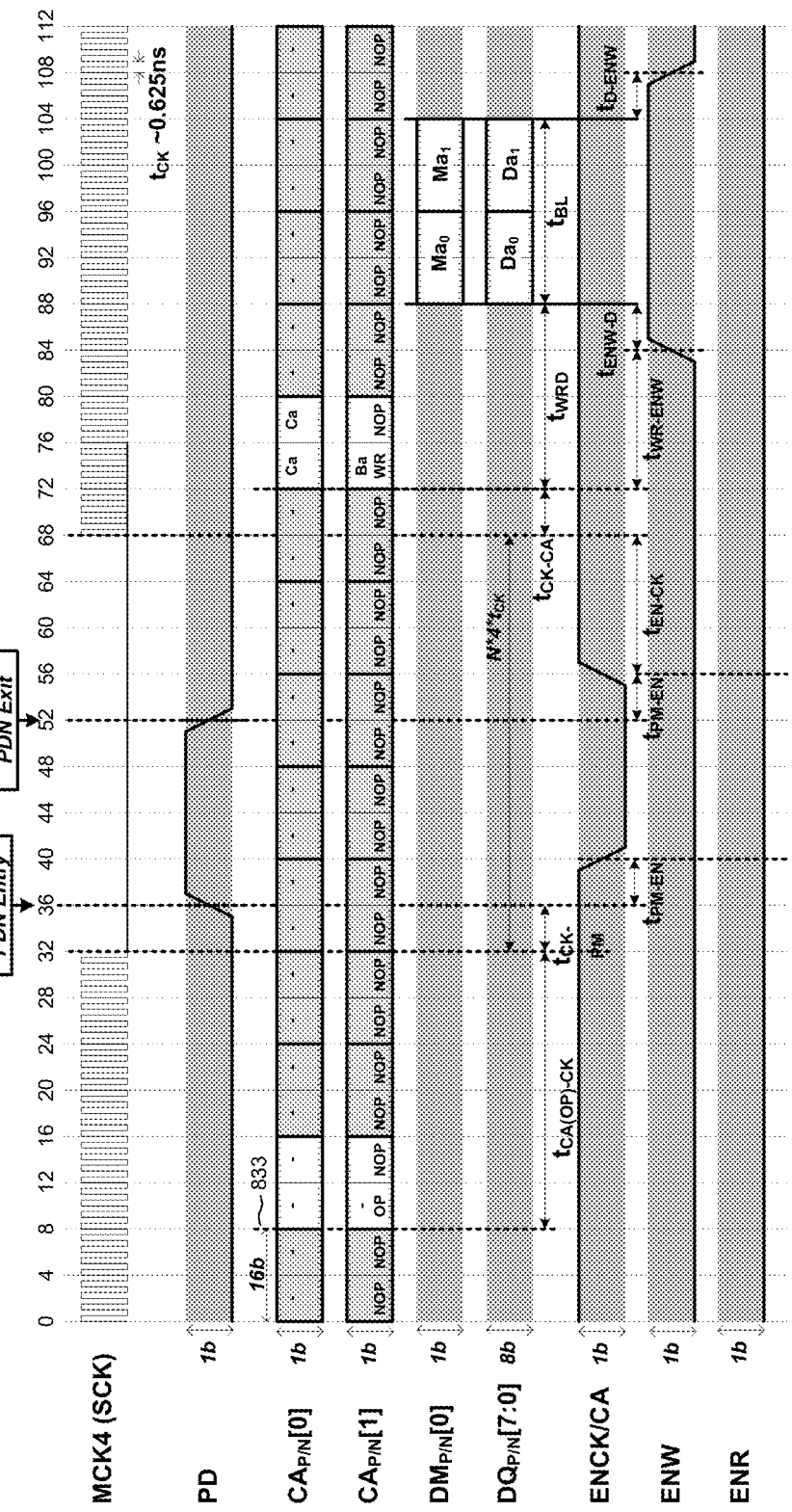
FIG. 18E  Powerdown Mode Entry/Exit – Write

US 9,043,633 B2

MEMORY CONTROLLER WITH TRANSACTION-QUEUE-MONITORING POWER MODE CIRCUITRY

PRIORITY CLAIM

This application is a continuation of U.S. patent application Ser. No. 13/132,094 filed Jun. 1, 2011, which is a 35 U.S.C. §371 U.S. National Stage of International Patent Application No. PCT/US2009/050020 filed Jul. 9, 2009, which claims priority to the following U.S. Provisional Patent Applications:

| Application Number | Application Filing Date |
| --- | --- |
| Provisional Application No. 61/144,135 | Jan. 12, 2009 |
| Provisional Application No. 61/156,872 | Mar. 2, 2009 |
| Provisional Application No. 61/177,467 | May 12, 2009 |
| Provisional Application No. 61/177,478 | May 12, 2009 |
| Provisional Application No. 61/177,596 | May 12, 2009 |
| Provisional Application No. 61/177,599 | May 12, 2009 |
| Provisional Application No. 61/177,606 | May 12, 2009 |

Each of the above-identified patent applications is hereby incorporated by reference in its entirety.

TECHNICAL FIELD

The disclosure herein relates to data communications systems generally and more specifically to high-speed signaling in low-power applications.

BACKGROUND

Mesochronous clock signals are often used to time signaling operations in synchronous memory systems. By using the same clock source to provide transmit/receive timing within both the memory controller and memory devices, frequency drift is avoided, resulting in a relatively simple, robust timing arrangement. Because the clock reference is distributed in space between controller and memory, however, the clock domains of the two chips generally have an arbitrary phase offset with respect to each other that must be compensated to enable synchronous communication. Complicating matters, the chip-to-chip phase offset tends to drift substantially with temperature and voltage, in large part due to the clock buffering circuitry provided within each chip to fan-out the clock to the various transmit and receive circuits.

Many modern memory systems manage the chip-to-chip phase drift by transmitting strobes or other source-synchronous timing signals to control data sampling within the recipient device, in effect extending the clock domain of the transmitting device into the receiving device. Unfortunately, this approach suffers a considerable power/cost penalty as additional signal drivers, pins and precisely routed signal lines (to match the propagation time between strobe and data lines) are usually required.

Another approach is to compensate for the drifting phase offset by providing a phase-locked loop (PLL) or delay-locked loop (DLL) within the memory controller and each memory device to maintain alignment between the reference clock and the distributed clock (i.e., the multiplicity of nominally same-phase clocks distributed to the various receive and transmit circuits). By this arrangement, a substantially fixed phase relationship may be maintained between the chips despite environmentally induced drift between their respective clock-buffer delays.

While the PLL/DLL approach avoids many of the penalties of source-synchronous arrangements (especially the consumption of precious pins), PLL and DLL circuits tend to be power hungry, consuming power even during idle periods (to maintain phase-lock) and requiring considerable time and additional power to restore phase-lock when awakened from a disabled, power-saving state. All these disadvantages are particularly problematic in mobile applications (e.g., cell phones, laptop computers and the like), where performance demands and bursty transaction profiles make it difficult to disable locked-loop operation and yet the large idle power of the locked-loop circuits drains precious battery life.

BRIEF DESCRIPTION OF THE DRAWINGS

The disclosure herein is illustrated by way of example, and not by way of limitation, in the figures of the accompanying drawings and in which like reference numerals refer to similar elements and in which:

FIGS. 1C and 1D contrast an exemplary power consumption profile in the pause-able-clock memory device of FIG. 1 with an exemplary power-consumption profile for a continuously-clocked PLL/DLL-based memory device under the same usage scenario;

FIGS. 3C-3E illustrate an embodiment of a packet-alignment circuit that may be applied within the drift-compensating deserializer of FIG. 3A and manner of adjusting same;

FIG. 11A illustrates an exemplary clocking arrangement used within the embodiment of FIG. 2A, explicitly showing clock stop logic for the controller I/O clock and for the data-rate system clock forwarded to the memory device;

FIG. 11B is an exemplary timing diagram of the clock-stop (or clock pause) operation of the FIG. 11A clocking architecture;

FIGS. 15A and 15B illustrate an exemplary clock-stop operation used to avoid clock glitches when entering and exiting periodic-timing-calibration mode;

FIGS. 16A-16F relate to an alternative manner of performing periodic-timing calibration that enables glitchless phase jumping without clock-stoppage;

FIG. 17A illustrates an embodiment of a pause-able-clock memory system having a single controller IC and multiple memory ICs;

FIG. 17B illustrates an embodiment of a pause-able-clock memory system having a module-mounted buffer IC that implements an interface that corresponds to the memory-side I/O interface shown in FIG. 2A;

FIG. 18A is an exemplary state diagram illustrating tiered power modes that may be employed within the memory system of FIGS. 1A and 2A;

FIG. 18C illustrates an implementation of a differential amplifier having a biasing circuit that may be disabled in a reduced power mode;

FIG. 18D is a timing diagram illustrating command-based assertion of the enable-write and enable-read signals (EnW and EnR) in response to incoming memory write and memory read requests, respectively; and FIG. 18E is a timing diagram illustrating powerdown mode entry and exit, with the exit being triggered by a memory write request.

DETAILED DESCRIPTION

Figure 1A:
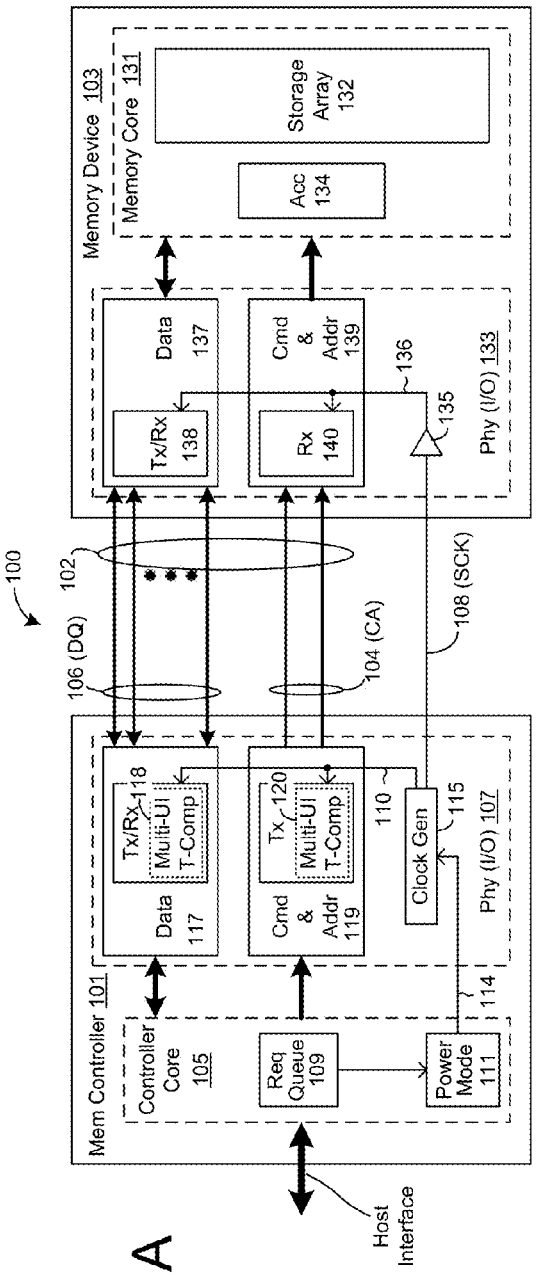
FIGS. 1A and 1B illustrate a generalized embodiment of a memory system having a clock-stopped low-power mode.

A strobeless synchronous memory system that permits mesochronous transmit and receive clocks to be stopped and restarted during idle periods between memory access transactions is disclosed in several embodiments. By this operation, power consumption during idle periods may be dramatically reduced relative to continuously-clocked designs. Further, because idle time often far exceeds active memory transaction time (active time) in the aggregate, particularly in power-sensitive mobile devices, the ability to reduce idle-time power consumption may yield substantially lower net power consumption.

Despite the substantial power-saving achieved through idle-time clock-stop (or clock pause), stopping transmit and receive clocks in a mesochronous signaling system brings a cascading sequence of challenges. To start, loss of phase-lock in the memory-side PLL presents an immediate performance problem as the PLL generally requires an intolerably long time to re-establish phase-lock and even then will generally re-lock in an uncalibrated state that requires phase calibration to be completed before reliable data-rate signaling may begin. And yet, removal of the memory-side PLL presents a daunting set of problems, beginning with extensive environmentally-induced phase drift within the memory-device, as well as loss of critical timing edges needed within the memory device for transmit and receive clocking. That is, an on-memory PLL conventionally performs the dual functions of compensating for temperature/voltage-induced phase drift and providing the timing edges needed for data-rate signaling by multiplying the frequency (or number of phases) of a relatively low-frequency system clock.

Despite these challenges, PLL/DLL circuitry is omitted from the memory-device clocking architecture in embodiments disclosed herein and the phase of the memory device timing domain is permitted to drift freely relative to the memory controller timing domain. Further, instead of encumbering the memory device with complex drift-compensation circuitry, the drifting phase offset between the memory-controller and memory-device timing domains is compensated by circuitry within the memory controller. As discussed below, in absence of an on-memory PLL, the memory-device phase drift may extend well beyond a unit interval (i.e., the time interval allotted to bit or symbol transmission, and the inverse of the data signaling rate or data rate; unit interval is also referred to herein as a bit time or symbol time), adding substantial complication to the timing compensation effort and clock start/stop coordination.

Omission of the memory-side PLL/DLL and concomitant loss of the second of the conventional on-memory PLL functions—generation of data-rate timing signals from a relatively low frequency system clock signal—is counteracted by a change in the system clocking arrangement itself. More specifically, instead of distributing a low frequency system clock that must then be frequency-multiplied (or phase-distributed) by on-memory PLL/DLL to provide data-rate timing edges, a data-rate clock signal itself is distributed as the system clock signal, thereby avoiding the need for a frequency-multiplying (or phase distributing) PLL/DLL circuit within the memory device. While this approach suffers the potentially higher power consumption involved in transmission and on-chip distribution of a higher-frequency clock, omission of the memory-side PLL/DLL obviates loss-of-lock considerations that plague conventional designs and, when combined with, for example and without limitation, drift compensation circuitry and clock-stop/start management circuitry as described herein, enables a clock-stopped low-power mode that may be rapidly entered and exited with negligible performance penalty. Ultimately, for applications that exhibit bursty memory access profiles (e.g., frequent idle periods interspersed among relatively brief periods of active memory access, as in cell phones and other mobile devices), the idle-time power savings tends to vastly outweigh any increased active-time power consumption; a savings multiplied by the number of memory devices in the system.

Figure 1B:
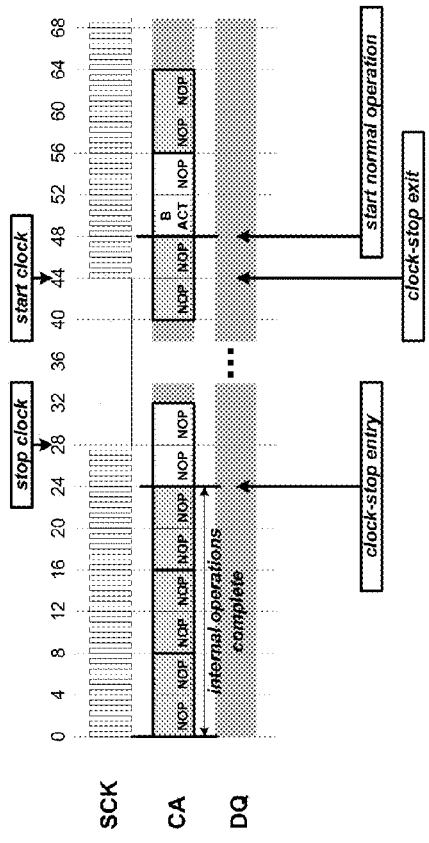

FIGS. 1A and 1B illustrate a generalized embodiment of a memory system 100 having a clock-stopped low-power mode. The memory system includes a memory controller 101 and a memory device 103 coupled to one another via signaling links 102 and system clock link 108. The memory controller itself includes a controller core 105 and an input/output (I/O) interface 107 (or PHY; physical interface) and the memory device similarly includes a memory core 131 and I/O interface 133. The I/O interfaces within the memory device and memory controller (i.e., the "memory-side" and "controller-side" I/O interfaces) include signaling circuitry (117, 119, 137, 139) to support bi-directional data transfer via one or more data links 106 and unidirectional command (or request or instruction) transfer via one or more command/address (CA) links 104. The controller-side I/O interface additionally includes a clock generator 115 to generate a system clock signal (system clock, SCK) that is forwarded to the memory device via clock link 108 and distributed to memory-side signaling circuits 137 and 139 via clock buffer 135 and internal clock path 136. The clock generator also generates a set of controller-side clocks that are distributed via internal clock path 110 to the controller-side signaling circuits 117 and 119.

Referring to the memory device 103, the memory core 131 includes a core storage array 132 arranged in one or more banks as well as access circuitry 134 for managing read and write access to the core storage array in response to memory access commands and addresses from the memory controller. In embodiments described below, the core storage array is assumed to be a dynamic random access memory (DRAM) that requires occasional refresh to avoid data loss, but virtually any storage technology may be used in alternative embodiments including, without limitation, static random access memory (SRAM) and various forms of non-volatile memory (e.g., flash memory, phase-change memory, etc.). Regardless of the storage technology used, command and address values (command/address or CA values) conveyed to the memory device via command links 104 (collectively, the "command path") are used to carry out data retrieval (memory read) and data storage (memory write, including non-volatile cell programming) operations within address-specified regions of the core storage array 132. Retrieved data is referred to herein as "read data" and is returned to the memory controller via the data links 106 (collectively, the "data path") and data to be stored or programmed ("write data"), conversely, is provided from the memory controller via the data path. In some cases, data-less commands, such as row-activation commands (instructing data transfer from storage cells within the core storage array to a latching sense-amplifier bank), refresh commands, erase commands (e.g., in the case of flash or other electrically-erasable non-volatile memory) and various configuration commands and/or operating-mode commands may be issued via the command path.

Reflecting on the embodiment of FIG. 1, a number of features of the memory-side clocking arrangement bear emphasis. First, the clock signal output from clock buffer 135 (i.e., the buffered clock signal) is a phase-delayed instance of the system clock signal; no frequency multiplication or multi-phase clock generation occurs within the memory device so that the frequency of the system clock signal itself establishes the data transmission and sampling rate within the memory-side I/O circuitry, and thus the signaling rate over signaling links 102. Thus, contrary to the conventional approach of distributing a lower frequency system clock and providing PLL/DLL circuitry to generate a data-rate clock signal by multiplying the clock frequency or generating additional clock phases, a data-rate clock signal itself (i.e., a clock signal that includes a respective timing edge for each symbol transmitted over the data link) is supplied to the memory device as the system clock signal. One consequence of this approach is that additional buffer amplifiers may be required in the chain of amplifiers that form the clock buffer 135 in order to achieve the desired gain (i.e., gain tends to drop with frequency, so that additional gain stages may be required at the higher clock frequency), thereby requiring additional power to distribute the data-rate clock signal throughout the memory device as opposed to distribution of a lower-frequency, multi-phase clock signal. As discussed above, despite the putative disadvantage of replacing a conventional clock distribution arrangement with one that may consume more power, the omission of a frequency-multiplying PLL/DLL makes it possible to rapidly transition between low-power-mode clock-stopped states and active-mode clocked states without incurring the usual time-delay penalty associated with re-acquiring phase lock. Consequently, clock-stopped low power modes may be entered even during relatively brief idle periods (between bursts of memory access activity) with negligible performance impact. Because aggregate idle time far exceeds aggregate active memory access time in many applications, substantial power reduction during idle time at the cost of a slight increase in active-time power may yield a substantial net reduction in power consumption. This result is illustrated graphically in FIGS. 1C and 1D, which contrast an exemplary power consumption profile in the pause-able-clock memory device of FIG. 1 with an exemplary power-consumption profile for a continuously-clocked PLL/DLL-based memory device under the same usage scenario. As shown, despite the somewhat higher active-time power in the pause-able clock memory, the substantially reduced idle-time power consumption yields a much lower net power consumption than in the continuously-clocked memory which suffers from the large idle power consumption in the on-memory locked-loop employed to anchor the memory-side timing domain to the phase of the system clock signal.

Another feature of the memory-side clocking arrangement is that the clock distribution circuitry is entirely open loop within the memory device; as discussed, there is no locked-loop circuitry to compensate for the time-varying (i.e., drifting) phase delay between the system clock signal and the buffered clock signal distributed to the memory-side I/O cells. Moreover, both the magnitude and environmental sensitivity of the system-clock-to-buffered-clock phase delay is increased by the additional stages of amplification provided within the clock buffer to account for the higher-frequency data-rate clock signal. That is, each amplifier stage within the clock buffer tends to exhibit an environmentally-dependent (e.g., temperature-dependent and/or voltage-dependent) propagation delay, so that adding an amplifier stage not only increases the net system-clock-to-buffered-clock timing skew, but increases the rate of change (i.e., the drift rate) of the timing skew. Because the buffered clock signal is applied within the memory-side I/O cells to time sampling and transmission operations, the drifting phase of the buffered clock signal manifests as a corresponding phase drift of read data signals transmitted by the memory device (and required change in phase in an incoming write data signal if such signal is to be accurately received). Finally, because the clock buffer delay may be on the order of several bit times and the net change in clock buffer delay between temperature and voltage corners (i.e., between minimum and maximum tolerable voltage and temperature) may easily exceed a symbol time (or bit time), the transmit or receive clock phase may drift across one or more bit-time boundaries into an adjacent bit time. This creates additional timing complexity as the data sampling time may be properly centered between bit boundaries, but off by one or more whole bit times. As a consequence, data otherwise correctly received may be improperly framed into parallel sets of data bits (referred to herein as packets) by receiver-side serialization circuitry.

It should be noted that while the clock distribution arrangement within the memory device is open loop, a system-wide closed-loop timing compensation structure is nonetheless effected, through the acquisition of phase, bit and packet alignment information during calibration operations carried out in view of transmissions between the memory controller and memory device. Thus, a multi-component (multi-IC) closed loop is effected in the forwarding of the system clock signal to the memory device, and the acquisition of information indicative of the memory-side phase of the forwarded clock signal (as applied to memory-side transmit and receive circuits) through controller-managed timing calibration operations.

Clock-Stop Lower Power Mode

Still referring to FIG. 1A, the controller core 105 includes a transaction queue 109 (or request queue) for queuing memory access requests received via a host interface (e.g., from a processor or other memory access requestor), and a power-mode controller 111 that monitors the state of the transaction queue. When the transaction queue becomes empty, the power-mode controller prepares to enter a low-power clock-stopped mode, depending on whether additional transaction requests are received (and queued) prior to the completion of a final (i.e., last dequeued) transaction. If no additional transaction requests are received before completion of the final transaction, the power-mode controller deasserts a clock-enable signal 114 (or asserts a pause signal) to suspend toggling of the system clock, and preferably (though not required) the controller-side signaling clocks. The resulting clock stoppage or clock pause yields an immediate power savings within the memory device and memory controller, as all transmit and receive clocks within the memory-side and controller-side I/O circuits stop toggling and thus avoid driving clocked circuitry through the power-consuming range between bi-stable logic states.

FIG. 1B illustrates the clock-stop effect. Assuming that a final memory transaction is commenced at clock cycle "0", the power-mode controller notes the empty transaction queue and begins counting clock cycles until a time at which internal operations of the memory device and controller-side I/O circuitry are complete. In this example, that time occurs 24 system-clock cycles after the transaction is commenced, and thus at system clock cycle 24. Shortly thereafter, in this case, long enough to ensure transmission of a final no-operation (NOP) command to the memory device, the system clock and controller I/O clocks are stopped cleanly and remain in a logic high or low state. At this point, the memory system is idle and in a clock-stopped low power state. A lower-frequency clock within the controller core continues to oscillate and thus permit reception of later-submitted transaction requests. In this example, a transaction is queued sometime shortly before system clock cycle 44. Accordingly, the power-mode controller, detecting the queued transaction, restarts the signaling clocks (the system clock and controller-side I/O clocks) at clock cycle 44, enabling a no-operation command to be sent to the memory device, and thereafter permitting the active command transfer shown, in this example, as an activation command directed to a selected bank (B) of the core storage array. Thus, the power-mode controller reduces power consumption in the idle period between memory access transactions by stopping the mesochronous signaling clocks upon detecting an empty transaction queue and waiting long enough for the final transaction to complete, and then restarts the signaling clocks upon detecting a newly queued transaction. In this example, the clock-stop interval extends over what would otherwise be sixteen cycles of the system clock signal, significantly lowering total system power consumption during that time. In actual application, stopping the signaling clocks for an idle period of even a few milliseconds avoids the power consumption otherwise required for millions of clock transitions. Accumulating that savings over multiple idle periods that, in aggregate, substantially exceed active memory transaction time, yields substantial power savings with negligible performance penalty.

Clocking and Drift Compensation

Figure 2A:
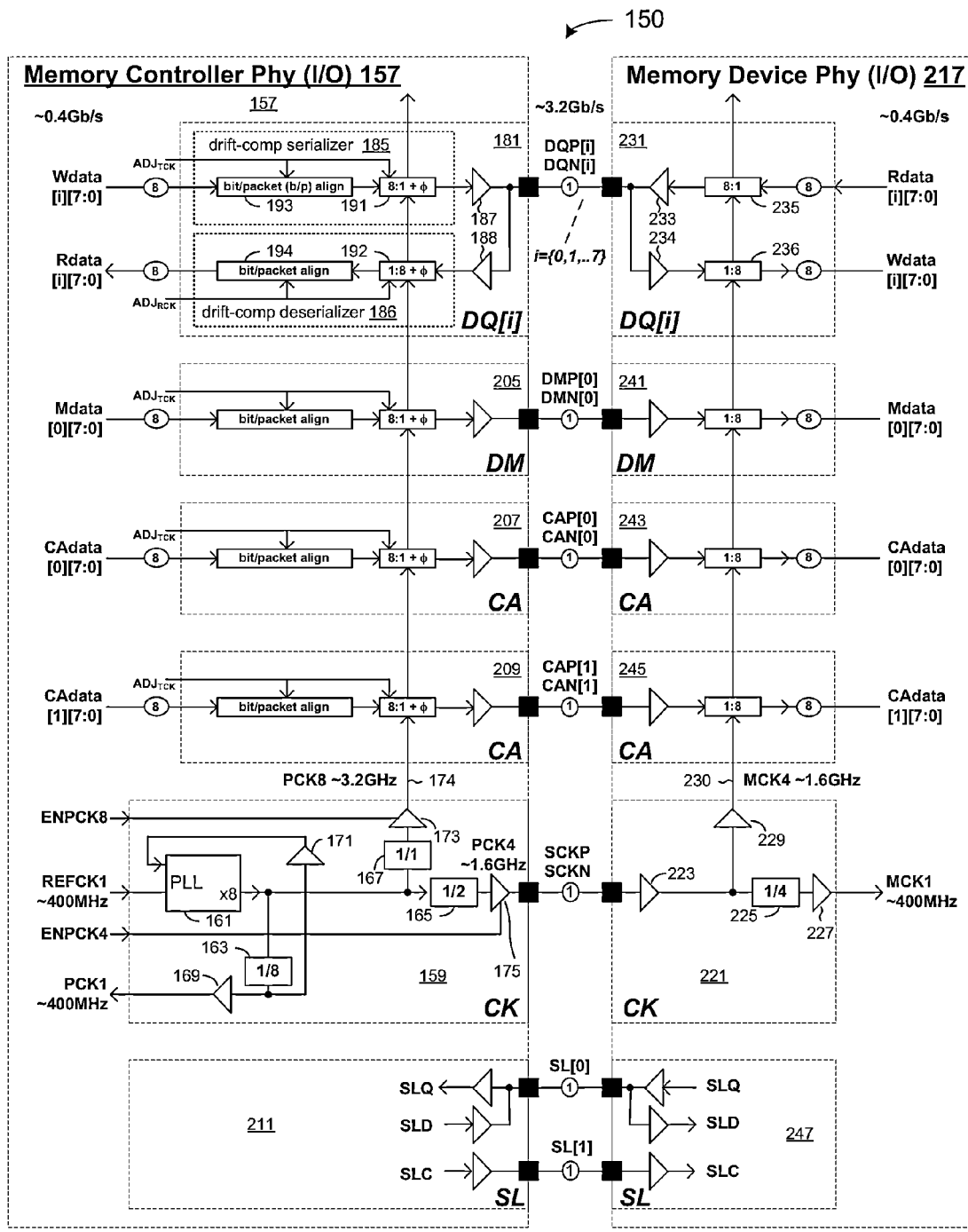
FIG. 2A illustrates an embodiment of memory-side and controller-side I/O circuitry and system clocking architecture in greater detail.

FIG. 2A illustrates an embodiment of memory-side and controller-side I/O circuitry and system clocking architecture in greater detail. In the interest of clarity and without limitation, specific numbers and types of signaling links, clock frequencies and frequency ratios, and serialization depths are depicted in FIG. 2A and related figures that follow. For example, differential signaling links are provided to implement each of eight data links (DQ[0-7]), two command/address links (CA[0,1]), a data mask link (DM) and the system clock link (SCK), while single-ended links are used to implement a pair of relatively low signaling-rate side-band links (SL[0,1]). Each of the differential links may alternatively be single-ended links (and vice-versa), and more or fewer links may be used to implement the command path and/or data path, and the data mask link (which may be considered part of the unidirectional command path) and associated circuitry may be omitted altogether. The dedicated side-band link may also be omitted in favor of out-of-band signaling over one of the data or command links.

With regard to clock frequencies and ratios, the system clocking architecture is driven by a 400 MHz reference clock signal (REFCK1) which is multiplied by eight within PLL circuit 161 to generate a phase-distributed set of 3.2 GHz controller-side I/O clock signals referred to alternately herein as PCK8 or the controller-side I/O clock (the "8" in "PCK8" indicating the 8× multiple of the reference clock frequency). In addition to driving the controller-side I/O clock, the 3.2 GHz PLL output is divided by two in divider 165 to generate the system clock, SCK (also referred to herein as PCK4), and divided by eight in divider 163 to produce a controller-side core clock signal (PCK1) that is phase aligned to the system clock and controller-side I/O clock, but having a reduced frequency for clocking the core and thus allowing lower-power logic operation. In all such cases, different clock frequencies and frequency ratios between core and I/O timing domains may be used. Also, while a same-frequency clocking is employed with respect to each signaling link, different I/O clocking frequencies may be alternatively be applied to achieve different signaling rates for different classes of signals (e.g., half-data-rate clocking of command/address signals). Further, in the implementation shown, the 1.6 GHz system clock frequency is half the 3.2 Gb/s (Gibabit per second) signaling rate on the data and command links. Though occasionally referred to herein as a "half bit-rate" or "half symbol-rate" clock signal, the system clock is nonetheless considered to be a "data-rate" clock signal as the rising and falling edges within each cycle (or two 180°-offset rising edges of complementary signals in a differential system clock implementation) may be used to transmit or sample data in respective (1/3.2 GHz) data intervals. Though the half-bit-rate (half-symbol-rate) system clock is carried forward in many of the exemplary embodiments that follow, a full-bit-rate clock (3.2 GHz in this example) may alternatively be forwarded to the memory device as the system clock.

Continuing, eight-to-one-serialization is applied to serialize core-supplied 8-bit-wide packets of information for bit-serial transmission over each signaling link and corresponding one-to-eight deserialization applied to restore serial bit sequences to 8-bit-wide data for delivery to the counterpart core. For example, eight 8-bit packets of write data (Wdata[0][0-7]–Wdata[7][0-7]) are serialized during each period of the 400 MHz controller core clock (PCK1) and transmitted in respective 8-bit sequences at a 3.2 Gb/s data rate over each of the eight data links, DQ[0-7] thus providing an aggregate data bandwidth of 3.2 GB/s (3.2 gigabytes per second). At the memory device, each of the eight-bit-long write data packets is sampled (bit by bit) and converted to a parallel packet during the cycle time of a 400 MHz memory core clock (MCK1), thus enabling the memory core, like the controller core, to operate on byte-sized packets of data in a lower frequency domain. Converse serialization within the memory device and deserialization within the memory controller are carried out in the read data transmission from the memory device to the memory controller, thus enabling 3.2 GB/s data transfer from the memory core to the controller core over a relatively narrow, 8-link data path, while enabling both device cores to operate in a relatively low-frequency clock domain (400 MHz in this example). Similar serializing and deserializing operations are carried out unidirectionally for each of the command/address links and the data mask link. In all such cases, different serialization depths (i.e., more or fewer bits per packet) may apply for any or all of the links (including depth=1; effectively no serialization or deserialization at all), generally with corresponding changes in core-to-I/O clocking ratios.

Mesochronous Clocking with Open-Loop Memory-Side Clock Distribution

Because all system timing edges are derived from a common clock signal (i.e., the output of PLL, itself derived from reference clock signal, REFCK1), the various clocks within the system are mesochronous. That is, the various clocks have the same frequency after accounting for any multiplication/division, but potentially different phases due to different propagation times required for the clocks to reach various points of application within the memory controller and memory device. In general, such propagation times via on-die or inter-chip conductors remain relatively constant over operating system temperature and voltage ranges. Propagation times through active components, however, such as buffer amplifiers provided to drive clock lines within the memory controller and memory device tend to be significantly influenced by environmental changes (temperature and voltage, at least) and thus yield environmentally-induced drift between the otherwise relatively steady phase relationship between the various distributed clocks.

Referring to the memory-side clocking architecture in particular, the system clock is received via buffer 223 and driven onto a global clock line 230 by amplifier 229. Because of the relatively large gain needed to drive the global clock line, amplifier 229 tends to include multiple stages, each of which exhibits a substantial environmentally-sensitive propagation delay. The relatively high frequency of the system clock (i.e., the clock has the same upper spectral component as a worst-case data signal, as opposed to lower system clock frequency of on-memory-PLL designs) generally increases this environmental sensitivity as additional amplifier stages may be necessary to achieve the desired signal gain (i.e., gain generally rolls off with increased frequency). Consequently, the resulting buffered clock signal, referred to herein as the memory-side I/O clock, or MCK4, not only exhibits substantial phase delay relative to the incoming system clock signal, but also exhibits environmental sensitivity that may result in drift exceeding one or more unit-intervals (bit times) over the temperature and voltage operating range of the memory device. Further, in contrast to conventional designs that compensate for the drifting amplifier delay by including the clock buffer in the feedback loop of an on-memory PLL/DLL, the open-loop distribution of the amplified system clock signal (i.e., the buffered clock signal, MCK4) means that any phase drift within the clock amplifier translates directly into phase drift in the memory-side transmit and receive clocks and thus manifests as a corresponding phase drift of read data signals transmitted by the memory device (and required change in phase in an incoming write data signal if such signal is to be accurately received). Finally, because the clock buffer delay (i.e., delay through elements 223, 229) may be on the order of several bit times and the net change in clock buffer delay between temperature and voltage corners (i.e., between minimum and maximum tolerable voltage and temperature) may easily exceed a bit time, the transmit or receive clock phase may drift across one or more bit-time boundaries into an adjacent bit time. This creates additional timing complexity as the data sampling time may be properly centered between bit boundaries (edges of the data eye), but off by an integer number of bit times. As a consequence, data otherwise correctly received may be improperly framed into parallel packets of data bits (e.g., 8-bit packets, 16-bit packets, etc.) by memory-side or controller-side deserialization circuitry.

Figure 2B:
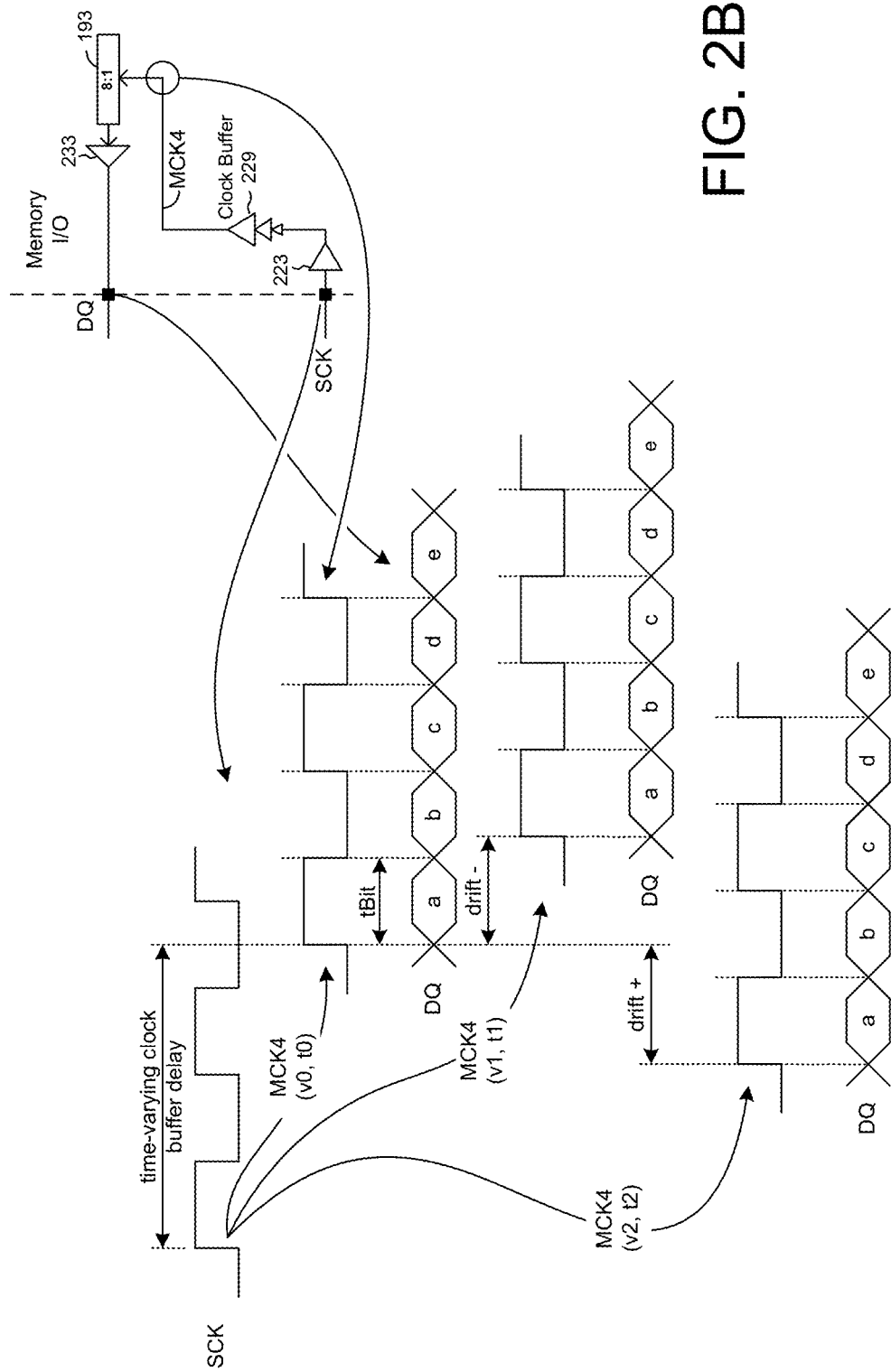
FIG. 2B illustrates the memory-side timing arrangement described in reference to FIG. 2A, showing the system clock signal and data signal as they appear at the pins (or other interconnection structures) of the memory device, as well as the buffered clock signal as applied to a memory-side transmitter.

FIG. 2B illustrates the memory-side timing arrangement described above, showing the system clock signal and data signal as they appear at the pins (or other interconnection structures) of the memory device of FIG. 2A, as well as the buffered, memory I/O clock, MCK4, as applied to a memory-side serializer 235 (or single-bit transmitter). As shown, the memory I/O clock exhibits a time-varying delay relative to the system clock such that the phase of the memory I/O clock and therefore the phase of the read data signal driven onto one of the data links (DQ) drifts freely with respect to the system clock signal. More specifically, a first time delay (or phase offset) between system clock and memory I/O clock occurs at a first voltage and temperature point (v0, t0) and, as temperature and voltage drift over time to new points (v1, t1) and (v2, t2), the system-clock to memory-I/O-clock phase offset drifts back (drift−) and forth (drift+) by as much as or more than a bit time. Also, while the phase drift on a single data link and instance of the memory I/O clock is shown, similar phase drifts, independent in magnitude and direction from that shown, may inhere in other data links. For example, the phase drift with respect to the system clock signal may vary from data link to data link due, for example, to environmentally-sensitive local clock buffers associated with each signaling link and the potentially different propagation delays they may introduce.

Drift Compensation within Controller-Side Serializer/Deserializer Circuitry

In the embodiment of FIG. 2A, timing compensation circuitry is provided in conjunction with the controller-side serializer/deserializer circuits to compensate for the freely drifting transmit and receive clock phases within the memory-side I/O circuitry. More specifically, the timing compensation circuitry aligns the controller-side I/O timing domain with the drifting memory-side I/O timing domain on a link by link basis, compensating not only for intra-bit sampling phase error, but also bit-time misalignment that results when the memory-side phase drift crosses a bit boundary, and link-to-link packet misalignment caused by different bit-time misalignments in the various links. In effect, the timing compensation circuitry establishes a drift-tracking transmit and receive clock phase within each controller-side I/O circuit that compensates for phase drift of the receive and transmit clocks in the counterpart memory-side I/O circuit, including drift across bit boundaries that might otherwise result in data serialization/deserialization errors (i.e., framing bits into packets at different bit boundaries on opposite sides of the signaling link) and domain crossing errors as packets are transferred between the clock domains of the core and I/O circuitry within either the memory controller or the memory device.

In the embodiment of FIG. 2A, each drift-compensating deserializer includes a phase-selecting deserializer 192 to compensate for intra-bit phase drift, and a packet/bit alignment circuit 194 here to compensate for drift across bit boundaries (bit alignment) and to align packets received via different links for synchronized transfer to the controller-core (packet alignment). The drift compensating serializers contain similar circuitry to adjust the timing of information flowing to the memory device, providing intra-bit adjustment (phase-selecting serializer 191), and bit/packet alignment (193) to pre-skew the outgoing data stream for properly timed sampling, bit framing and link-to-link packet alignment within the memory device.

Figure 3A:
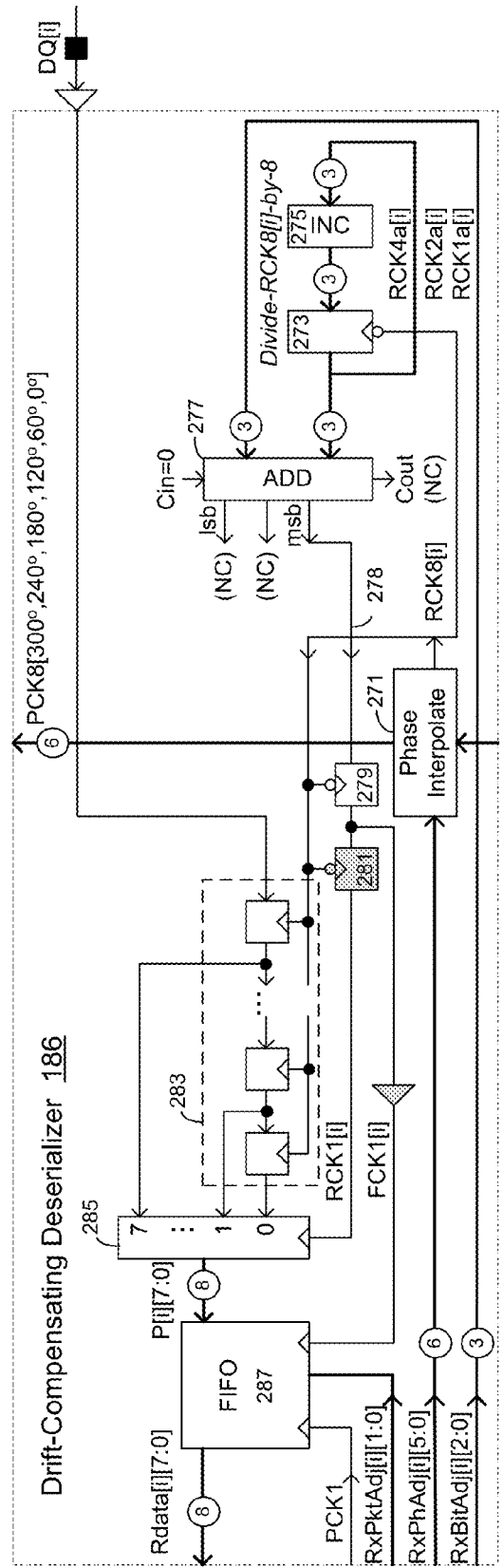
FIGS. 3A and 3B illustrate an embodiment and timing diagram of a drift-compensating deserializer that may be used to implement any of the drift-compensating deserializers in FIG. 2A.
Figure 3B:
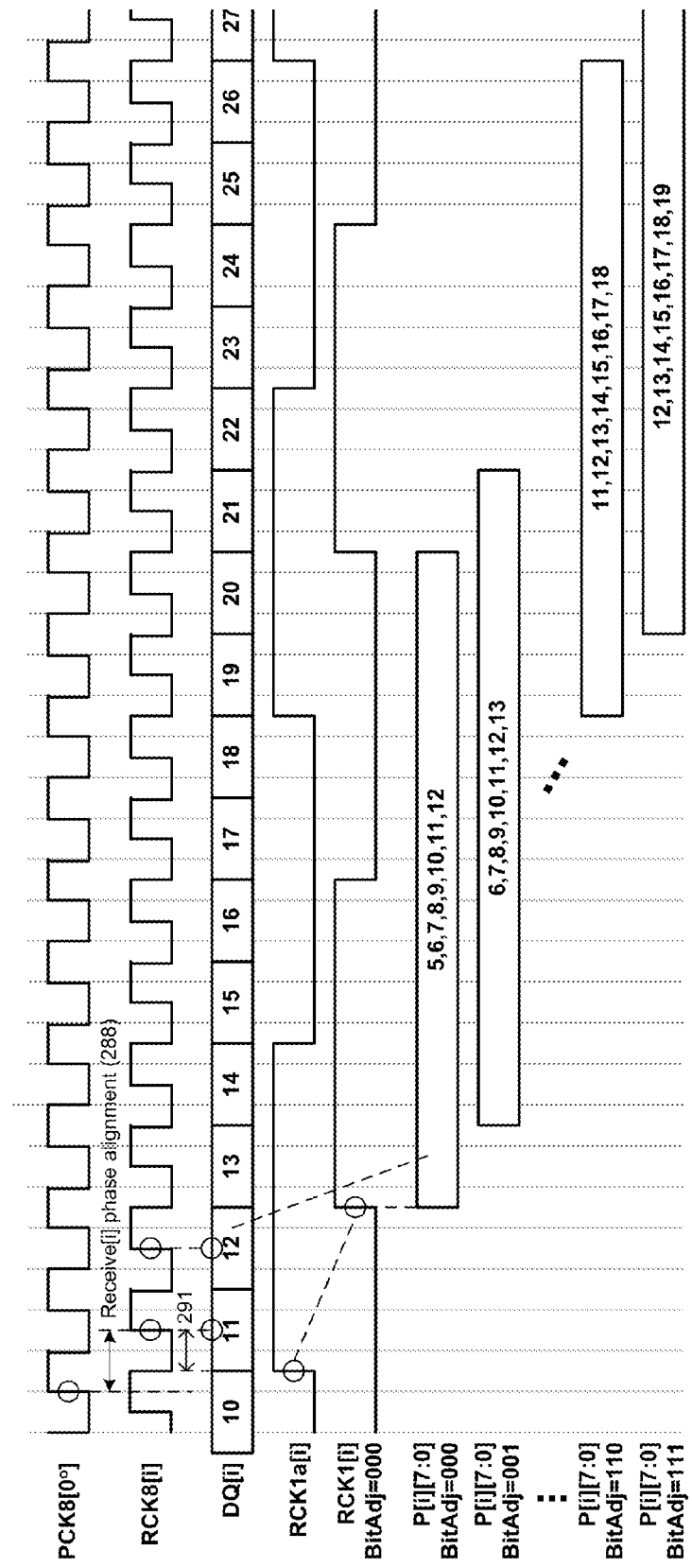

FIGS. 3A and 3B illustrate an embodiment and timing diagram of a drift-compensating deserializer 186 that may be used to implement any of the drift-compensating deserializers shown in FIG. 2A. Accordingly, each input signal and output signal that is dedicated to a given one of the eight deserializers referenced in FIG. 2A is depicted by an index "[i]" in FIGS. 3A, 3B to indicate that separate instances of the same signals are input to or output from the other seven deserializers (i.e., i=0, 1, 2, ..., 7). Thus, deserializer 186 is coupled to data link DQ[i] to receive a serial data signal and outputs an 8-bit wide data packet Rdata[i][7:0]. The deserializer additionally receives a 6-bit phase-adjust signal PhAdj[i] [5:0] and a 3-bit bit-adjust signal BitAdj[i][2:0]. The deserializer also receives, along with all other deserializers, the controller core clock, PCK1, and the multi-phase controller I/O clock, PCK8. In the embodiment shown, the controller I/O clock is generated by a three-stage ring oscillator, and thus outputs a set of three differential clock signals that are phase distributed within the PCK8 cycle time. In other words, in the embodiment of FIG. 3A, the controller I/O clock includes clock phases of 0°, 120° and 240° and their complements of 180°, 300° and 60°, thus providing a set of six clock phases from which a phase-shifted receive clock, RCK8[i] having any phase offset (i.e., clock phase or phase angle) within a PCK8 cycle may be synthesized. In one implementation, for example, phase interpolator 271 responds to the most significant three bits (MSBs) of the six-bit phase adjust value by selecting one of six possible pairs of phase-adjacent clock phases (i.e., 0°/60°, 60°/120°, 120°/180°, 180°/240°, 240°/300° or 300°/0°) and by interpolating (or mixing) between the selected clock-phase pair in response to the least significant three bits of the phase adjust value, thus providing a 60°/8 or 7.5° phase step (or resolution) with each increment or decrement of the phase adjust value. More or fewer clock phases may be provided in alternative embodiments (with corresponding change in number of phase selection bits as necessary to meet the number of selectable clock-phase pairs), and/or finer or coarser phase interpolation may be provided. Also, phase interpolator 271 may itself be implemented by any type of phase shift circuitry including, for example and without limitation, amplifiers having inputs coupled respectively to receive the MSB-selected phase vectors, outputs tied in common and respective drive strengths controlled by complementary instances of the least-significant three-bits of phase adjust value. More generally, any type of circuitry capable of providing a selectable phase offset relative to the controller I/O clock, PCK8, may be used in alternative embodiments. Finally, regardless of the interpolator circuit topology, interpolator (or phase-shifting) circuitry included within the topology of FIG. 1A enables the interpolated clock RCK8[i] to be glitch-free (i.e., no shortened (runt) pulses or invalid logic levels) when the source controller I/O clock, PCK8, is stopped. As an example, in some embodiments, glitch-free starting and stopping of the interpolated clock is enabled by distribution of an extra pair of one-cycle-delayed copies of the PCK8[0°] and PK8[180°] waveforms to the interpolator circuitry. Similar arrangements may be used to ensure glitch-free starting and stopping of the controller-side transmit clock phases discussed in reference to FIG. 3F below.

As discussed below, the receive clock phase may initially be calibrated by stepping the phase adjust value through a range of values (or through a binary or other search pattern) to distinguish resulting clock phases that yield error-free data reception from those that yield bit errors (i.e., passing clock phases from failing clock phase). In one embodiment, for example, clock phases that lie on the pass/fail boundaries (i.e., adjacent clock phases that respectively yield error-free reception and bit error) on opening and closing sides of a data eye (or on closing side of one data eye and the opening side of a subsequent data eye) are identified, and the phase centered between those boundaries selected as the calibrated receive clock, RCK8[i]. Thereafter, the receive clock phase may be periodically (or occasionally) adjusted to account for memory-side (or system-wide) phase drift by re-testing the boundary phases to confirm that they yield the same passing (or failing) results, and incrementing or decrementing the phase-adjust value for the final receive clock phase to counteract any drift indicated by a change in the pass/fail boundary.

Flop stages (or latches) 283 form an 8-bit shift register which is serially loaded in response to transitions of the receive clock signal, RCK8[i]. A framing clock signal, RCK1[i] cycles once for every eight cycles of the receive clock signal, and is used to transfer the contents of the shift register in parallel into a parallel-output register 285, thereby effecting a 1:8 serial-to-parallel conversion. Bit alignment circuitry, including modulo-8 counter (formed by 3-bit-wide register 273 and increment logic 275) to count negative-going edges of the receive clock (RCK8[i]) and an adder circuit 277 which adds the three-bit bit-adjustment value (RxBitAdj[2: 0]) to the three-bit modulo-8 counter output, provides selectable control over the alignment between the receive clock signal and the framing clock signal. More specifically, if the bit-adjustment value is zero (i.e., RxBitAdj [i] [2:0]=000b, 'b' designating binary), then each time the counter value transitions from three to four (011b to 100b), the MSB of the adder output (278) goes high and triggers, two receive-clock cycles later (owing to flop stages 279 and 281), a corresponding high-going edge of the framing clock (RCK1[i]) signal to load the contents of the parallel-output register. Each increment of the bit-adjust signal causes the adder MSB (and therefore RCK1[i]) to go high one bit-time earlier, thus enabling alignment of RCK1[i] (or the high-going transition thereof) with the falling edge of any one of every eight RCK8 [i] cycles and thus allowing serial-to-parallel framing to be shifted to any of the eight possible packet-framing boundaries within the incoming serial bit stream. In the embodiment shown, each rising edge of RCK1[i] is aligned with a falling edge of the RCK8[i] signal, so that transfer to the parallel register occurs a half-RCK8[i] cycle after the shift register has been loaded with a new 8-bit packet (and a half RCK8[i] cycle before the first bit of the subsequent packet is loaded into the shift register).

FIG. 3B illustrates the timing arrangement described above, starting with the multi-phase controller I/O clock, PCK8, (of which only the O'clock phase is shown) and an instance of the phase-shifted receive clock, RCK8[i], having an arbitrary phase offset 288 with respect to PCK 8[0°] and an exemplary phase offset 291 to effect quadrature (i.e., bit-time-centered) alignment with the incoming data waveform on line DQ[i]. The most-significant-bit output of the modulo-8 counter (i.e., RCK1a[i]) cycles once every eight cycles of the receive clock signal and transitions in alignment with a falling receive-clock edge. As discussed, the framing clock RCK1[i] transitions N+2 receive-clock cycles after the counter output (due to serially-coupled flop stages 279, 281) where N ranges from 0 to 7, according to the value of the bit adjustment value, RxBitAdj[i][2:0]. Thus, if the bit adjustment value is zero (000b), the framing clock signal transitions two cycles after the raw counter output and, in the figure shown, a half-cycle after data bit 12 (arbitrarily numbered) is loaded into the back end of the shift register. Accordingly, with RxBitAdj[i][2:0]=000b, eight bits, numbered 5-12, are transferred in parallel from the shift register flops 283 to the parallel-output register 285, framing those bits as a packet on the starting and ending bit boundaries between bits 4 and 5, and 12 and 13, respectively. Continuing the example, if RxBitAdj=1 (001b), bits 6-13 are framed into a packet, if RxBitAdj=2 (010b), bits 7-14 are framed into a packet, and so forth to BitAdj=7 (111b), in which case bits 12-19 are framed into a packet.

Still referring to FIGS. 3A and 3B, it can be seen that the core clock and framing clock have an arbitrary phase relative to one another due to the intra-bit phase offset between the receive clock and controller I/O clock and the bit-wise offset achieved by adding some number (zero to seven) of whole receive clock cycles to the base framing clock phase (RCK1a [i]). Consequently, data transfer from the drift-compensating deserializer to the controller core involves a clock domain crossing from the framing clock domain to controller core clock domain. This transfer is complicated further by the potentially different framing clock domains that may exist within each of the eight drift-compensating deserializers. Moreover, if the memory controller (or multiple same-die or separate-die memory controllers sharing the same clock generation circuitry) is communicating with two or more memory devices, the data-timing variability may become even larger than the worst-case for a single memory device. Thus, in addition to the phase-adjust circuit for intra-bit sampling phase adjustment and the bit-alignment circuitry to control the packet-framing boundary, a packet-alignment circuit is provided to align the collective set of packets received via respective data links for simultaneous transfer into the controller core domain. That is, even though eight packets are transferred in alignment from the memory core to the memory-side I/O circuitry, phase differences between the various data links may result in time-staggered arrival of the packets at the memory controller and, consequently, framing of the packets at different bit-offsets relative to one another (and relative to the controller core clock, MCK1). As a result, one or more of the originally-aligned packets may be available relative to a latching edge of the core clock (PCK1) before others meaning that, absent a mechanism for delaying transfer of the sooner-arriving packets for alignment with the later-arriving (more-latent) packets, the constituent packets of the original multi-packet memory word retrieved from the memory core (e.g., 8-byte value in this example) may be temporally dispersed among two or more memory words upon transfer to the controller core (i.e., the memory-side timing relationship between the constituent packets may be lost). Accordingly, in one embodiment, circuitry for ensuring that the memory-core packet alignment is maintained (or restored) in the packet transfer from the controller I/O circuitry to the controller core. In the embodiment of FIG. 3A, for example, such packet alignment circuitry is implemented by a packet-wide first-in-first-out (FIFO) buffer 287 that is loaded by the framing clock (or a one-bit-time-advanced version thereof referred to as the FIFO clock, FCK1[i]), unloaded by the controller core clock, PCK1, and deep enough to hold a number of packets equal to the integer number of core clock cycles spanned by the interval between the most latent and least-latent packet-framing times under worst-case timing conditions.

Figure 3C:
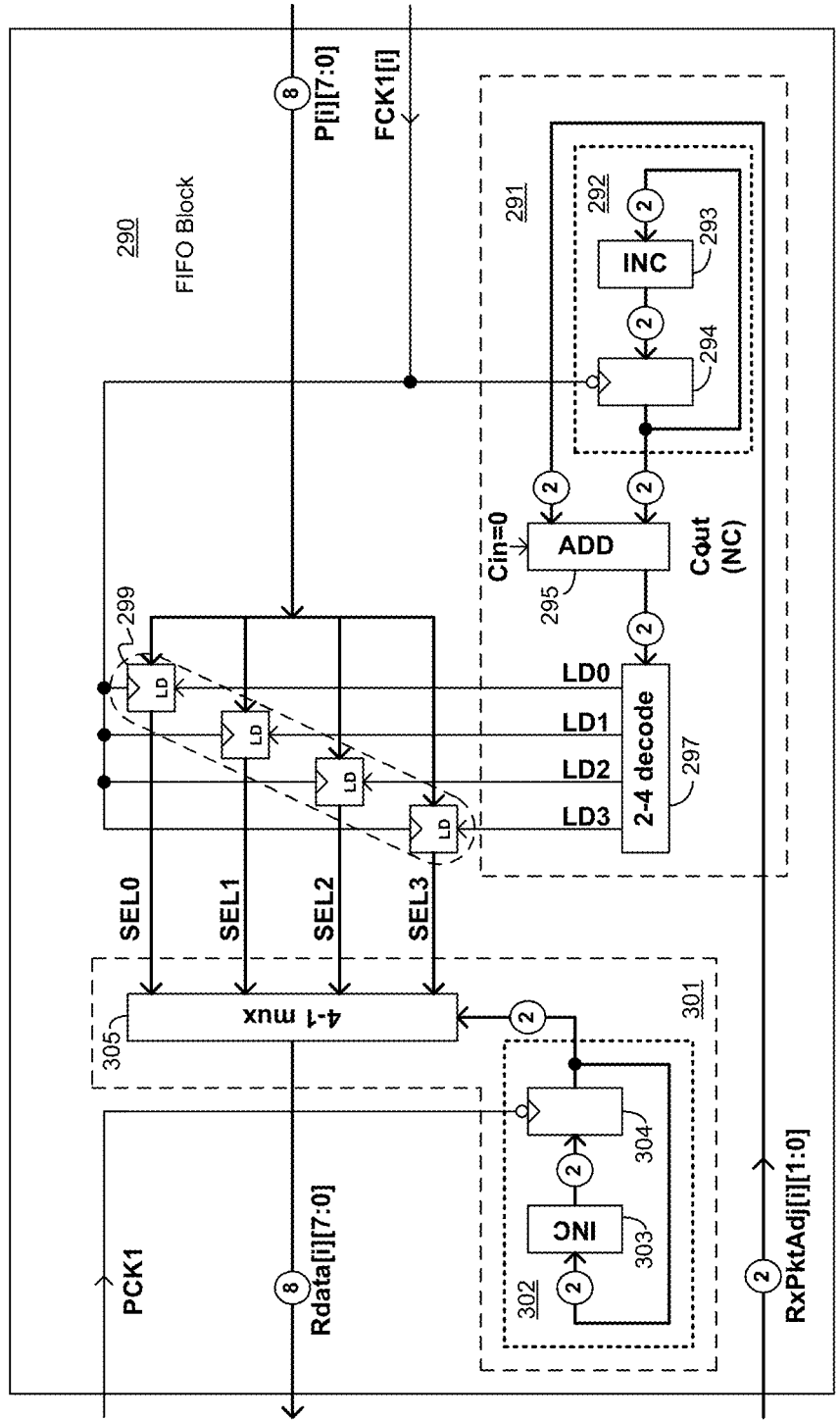
Figure 3D:
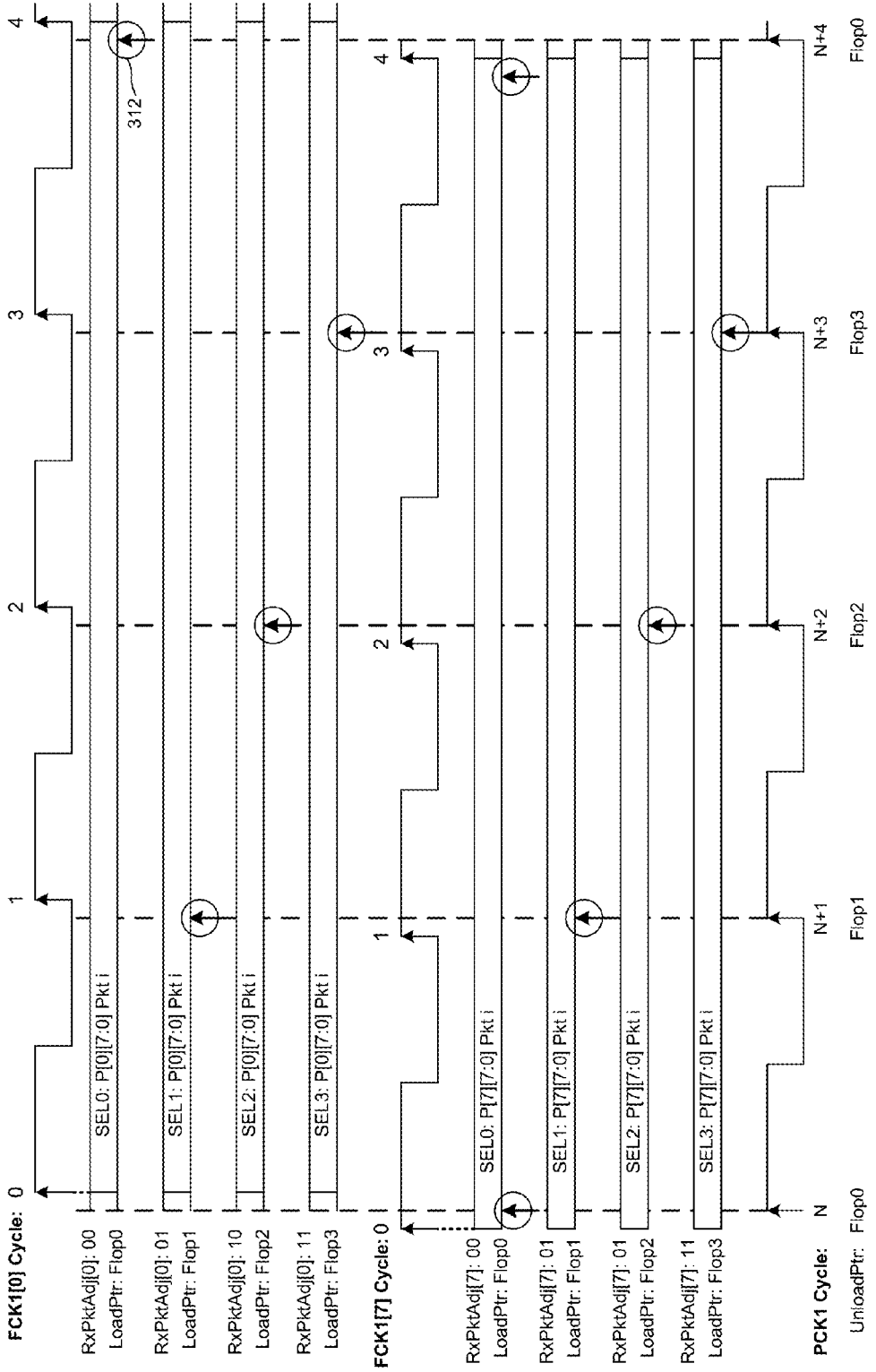

FIGS. 3C-3D illustrate an embodiment and corresponding timing diagram of a FIFO-based packet-alignment circuit 290 that may be used to implement the packet-alignment circuit 287 of FIG. 3A. The packet-alignment circuit 290 includes a four-packet-deep buffer 299, a load circuit 291 and an unload circuit 301. The load circuit 291 includes a modulo-4 load counter 292 (i.e., count sequence=0,1,2,3,0,1, . . . , implemented by increment logic 293 and 2-bit register 294) to output a 2-bit load count, a 2-bit adder 295 that adds the packet adjust value RxPktAdj[i][1:0] to the load count, thereby enabling the load count to be advanced by 0-3 framing clock cycles (i.e., enabling the load count to be adjusted, in effect, to any of the four possible initial count values), and a 2:4 decoder 297 that decodes the adder-adjusted load count to select one of the four packet registers within 4-deep buffer 299 to be loaded with an incoming packet, P[i][7:0] in response to a rising FCK1 edge. In effect, the load circuit 291 implements a rotating "load pointer" into the 4-deep buffer, selecting one packet register after another in sequence (wrapping from the last packet register to the first as the adder-adjusted count rolls over from 3 (11b) to 0 (00b)) and the adder 295 enables pointer to be advanced to any starting packet register position according to the packet-adjust value, RxPktAdj[i][1:0].

Still referring to FIG. 3C, the unload circuit 301 includes a modulo-4 unload counter 302 (formed by increment logic 303 and 2-bit register 304) to generate a 2-bit count sequence or "unload count" in response to rising edges of the core clock signal (PCK1), and a 4:1 multiplexer 305 to select, one after another, the four packet-register outputs of the 4-deep buffer (SEL0-SEL3) in response to the unload count. Thus, the load circuit 291 loads the packet registers in round-robin fashion (i.e., rotating sequentially through the four packet registers of buffer 299) in response to FCK1, and the unload circuit 301 follows the rotation of the load circuit, unloading the packet registers in round-robin fashion in response to PCK1. The incoming packet adjust value enables the rotating pointer implemented by the load circuit to lead the rotating pointer implemented by the unload circuit by a desired number of PCK1 clock cycles. As discussed below, calibration operations may be carried out to determine the minimum latency between FIFO loading and unloading for each link, and then to align all the links by setting the load-to-unload latency for each link to match the worst-case minimum.

FIG. 3D illustrates the effect of adjusting the packet-adjust value for exemplary timing data timing patterns on links DQ[0] and DQ[0]. More specifically, using the controller core clock (PCK1) as a reference, the FIFO-load clock for link DQ[0] is assumed to lag PCK1 by a fraction of a PCK1 cycle, and the FIFO-load clock for link DQ[0] is assumed to lead PCK1 by roughly the same fraction. Additionally, for purposes of explanation, it is assumed that packet adjust values 00, 01, 10 and 11 result in initial selection of packet register outputs SEL0, SEL1, SEL2 and SEL3, respectively. In actual operation, absent circuitry to initialize the load counter 292 to a predetermined state, the packet adjust values may yield an initial packet register output selection that is offset by any of the four possible initial load counter states (00, 01, 10, 11).

Assuming that a data read operation (or calibration data transmission) yields an incoming packet sequence of that includes packet 'i' ("Pkt i") on each data link, then the lagging phase of FCK1[0] will result in the subject packet being received shortly after rising edge N of PCK1 (marking the start of the Nth PCK1 cycle, for example, since the controller core issued a request or other transmission that yielded the return of packet T) and loaded into one of the four packet registers (flop0, flop1, flop2 or flop3) according to the packet adjust value, RxPktAdj[0][1:0]. That is, if the packet adjust value is 00, packet 'i' is loaded into flop0 (having output SEL0) and remains there for four FCK1 cycles. Similarly, if the packet adjust value is 01, 10 or 11, packet 'i' is loaded into flop1 (SEL1), flop2 (SEL2) or flop3 (SEL3) as shown.

Assuming for the sake of example, that the unload pointer is pointed at flop0 (i.e., packet register output SEL0 is selected by multiplexer 305), at sampling (rising) edge N of PCK1 (and then at flop1, flop2, flop3 at PCK1 edges N+1, N+2, N+3, respectively), and assuming further that packet 'i' is loaded into flop0 it can be seen that, because the packet is loaded just after PCK1 sampling-edge N (and thus just after flop0 is unloaded into the core domain), nearly four full PCK1 cycles must transpire between loading packet 'i' into flop0 at rising edge 0 of FCK1[0]) and unloading packet 'i' from flop0 at rising edge N+4 of PCK1 (the unload being shown sampling indicator 312). From the perspective of the core logic, the round-trip latency from request/command output (from the core domain) to data return (back into the core domain) required three fewer core clock cycles when the packet adjust value is set to '01' than when set to '00' (i.e., (N+4)−(N+1) =3). In fact, the minimum round trip latency for link [0], referred to herein as the minimum link latency, is N+1 clock cycles for packet-adjust=01, and becomes progressively larger—N+2, N+3, N+4—as the packet-adjust value is incremented and advances the load pointer further ahead of the unload pointer to packet registers flop2, flop3, flop0 respectively.

Still referring to FIG. 3D, because the loading edge of FCK1[7] occurs just prior to the flop0 sampling edge of PCK1, the minimum link latency for link DQ[0] is 'N' PCK1 cycles and occurs when the link packet-adjust value (RxPktAdj[7][1:0]) is '00'. As the packet adjust value is incremented to 01, 10, 11, the link latency increases by a corresponding number of PCK1 cycles to N+1, N+2, N+3.

As the exemplary timing of diagram of FIG. 3D demonstrates, different links may exhibit different minimum link latencies. And yet, because the $i^{th}$ packets on the respective data links are constituents of the same multi-packet word retrieved from the memory device core (or issued from the controller core in a calibration operation), it is important to maintain the temporal relationship between the $i^{th}$ packets by transferring them all into the controller core domain in response to the same sampling edge of the core clock signal. As can be appreciated from FIG. 3D, this "packet-alignment" operation is in effect one of equalizing the link latency for all the signaling links, despite what their individual minimum latencies may be.

FIG. 3E provides an example of establishing a uniform link latency, referred to herein as the minimum system latency, across all data links. This operation may generally be extended to all signaling links, particularly if some signaling links used primarily to convey information unidirectionally (e.g., command, data mask) are occasionally used to return information to the memory controller.

Initially, the link latency (read data latency in this example) for each data link is determined for each setting of the packet-adjust value. This may be achieved, for example, by arranging to receive, on each link, a packet having a predetermined bit pattern (preceded and succeeded by differently-patterned packets), and then counting the number of PCK1 cycles that transpire before the packet is received. As an example, in one embodiment (described in further detail below) the memory device is placed in a data-loop-back mode, looping back data at the memory-side core interface such that a data packet transmitted by one link (e.g., an odd-numbered link) is received on another (e.g., a counterpart even-numbered link) and thus enabling round-trip latency determination for each different packet adjust value. In another embodiment, a read command requesting return of a deterministic (e.g., previously written or otherwise predictable) read data pattern is issued to the memory device, thus enabling round-trip latency determination (from output of the read command from the controller core to the acquisition of expected data within the controller core) for each link and for each packet adjust value. However accomplished, a set of link-latency data is obtained, including relative link latency (read data latency in this example) values (e.g., numbers of core clock cycles) for each packet adjustment value for each link. In the example shown at 323 of FIG. 3E, the link-latency data reflects the exemplary link latencies shown in FIG. 3D for links DQ[0] and DQ[0], together with similar data for link DQ[0]. As shown, the link latencies for DQ[0] match those of link DQ[0] but occur at different packet adjust values (rotated by two PCK1 cycles), demonstrating that, in at least one embodiment, the initial state of the load counter and unload counter is entirely arbitrary.

Continuing with FIG. 3E, a processor within the controller core (or alternatively, the host processor or other upstream controller) may determine the minimum link latency for each link at 325 (in this example, N+1 PCK1 cycles for the DQ[0], DQ[0] links, and N PCK1 cycles for link [7]), and then determine the minimum system latency based on the worst-case (i.e., maximum) link latency at 327. In the embodiment shown, for example, the minimum system latency is determined to be the maximum of the individual link latencies which, in this case, is N+1 PCK1 cycles. Thereafter, at 329, the packet adjust value for each link (RxPktAdj[i][1:0]) is programmed (e.g., within a packet alignment counter as described below) with the value that corresponds to the minimum system latency. Thus, in the particular example shown, the packet adjust values for links DQ[0], DQ[0] and DQ[0] are programmed to '01', '11' and '01', respectively, to align those packet-to-core transfers with the minimum system latency. Note in particular that despite the opportunity for an even lower latency setting for DQ[0] (RxPktAdj[7]='00'), that the operation of that link is, in effect, delayed by a PCK1 cycle to achieve alignment with the slower (more latent) links.

Having described exemplary phase-alignment, bit-alignment and packet-alignment circuits that may be used within the drift-compensating deserializer and serializer circuits, it should be noted that numerous alternative circuit implementations may be used to achieve the results described without departing from the principles set forth herein. For example, various types of delay circuits and other types of phase shifting circuits may be used to generate a desired receive and transmit clock phases. Further, with respect to bit alignment, instead of the adder circuitry (277 and 345) shown in FIGS. 3A and 3F, additional shift register stages may be provided, with multiplexer selection of the outputs at different points within the shift pipeline (thus effecting a selectable $n*t_{bit}$ delay, where 'n' is the selectable number of additional shift register stages traversed, and $t_{bit}$ is a bit-time interval). Similarly, with respect to packet alignment, an additional parallel register may be provided along with a multiplexer to enable selection of different word alignments. More generally, instead of a FIFO buffer arrangement, a cycle-skip circuit that selects one of multiple PCK1 edges (e.g., N, N+1, N+2, N+3, N+4 as shown in FIG. 3D) to transfer data from a single packet register into the core domain.

Figure 3F:
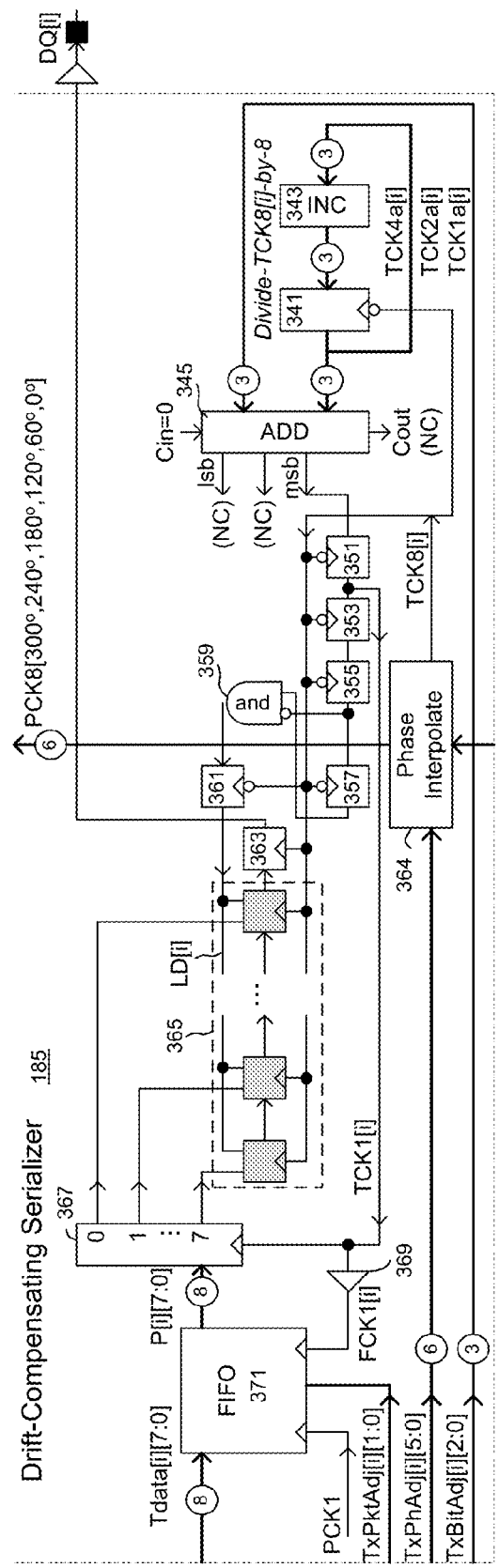
FIGS. 3F and 3G illustrate an embodiment and timing diagram of a drift-compensating serializer that may be used to implement any of the drift-compensating serializers shown in FIG. 2A.
Figure 3G:
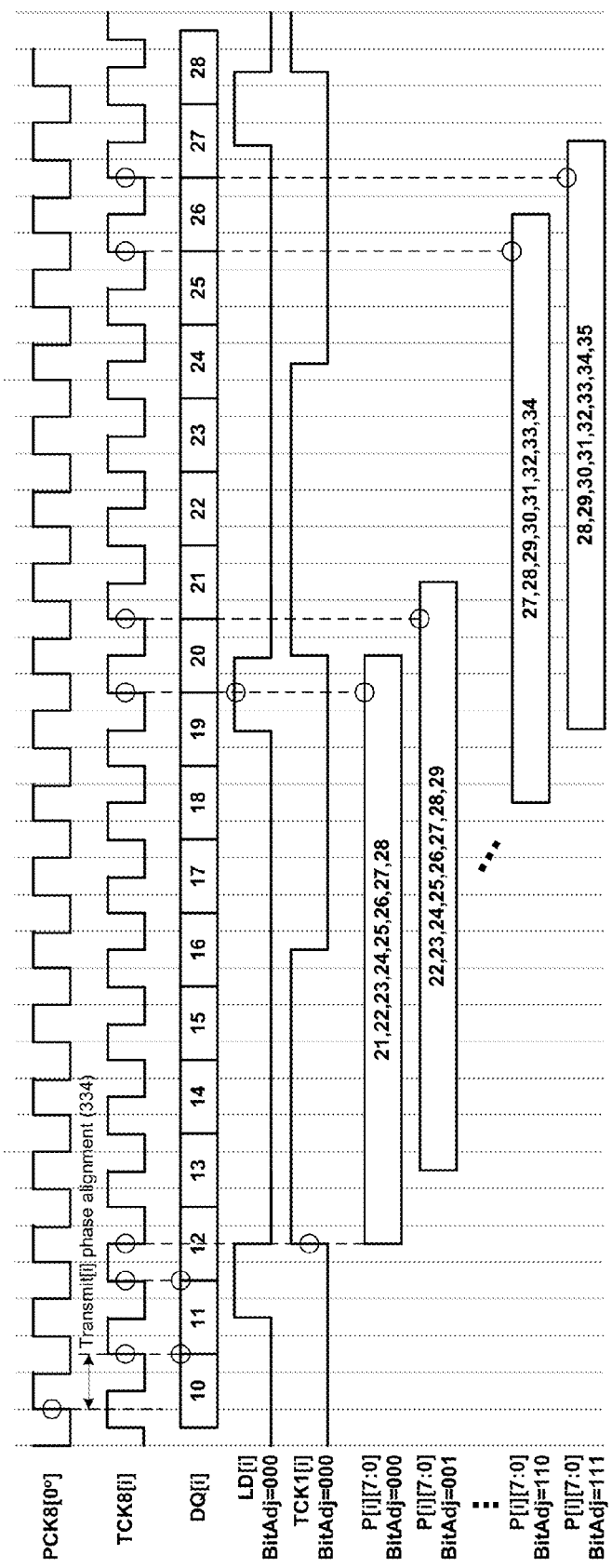

FIGS. 3F and 3G illustrate an embodiment and timing diagram of a drift-compensating serializer 185 that may be used to implement any of the drift-compensating serializers shown in FIG. 2A. Like the drift-compensating deserializer of FIG. 3A, the drift-compensating serializer includes circuitry to perform packet alignment, bit alignment and intra-bit timing phase adjustment, all in the reverse order relative to the deserializer. In effect, the drift-compensating serializer pre-skews the packets of each signaling link (packet-alignment) relative to one another, the bits of each packet (bit-alignment) and the intra-bit phase of the data-rate transmit clock signal to align the data transmission for each link, thereby enabling the counterpart memory-side receive circuit to sample each bit at a desired intra-bit instant, frame each group of bits into a packets in accordance with the packet-framing intended by the memory controller, and transfer all packets that form part of the same multi-packet data word into the memory core domain in synchrony, all without requiring any phase memory-side timing compensation circuitry. Accordingly, a packet-alignment FIFO 371 is loaded with a sequence of transmit data packets (Tdata[i][7:0]) and thus each an 8-bit packet in this example) in response to the controller core clock (PCK1) and unloaded (i.e., packet popped from head of FIFO or queue) into parallel register 367 in response to a buffer-delayed instance (FCK1[i]) of a de-framing clock signal (TCK1[i]), thereby allowing packets from the same multi-packet word from the controller-core to be loaded into the controller I/O domain at different times as necessary to compensate for controller-core-to-memory-core propagation time differences over the different links. The contents of the parallel register 367 are loaded into a serial-output shift register 365 in response to the de-framing clock signal TCK1[i] which is generated in the same manner as the framing clock signal RCK1[i] within the deserializer of FIG. 3A. That is, the de-framing clock signal is generated by dividing a bit-rate transmit clock signal TCK8[i] by eight in modulo-8 counter (formed by register 341 and increment logic 343), and adding a 3-bit bit adjustment value to the counter output in adder 345, thereby enabling the output of the modulo-8 counter to be offset by a value that ranges from 0 to 7 and thus enabling de-framing to occur on any of the eight possible bit boundaries. The MSB of the adder output, which cycles once every eight cycles of TCK8[i], after synchronization with a negative going edge of the transmit clock, TCK8[i] in flop stage 351, forms the de-framing clock, TCK1[i]. The de-framing clock is shifted through a sequence of three of negative-TCK8[i]-edge-triggered flip-flops (353, 355, 357), with the outputs of the final two flop stages (357, 355) being supplied to inverting and non-inverting inputs of AND gate 359 to generate a single-TCK8[i]-cycle load pulse, LD[i], once per de-framing clock cycle. The load pulse is supplied to load-enable inputs of the flop stages within serial-out shift register 365 so that, when the load pulse goes high, the contents of parallel register 367 are loaded into serial-out shift register 365 and, half a TCK[8[i] cycle later (owing to negative-edge-triggered flop stage 361), are shifted bit by bit into output flop 363 and driven onto the DQ[i] link. As in the deserializer of FIG. 3A, an interpolator 364 (or other clock-phase shifter) is provided to enable a calibrated intra-bit (or intra-cycle) timing offset between the transmit clock signal TCK8[i] and the controller I/O clock, PCK8. The calibration operations applied to establish and adjust this drift-tracking phase offset are described below. As discussed in reference to the drift-compensating deserializer of FIG. 3A, in some embodiments, glitch-free starting and stopping of the interpolated clock, TCK8[i], is enabled by distribution of an extra pair of one-cycle-delayed copies of the PCK8[0°] and PCK8[180°] waveforms to the interpolator circuitry 364, though alternative techniques may be used to ensure glitch-free operation.

FIG. 3G illustrates the timing relationship between the various clock, control and data signals described above. More specifically, the arbitrary phase relationship between the PCK8 and TCK8[i] domains is shown at 334 (note that only the 0° clock phase of the multi-phase PCK8 clock signal is shown), along with the timing of the load pulse, LD[i] and its dependence on the bit adjust signal, TxBitAdj[i][2:0], to de-frame a given packet of data for transmission at incrementally bit-shifted positions within the serial output stream. More specifically, the packet of data within the parallel register is transferred to the serial-out register at different de-framing intervals in accordance with bit adjustment value TxBitAdj [i] [2:0], thus enabling the packet boundary to be bit-wise shifted within the outgoing serial bitstream. That is, if the bit adjustment value is zero (TxBitAdj[i]=0, or 000b), the packet of data within parallel register 367 is loaded into the serial-out shift register 365 at the end of the transmission of bit 19 (an arbitrarily assigned number), and then transmitted as bits 21-28. If TxBitAdj[i]=1, the packet is loaded into the serial-out shift register one bit time later, at the end of the transmission of bit 20, and then transmitted as bits 22-29. Continuing, if TxBitAdj[i]=2, 3, 4, . . . , 7, the packet from the parallel register is loaded into the serial-out shift register a corresponding number of bit-times later than if TxBitAdj[i]=0 (i.e., 2, 3, 4, . . . , or 7 bit times later), and then transmitted a corresponding number of bit-times later as bits 23-30, 24-31, 25-32, . . . , or 28-35 within the serial bitstream.

Figure 3H:
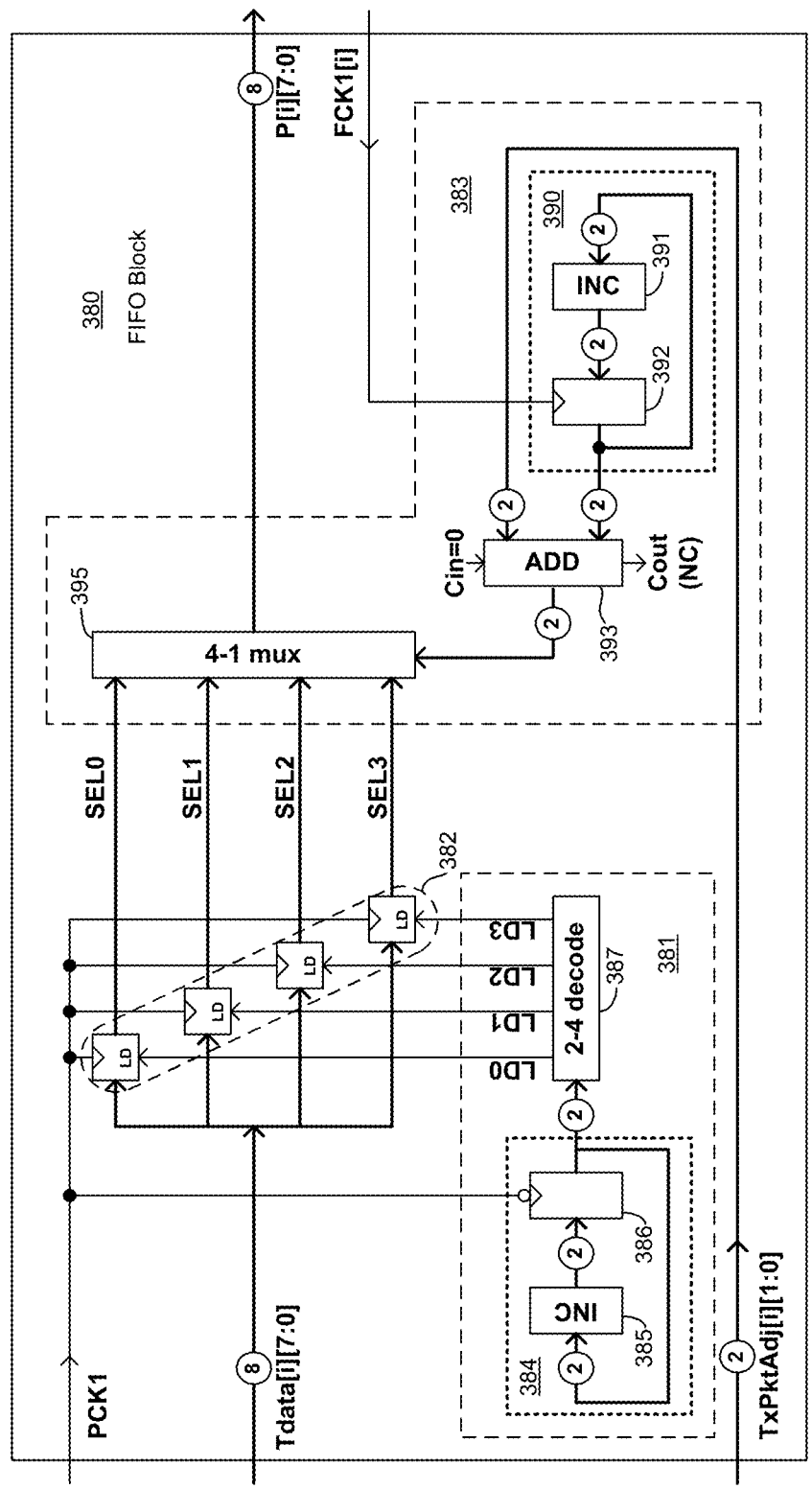
FIG. 3H illustrates an embodiment of a packet-alignment circuit that may be applied within the drift-compensating serializer of FIG. 3F.

FIG. 3H illustrates an embodiment of a FIFO-based packet-alignment circuit 380 that may be used to implement the packet-alignment circuit 371 of FIG. 3F. The packet alignment circuit operates generally as described in reference to FIGS. 3C-3E, but in the reverse direction, in effect, establishing mis-alignment between companion packets (i.e., those belonging to the same outgoing data word or command word) as necessary to ensure aligned transfer into the memory-side core. Accordingly, the packet alignment circuit 380 includes a 4-deep FIFO buffer 351 having packet registers flop0-flop3 (designated in FIG. 3H by respective outputs SEL0-SEL3) as well as a load circuit 381 (or load pointer) and unload circuit 383 (or unload pointer) for loading and unloading the FIFO buffer. In the embodiment shown, the load circuit 381 includes modulo-4 counter 384 (formed by increment logic 385 and register 386) and 2:4 decoder (387) which function generally the same as corresponding elements of load pointer 291 of FIG. 3C, but is clocked by PCK1 instead of FCK1[i]. The unload circuit 383 includes modulo-4 counter 390 (formed by increment logic 391 and register 392) and 4:1 multiplexer 395 which function generally as described in reference to corresponding components of the unload pointer 301 of FIG. 3C, but is clocked by FCK1 [i] instead of PCK1 and includes 2-bit adder 393 to enable the load sequence to be advanced by 0, 1, 2 or 3 (zero to three) FCK1 sampling edges. By this arrangement, the packet registers of the FIFO buffer 382 are loaded in a rotating sequence in response to successive edges of PCK1 and unloaded in a rotating sequence in response to successive edges of FCK1[i], with the load-to-unload latency being adjustable via the TxPktAdj[i][1:0] value that is added to the output of the modulo-4 unload counter 390. Accordingly, by retrieving transmitted data (e.g., via loopback or write and read back) via a previously calibrated drift-compensating deserializer, latency values corresponding to each setting of the transmit packet adjust value may be determined for each signaling link; minimum link latencies may be ascertained and used to establish system link latency for controller-to-memory signaling. Thereafter, the system link latency value may be used to program or otherwise establish the transmit packet adjust values for each of the signaling links to ensure uniform alignment upon serialization and transfer to the memory-side core clock domain.

Figure 4A:
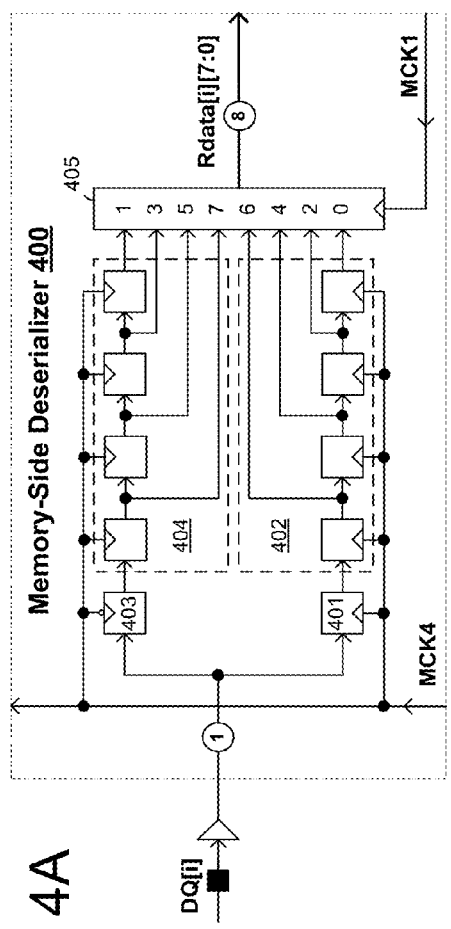
FIGS. 4A and 4B illustrate embodiments of deserializer and serializer circuits, respectively, that may be used to implement the deserializer and serializer circuits within the memory device of FIG. 2A.
Figure 4B:
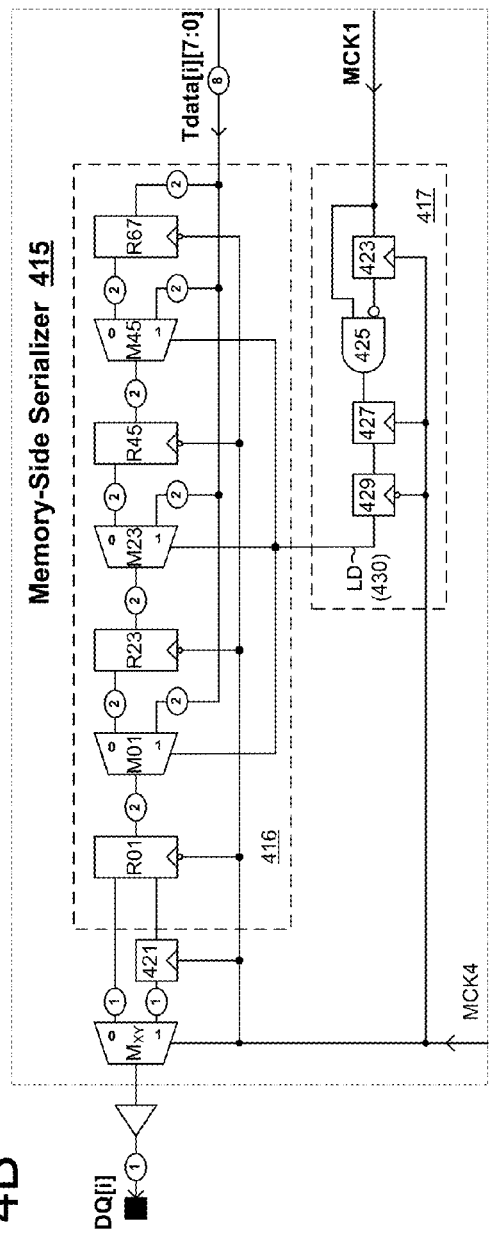

FIGS. 4A and 4B illustrate embodiments of deserializer and serializer circuits, 400 and 415 respectively, that may be used to implement any of the deserializer and serializer circuits within the memory device of FIG. 2A. As shown, the core memory clock, MCK1, may be used as the packet-framing and de-framing clock without adjustment, and no other phase-adjustment or bit-adjustment circuitry need be provided. Also, because the MCK4 signal oscillates at half the data-rate, both rising and falling edges of MCK4 (or rising edges of MCK4 and falling edges of complementary clock, /MCK4 (or vice-versa)) may be used to time data transmission and reception within the memory-side serializer and deserializer circuits, thus effecting data-rate timing.

In the exemplary deserializer 400 embodiment of FIG. 4A, the incoming data signal (which may bear write data, command/address information, calibration information, etc.) is clocked alternately into even-data flop 401 and odd-data flop 403 in response to rising and falling edges, respectively, of the memory-side I/O clock, MCK4. Thereafter, data captured within the even-data and odd-data flops are shifted together into even-data shift register 402 and odd-data shift register 404, with each shift register having, in this 8-bit packet example, four flop stages. Once every four cycles of the MCK4 signal, after the even and odd shift registers have been loaded with a complete packet of data, a rising edge of MCK1 is used to latch the packet of data (available in parallel at the outputs of the shift registers 402, 404) within parallel-out packet register 405, thus effecting transfer of the packet to the memory core domain interface as receive data Rdata[i][7:0] (e.g., write data, calibration data, configuration data, command/address information, data-mask information, etc.).

In the exemplary serializer 415 of FIG. 4B, an eight-bit transmit data packet, Tdata[i][7:0], is parallel-loaded into a four-stage, 2-bit-wide shift register 416 (which may be viewed as a pair of single-bit shift registers for even-numbered and odd-numbered bits of the packet, respectively) in response to a load pulse 430 generated once per MCK1 cycle. Thereafter, the two bits at the head of the shift register (i.e., in flop stage R01) are applied to output driver (and thus driven on to link DQ[i]) in respective low and high phases of a given MCK4 cycle, before the next pair of bits is shifted forward for transmission in the subsequent MCK4 cycle. As shown, flip-flop 421 is provided to ensure hold-time for the bit being provided for output during the high phase of the MCK4 cycle and may be omitted if sufficient hold time is otherwise available.

The load pulse 430 may be generated in any number of ways, but in the embodiment shown is generated by flop 423 and AND gate 425. More specifically, AND gate 425 receives the output of flop 423 at an inverting input and MCK1 at a non-inverting input and therefore generates a pulse that extends for the first cycle of MCK4 following each rising edge of the core clock, MCK1. The pulse from AND gate 425 is buffered in flop 427 to ensure sufficient hold time before being re-timed a half MCK4 cycle later in negative-MCK4-edge-triggered flop 429 to yield load pulse 430. The load pulse itself is supplied to multiplexer stages M01, M23 and M45, thereby enabling component registers R01, R23 and R45 of the shift register to be parallel-loaded with constituent bits of the packet to be serialized (i.e., bits 0, 1 into R01; bits 2, 3 into R23; and bits 4, 5 into R45) while bits 6 and 7 of the packet are simultaneously loaded into input-stage register R67.

In alternative embodiments, various implementation details may be changed within the serializer and deserializer circuits of FIGS. 4A and 4B. For example, instead of clocking shift registers with a data-rate clock (a half-bit-rate clock in the examples shown) to achieve 8:1 serialization, a sequence of 2:1 multiplexers and flip-flop stages may be provided select, in successive stages, alternating 4-bit portions of an 8-bit packet in response to high and low phases of MCK1 (stage 1), alternating 2-bit portions of each 4-bit portion in response to high and low phases of a divided-by-two instance of MCK4 (stage 2), and alternating single bits of each 2-bit portion in response to high and low phases of MCK4 in an output stage. A similar arrangement may be employed to perform 1:8 deserialization, combining individual bits into 2-bit portions of a packet in an input stage, combining bit pairs into 4-bit portions of a packet in a second stage, and then combining 4-bit portions of a packet in a third stage. Drift-compensating serializers and deserializers within the memory controller may similarly be implemented with successive 2:1 multiplexing (or demultiplexing) stages rather than shift registers clocked by a data-rate clock. In that case, bit adjustment may be effected by adding offset values to frequency-divided local clocks.

Calibration

In the memory system of FIG. 2A, calibration of the clock phase, bit alignment and packet alignment circuitry within each of the drift-compensating deserializers and serializers is carried out based on data transmitted over the signaling link being calibrated. In one embodiment, initial calibration operations are carried out to establish reliable operation within the drift-compensating deserializers and then within the drift-compensating serializers, and thereafter a periodic (or occasional) timing calibration operation is carried out to incrementally adjust the calibration settings frequently enough to track memory-side timing drift (and more generally, system-wide timing drift). Also, in one embodiment, drift-compensating deserializer circuitry as shown, for example, in FIG. 3A (and counterpart memory-side serializing circuitry as shown, for example, in FIG. 4B), is provided for each of the otherwise unidirectional links (e.g., control/address and data-mask), thereby permitting an identical calibration procedure to be carried out for each signaling link. In an alternative embodiment, another return path from the memory device to the memory controller (e.g., a sideband link) may be used to calibrate a unidirectional controller-to-memory link. In that case data transmitted from the controller via the unidirectional link may be switchably routed to the alternative return path for delivery to the memory controller, thus enabling the memory controller to determine whether the originally transmitted data was properly received by the memory device.

Figure 5A:
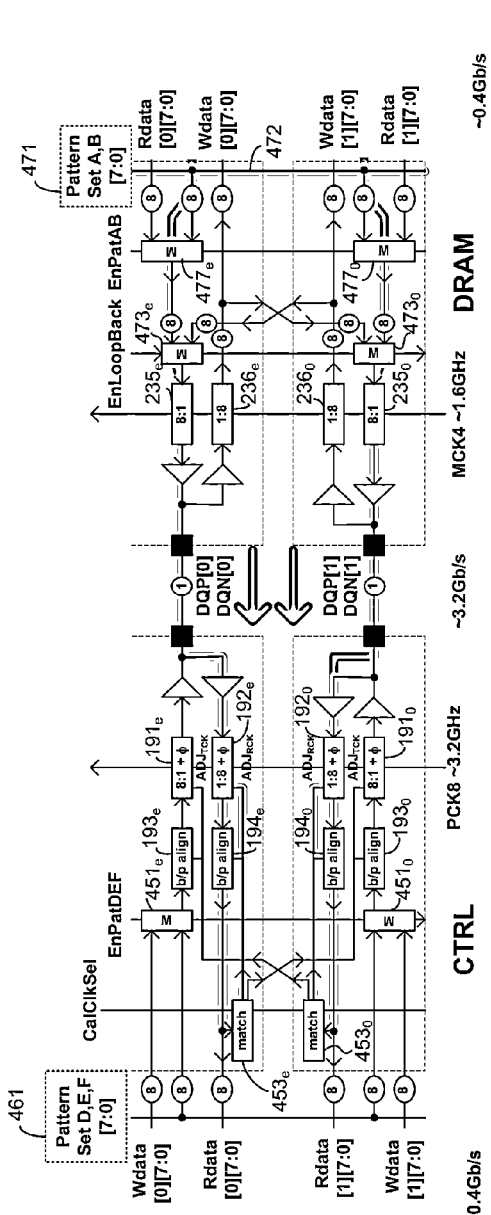
FIG. 5A illustrates an exemplary approach to calibrating the receive clock phases within the drift-compensating deserializers for data links DQ0 and DQ1 within the embodiment of FIG. 2A.

The general approach with respect to initial calibration of each drift-compensating deserializer and serializer is to calibrate the receive/transmit clock phase first (adjusting RxPhAdj[i] and TxPhAdj[i]) followed by bit alignment (RxBitAdj[i] and TxBitAdj[i]) and then packet alignment (RxPktAdj, TxPktAdj[i]). FIG. 5A, for example, illustrates a manner of calibrating the receive clock phase within the drift-compensating deserializers for data links DQ0 and DQ1 (thereby ensuring reliable memory-to-controller signaling), though the same procedure should be understood to be carried out simultaneously for all signaling links. As calibration-support circuitry, the memory controller includes data-selection (multiplexing) circuitry and match circuitry for each signaling link, as well as sources of calibration data patterns for intra-bit phase adjustment, bit alignment and word alignment. The memory device also includes data-selection circuitry and calibration data sources, as well as loop-back interconnections between paired links to enable data received via one signaling link to be returned to the memory controller via a paired counterpart link.

Continuing with FIG. 5A, the memory controller issues a calibration command to the memory device over a side-band link (e.g., the sideband link, SL, shown in FIG. 2A) to select, via data-selectors (multiplexers) 477*e* and 477*o*, pattern set A from calibration data source 471 as a source of calibration data to be transmitted to the memory controller over each the DQ[0] and DQ[0] signaling links. The overall calibration data path for even-numbered link DQ[0] is illustrated by the shaded data-flow from internal data calibration data path 472, through multiplexers 477*e* and 473*e* to the memory-side serializer 235*e*. The resulting serial bitstream is transmitted in response to rising and falling edges in the differential memory I/O clock (MCK4) which occur at twice the rate of the 1.6 GHz memory I/O clock and thus yield a 3.2 Gb/s transmission on each differential link. Upon arrival at the memory controller, the bit sequence is provided to the phase-selecting deserializer 192*e* and bit/packet alignment circuitry 194*e* where it is sampled and deserialized (framed into a packet) in response to initial phases of the receive clock, RCK8[i] and framing clock signal, RCK1[i] (e.g., RxPhAdj[i]=000000b and RxBitAdj[i]=000b), and packet-aligned in accordance with an initial packet adjustment value (RxPktAdj[i]=00b). In one embodiment, the data sequence that forms pattern set A is predetermined or at least predictable (e.g., deterministically generated) so that the received data may be provided to a match circuit 453*e* to determine whether the received data matches the expected sequence. In one implementation, this evaluation is carried out with respect to the sequence of bits only, so that the match/mismatch determination is dependent only on whether the individual bits are sampled without error and without regard to any bit or packet misalignment. Calibration data flows simultaneously within the odd and even numbered signaling links through parallel calibration paths. Thus, calibration data for the odd-numbered link shown (DQ[0]) progresses through I/O circuitry and calibration-support circuitry for the odd-numbered link (477*o*, 473*o*, 235*o*, 192*o*, 194*o*) to arrive at match circuit 453*o*.

Figure 5D:
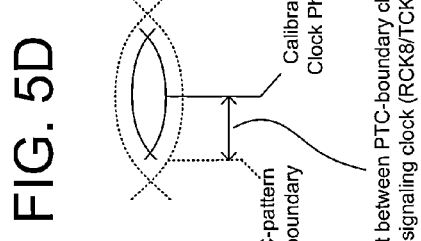
FIG. 5D illustrates fine and coarse data-eye boundaries and an offset between the fine-data-eye center and coarse-dataeye fail-boundary that may be used to track drift during periodic timing calibration operations.
Figure 5C:
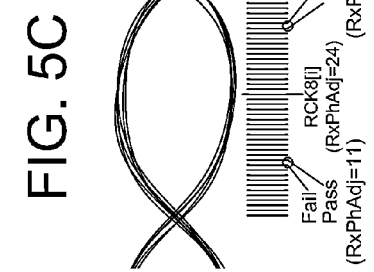
FIG. 5C demonstrates an approach for determining a final receive clock phase, showing an exemplary relationship between a number of clock phases selected by an exemplary phase selector and pass-fail boundaries relative to a data-eye schmoo.
Figure 5B:
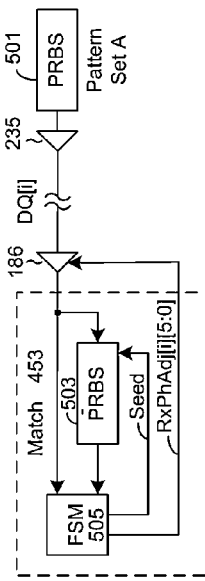
FIG. 5B illustrates a particular embodiment the intra-bit clock-phase arrangement of FIG. 5A without detail regarding the various data selection paths.

FIG. 5B illustrates a particular embodiment the intra-bit clock-phase arrangement of FIG. 5A without detail regarding the various data selection paths. As shown, a pseudo-random bit-sequence (PRBS) circuit 501 generates, as pattern set A, a deterministic bit pattern which is serialized (235) for transmission over the signaling link (DQ[i]) and received within the drift-compensating deserializer 186. A state machine 505 (or bit sequencer or other control logic) within the match circuit 453 initially asserts a seed-enable signal ("Seed") to a controller-side PRBS circuit 503 implemented in the same manner (i.e., calculating the same PRBS polynomial) as the memory-side PRBS circuit 501, thus enabling the memory-side and controller-side PRBS circuits to be synchronized. If the incoming data sequence is properly sampled by the initial receive clock phase, the output of the controller-side PRBS circuit will, after seeding (i.e., shifting into the PRBS register chain), match the output of the memory-side PRBS as it appears at the controller-side PRBS input. Accordingly, if data reception is error-free, the state machine may deassert the seed signal and the now-seeded controller-side PRBS output will continue to match, bit for bit, the received data sequence corresponding to pattern set A. By this arrangement, the state machine 505 may assess a pass/fail status for the initial receive clock phase (e.g., selected by RxPhAdj[i]=000000b) according to whether the controller-side PRBS output matches the transmitted data sequence. Thereafter, the receive clock phase may be advanced (e.g., incrementally or following a binary or other search pattern) and proper data reception re-tested at the new clock phase. By determining the pass-fail boundary (i.e., adjacent clock phases that yield passing and failing test results) at either end of a data eye or at the close of one data eye and the opening of the succeeding data eye, a final clock phase may be selected from among a range of passing clock phases, for example as the median between the two pass-fail boundaries or at a specific offset from one of the boundaries, potentially selected according to eye width. FIG. 5C demonstrates this approach, showing an exemplary relationship between the 48 clock phases selected by an exemplary phase selector (i.e., three bits to select two of six clock phases, three bits to interpolate between the selected clock-phase pair) and pass-fail boundaries relative to a data-eye schmoo (i.e., plot of successive data eyes overlaid upon one another). In the example shown, failing clock phases for phase-adjustment settings 0-10 and 38-47, and passing phase-adjustment settings from 11 to 37. Accordingly, a final receive clock phase may be selected as the average or median of the pass/fail boundaries, in this case, a phase adjustment value of 24 ((10+38)/2 or (11+37)/2). Alternatively, the difference between the pass-fail boundaries may be used as a measure of the unit-interval ((37−11)×7.5°=202.5°) and thus used to select between a limited number of edge-to-center offsets, occasionally referred to herein as the half-UI offset (though not necessarily exactly half the unit-interval). This approach enables rapid switching between clock phases aligned with the pass/fail boundary and the calibrated sampling point (the nominal data-eye midpoint). Such "phase jumping" is particularly useful for speeding periodic timing calibration operations. For example, in one embodiment, discussed below, periodic timing calibration is carried out by phase-jumping from the receive clock phase to the pass-fail-boundary clock phase (the "boundary phase") to determine whether the pass-fail boundary has drifted since the last timing calibration operation. If so, the boundary phase is incremented or decremented in the direction of the drift. After updating the boundary phase, a fixed phase jump is performed, relative to the updated boundary phase, to arrive at a correspondingly updated (incremented or decremented) receive clock phase, completing the periodic timing calibration with respect to the receive clock phase.

In one embodiment, periodic timing calibration is hidden under memory-side maintenance operations (e.g., DRAM refresh) or carried out in potentially brief idle intervals and thus involves a relatively brief test pattern transmission to enable detection of drift of the pass-fail boundary. Because the brief test pattern may include only a limited number of the spectral components present in a more random data sequence (as represented by a longer pseudo-random bit sequence), a more open data eye (having different pass/fail boundaries) may be perceived during periodic timing calibration (PTC) than during initial calibration. In one embodiment, the PTC pass-fail boundary is determined after initial calibration of the receive clock and thereafter used to detect drift (e.g., by retesting the boundary phase). As the PTC boundary clock phase is incremented and decremented in response to drift, the receive clock phase is correspondingly incremented and decremented, thereby maintaining the receive clock phase at a constant offset with respect to the PTC fail boundary and compensating for system drift. This operation is illustrated conceptually in FIG. 5D, which shows the larger data eye that results from the spectrally-limited PCT test pattern overlaid on the smaller data eye that results from the more spectrally-complete initial calibration test pattern, and the offset between the PTC boundary phase and the receive clock phase. A similar operation may be carried out following transmit phase calibration (described below), determining a PTC boundary phase together with a finely tuned transmit clock phase and incrementing and decrementing those clock phases in lock step during periodic transmit timing calibration.

Figure 6A:
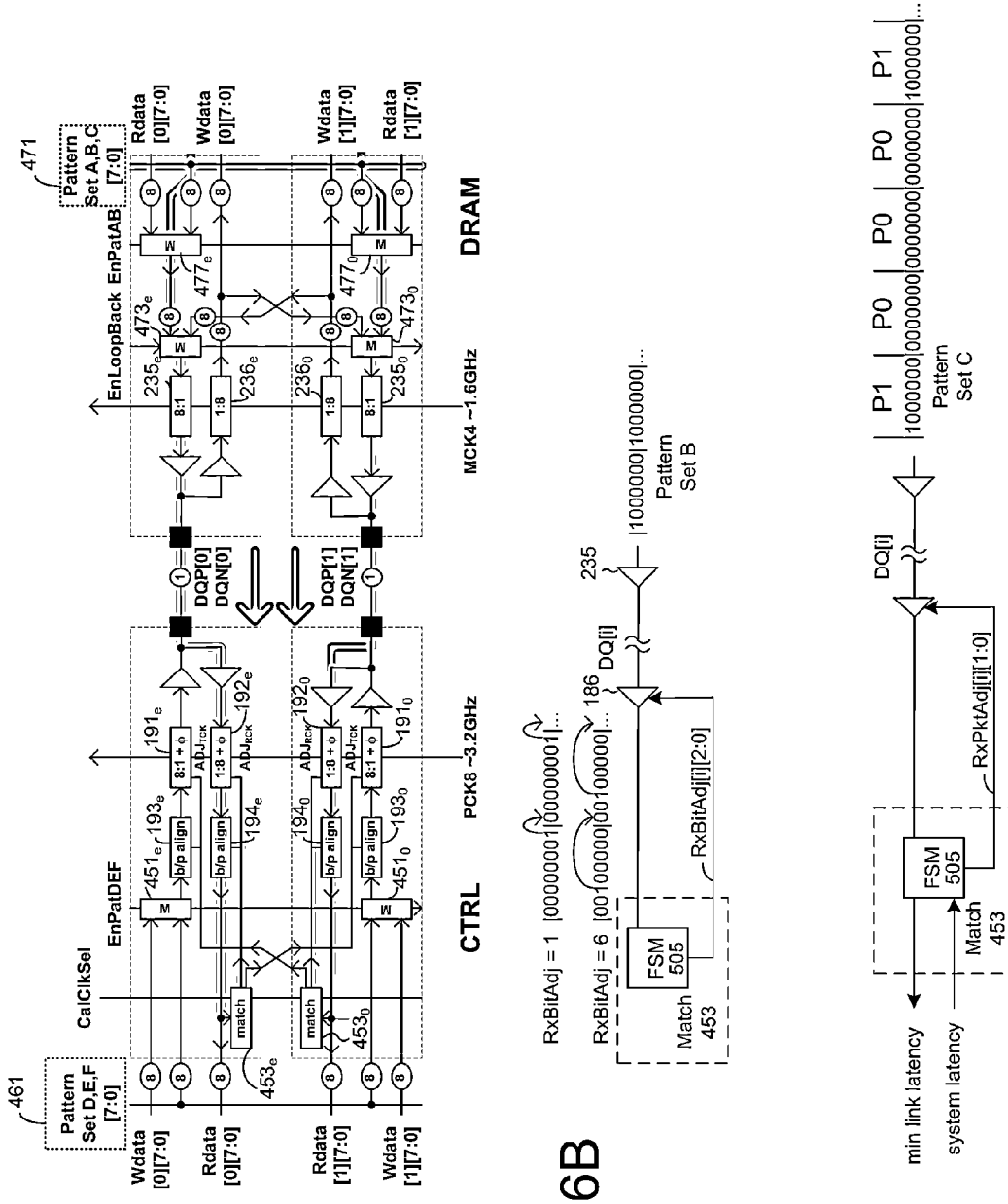
FIGS. 6A and 6B illustrate an exemplary bit-alignment (or packet-framing adjustment) stage of the drift-compensating deserializer calibration.
Figure 6B:
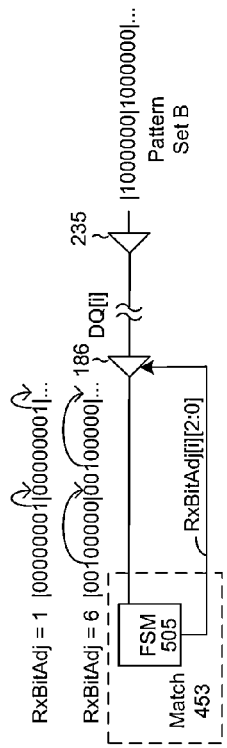

FIGS. 6A and 6B illustrate an exemplary bit-alignment (or packet-framing) stage of the drift-compensating deserializer calibration. As with receive-clock calibration, the bit-alignment operation begins with a side-band command from the memory controller to the memory device to begin outputting a predetermined calibration data pattern; in this case, pattern set B: a framing pattern formed by an 8-bit packet with a solitary '1' bit in a predetermined bit position. The data transmission path is essentially the same as in FIG. 5A (shown by the gray outline passing through memory-side multiplexer stages, serializer, data link, controller-side deserializer and bit/packet alignment circuit to arrive at match circuitry 453), but the output of the match circuit for each link adjusts the bit alignment value (RxBitAdj[i]) delivered to the bit/packet alignment circuit instead of the interpolated clock phase as in the receive clock calibration operation of FIG. 5A. FIG. 6B illustrates the overall bit-alignment operation as performed, for example, by state machine 505 within the match circuitry 453. As shown, the state machine evaluates the incoming packets at an initial framing value (e.g., BitAdj=000) to determine whether the logic '1' bit appears in the intended bit position within the packet. If not, the state machine determines the bit offset between the actual logic '1' bit position and the desired '1' bit position, and adjusts the bit adjust value accordingly. In the first of two bit-misalignment (or packet-framing error) examples shown in FIG. 6B, the logic '1' bit is framed in bit position seven (0000 0001b) instead of bit position zero (1000 0000b) as originally transmitted. In that case, the finite state machine determines a bit displacement of one bit and sets the bit adjustment value accordingly to RxBitAdj[i]=001b, thus effecting a 1-bit right-shift of the logic '1' within the incoming bit sequence (or a 1-bit left-shift in framing boundary) to position the logic '1' bit at the correct bit position (bit position zero) and thereby establish the intended packet-to-packet framing. In the second of two misalignment examples, the logic appears at bit position two, so that a bit adjustment of six (RxBitAdj[i]=110) is applied to effect the intended packet framing boundary.

Figure 6C:
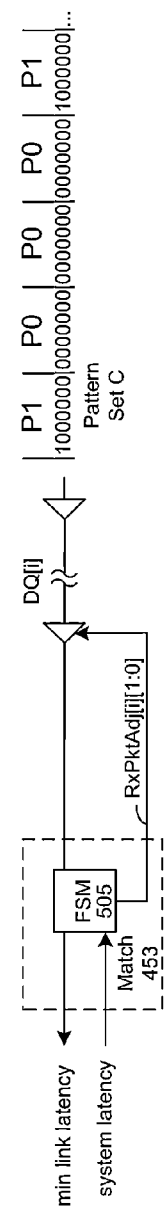
FIG. 6C illustrates an exemplary packet alignment operation carried out to determine a word latency value that, when applied to the packet alignment circuits within the various signaling links of FIG. 2A, aligns the packets that form part of the original multi-packet value retrieved from the memory core for simultaneous transfer into the controller-core clock domain.

Still referring to FIG. 6B and FIG. 3A, it can be seen that bit alignment is effected by delaying the framing clock relative to the core clock domain so that, depending on the bit-shift required (in conjunction with phase-delay used to establish the desired phasing of the receive clock), a given packet may be ready for transfer to the core clock domain at different times (i.e., in response to different edges of the core clock signal). Thus, packets that form part of the same multi-packet value retrieved from the memory core may, without alignment, be transferred into the core domain in response to different core clock cycles. To avoid this consequence, the packet alignment operation shown in FIG. 6C is carried out to determine a packet latency value that, when applied to the packet alignment circuits for the various links, aligns the packets that form part of the original multi-packet value retrieved from the memory core for simultaneous transfer into the controller-core clock domain. As with phase and bit alignment, the packet-alignment calibration begins with a command from the memory controller to the memory device to select a calibration data source (pattern set C) that enables distinction between each sequence of four packets. For example, in one embodiment, pattern set C is a four-packet sequence that includes a packet with one or more '1' bits ("P1"), followed by three zero-valued packets ("P0"). Accordingly, state machine 505 may determine the latency in the P1 packet receipt relative to those of other links, for example, by outputting the local packet latency to a logic circuit that receives like signals for the other links and returns a "relative latency" value indicative of the local packet latency relative to that of the most latent link. The state machine 505 responds by delaying the I/O-to-core packet transfer time in accordance with the relative latency indication and thereby match the P1 transfer time of the most latent link such that P1 packets are transferred to the core domain simultaneously (i.e. in response to the same PCK1 edge) for all links.

After calibrating the receive clock phase, bit alignment and packet alignment within the drift-compensating deserializers, similar operations are carried out to calibrate the transmit clock phase, bit alignment and packet alignment within the drift-compensating serializers. In general, these operations are carried out by transmitting calibration data from the memory controller to the memory device via the drift-compensating serializer being calibrated, then receiving the transmitted calibration data back from the memory device via a previously calibrated drift-compensated deserializer. More specifically, in one embodiment, a data loopback path is provided within the memory device to enable calibration data transmitted by the memory controller to be returned to the memory controller without burdening the memory core. This arrangement speeds the calibration data return and enables timing calibration operations to be partly or completely hidden under (i.e., carried out concurrently with) memory refresh or other overhead operations within the memory core.

In an alternative embodiment, write and read-back operations may be used to establish full-loop testing of the data links (thus avoiding the need for loopback paths), but such arrangement complicates the overall calibration procedure in that the command path generally needs to be made operational before write and read operations can be commenced. Though it is possible to establish reliable command path signaling in advance of data path calibration (e.g., through calibration operations coordinated over the side-band link; sending commands via the command path and evaluating whether the commands were properly received), this complication is avoided through the loopback approach.

FIGS. 7A, 7B and 8A-8C illustrate exemplary serializer calibration procedures that rely upon cross-coupled loopback paths between respective pairs of signaling links within the memory device. In general, the serializer calibration procedure follows the same sequence as the deserializer calibration, starting with clock phase adjustment, followed by bit alignment (packet framing) and then finally inter-link packet alignment.

Figure 7A:
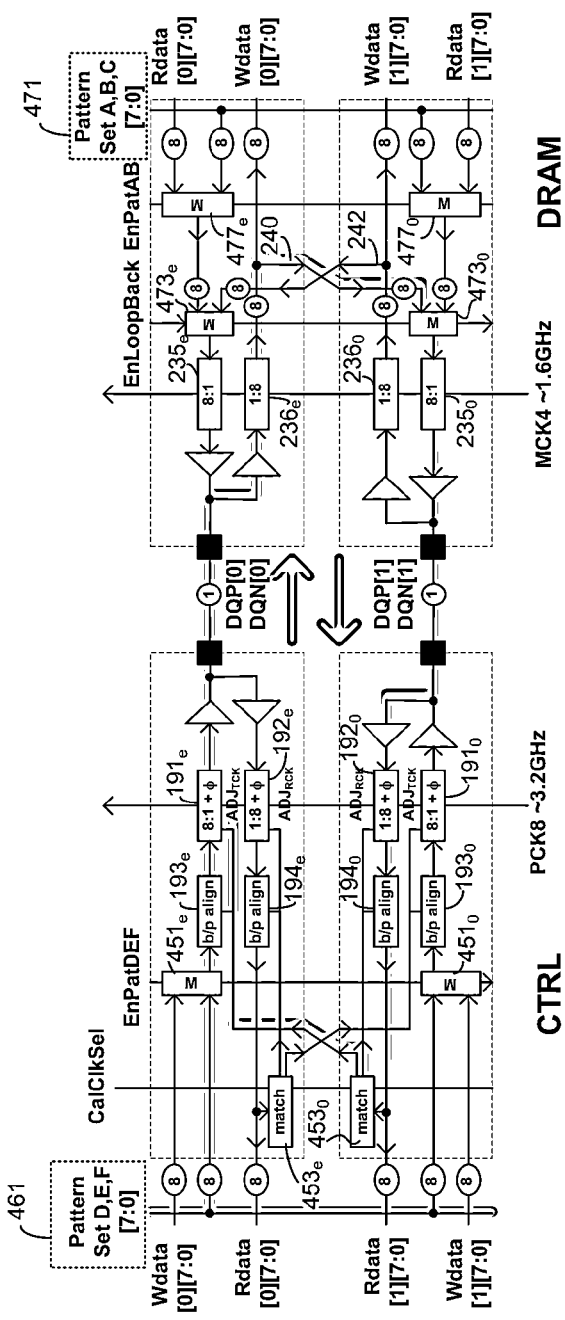
FIGS. 7A, 7B and 8A-8C illustrate exemplary serializer calibration procedures that rely upon cross-coupled loopback paths between respective pairs of signaling links within the memory device.
Figure 7B:
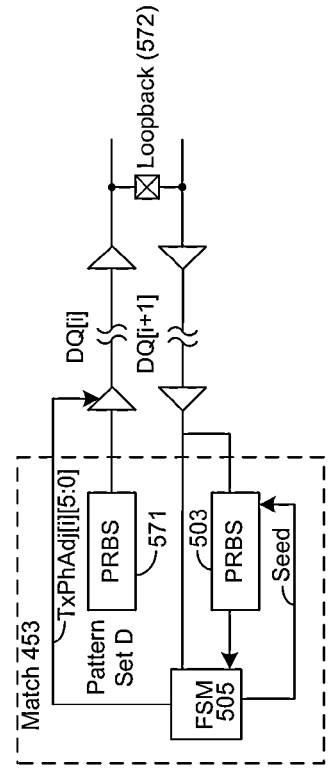

FIG. 7A illustrates calibration data flow during calibration of the transmit clock phase within a drift-compensating deserializer. Initially, a calibration data source is selected via multiplexer 451e and serialized within drift-compensating serializer (191e, 193e) using initial packet-alignment, bit-alignment and transmit-phase values (e.g., all values zero). The data is conveyed via an even numbered signaling link (DQ[0] in this example), received and packetized within the counterpart memory-side deserializer 236e, then routed via loopback path 240 and multiplexer 473o, to the data transmission circuitry and serializer for the counterpart link of the even/odd link pair (i.e., DQ[0]). Continuing, the data is received within the previously-calibrated drift-compensating deserializer (192o, 194o) for the odd-numbered link and provided to match circuitry 453o which, in turn, renders a pass-fail determination for the transmit clock phase under test. FIG. 7B illustrates the overall flow of calibration data from source to destination. More specifically, in the example shown, a calibration data sequence is sourced by a controller-side PRBS generator 571 and transmitted to the memory device using the transmit phase adjust setting (TxPhAdj[i]) under test. Upon receipt within the memory device, the calibration data sequence is looped back to the memory controller through a switchably-formed loopback path (572), received within the memory controller and then delivered to a controller-side PRBS checker circuit 503. In the particular embodiment shown, the same PRBS checker circuit 503 is employed during transmit and receive calibration, though separate (or at least differently configured) checker circuits may be used in alternative embodiments. Because the memory-to-controller transfer has been previously calibrated, the pass or fail result for the transmit clock phase under test may be assumed to result from improper phase alignment between the controller-side transmit clock and the uncompensated memory-side receive clock signal. Accordingly, by incrementing transmit clock phase through a linear (or binary-search or other search) sequence, pass-fail boundaries for the transmit clock phase may be identified, and a corresponding transmit clock phase selected as the midpoint between those boundaries, or as a predetermined offset from one of the boundaries (e.g., based on the range of clock phases between the pass-fail boundaries). After the transmit clock phase for each of the even numbered signaling links is completed, the memory controller issues a command via the sideband link to switch the multiplexing arrangement to enable data transmitted by the odd-numbered signaling links to be looped back via the even-numbered signaling links (i.e., including loop back path 242 and multiplexer 473e), and to enable the match circuitry within the even numbered signaling links to adjust the phase of the odd-link transmit clocks.

Figure 8A:
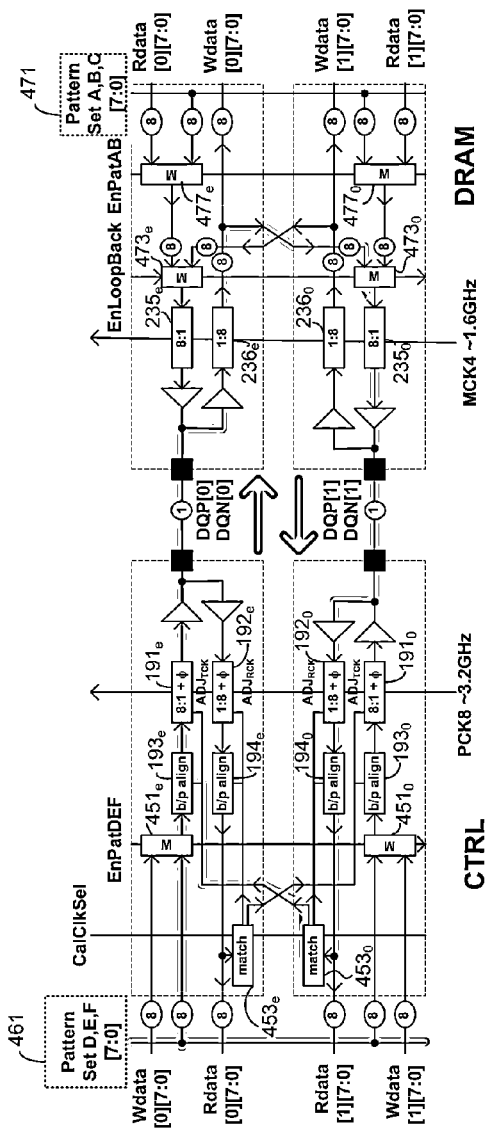
Figure 8B:
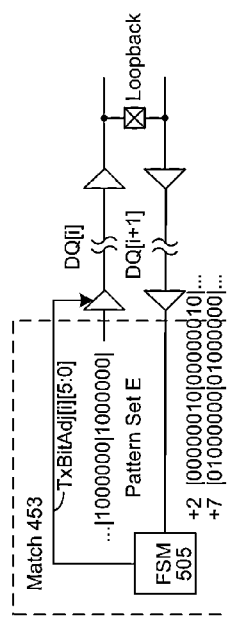
Figure 8C:
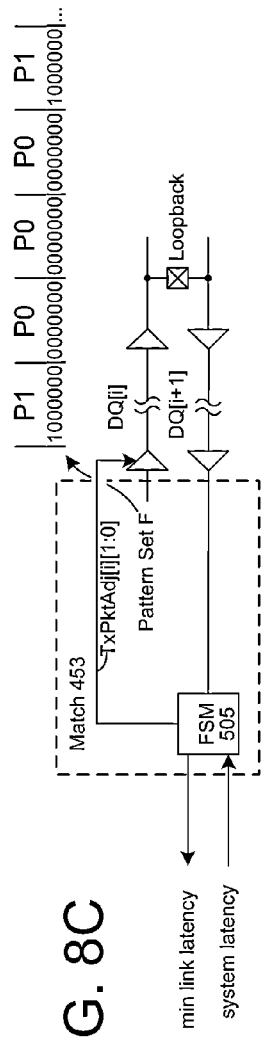

After the even and odd transmit clock phases have been calibrated, the memory controller issues another sideband link command to re-establish the memory-side loopback path between the even-link deserializer 236e and the odd-link serializer 235o in preparation for a bit alignment and packet alignment operations that correspond to those carried out for the drift-compensating deserializer. This arrangement is shown in FIGS. 8A, 8B and 8C showing the overall data flow path (FIG. 8A), and the bit-alignment signals (FIG. 8B) and packet-alignment signals (FIG. 8C) provided to the bit/packet alignment circuit within the even loop signaling path. After bit/packet alignment within the even-numbered signaling links is completed, the memory-device data multiplexers are switched again (e.g., in response to a sideband link command from the memory controller) to enable calibration of the bit/packet alignment within the odd-numbered signaling links.

Periodic Timing Calibration

After phase, bit and packet alignment operations are completed for the drift-compensating serializer/deserializer circuits in the initial timing calibration effort, active memory operations may be commenced with full data-rate data transfer between the memory device and memory controller. As discussed above, the lack of drift-compensation circuitry within the memory device means that the initial phase calibrations may relatively quickly drift away from desired alignments in response to changes in temperature and voltage (or other environmental factors) and thus require relatively frequent correction. Periodic or occasional timing calibration operations are carried out to provide this correction.

Figure 9A:
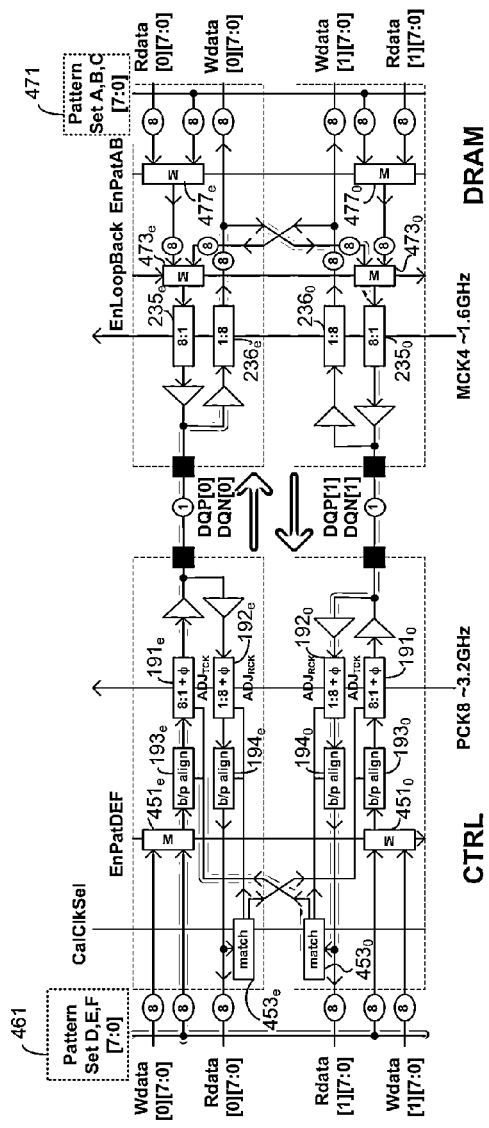
FIGS. 9A and 9B illustrate exemplary sequences of operations used to periodically calibration of the drift-compensating serializers and drift-compensating deserializers, respectively.
Figure 9B:
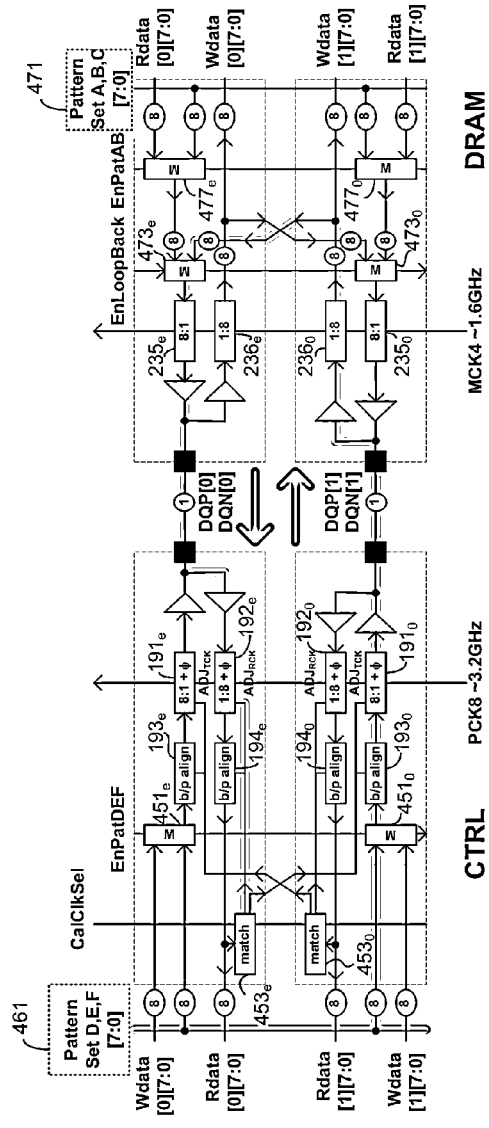

FIGS. 9A and 9B illustrate exemplary sequences of operations used to periodically calibrate the drift-compensating serializers and drift-compensating deserializers, respectively. Referring first to FIG. 9A, before transmitting calibration data, the memory controller issues a loopback-enable command via the now-calibrated command path to establish looped-back flow from even- to odd-numbered signaling links and also shifts the phase of the transmit clock in response to a clock selection signal (EdgeClkSel) to match the passing clock phase recorded for a pass/fail boundary. At this point, the memory controller transmits data selected from pattern source F, a predictable or predetermined sequence of values that may be transmitted a limited number of times (e.g., one packet) in response to the boundary-phase transmit clock signal. The pattern source is received within a counterpart deserializer of the memory device, looped back to the serializer for the odd-numbered link of the link-pair under test (occurring in all link pairs simultaneously) and then re-transmitted to the memory controller where it is received within the drift-compensating deserializer (using the previously calibrated receive clock phase) and supplied to match circuit 473o for comparison with the expected value. If a pattern mismatch is detected at this point, the memory controller may infer that the pass/fail boundary has drifted in the direction of the passing phase of the pass/fail boundary and thus increments the clock phase recorded for the pass/fail boundary value in a direction that tracks the phase drift. Thereafter, by phase-jumping by a predetermined offset relative to the now-shifted pass/fail boundary, an incremented (adjusted) transmit clock phase is effected, compensating for the drift. If a pattern match is detected for the previously confirmed pass-phase of the pass/fail boundary, the previously confirmed fail-phase may be tested (repeating the transmission of the data pattern F using the decremented boundary phase) to determine if the controller-to-memory phase has drifted in the opposite direction. If the fail-phase now passes, drift in the fail-boundary direction is inferred, and the clock phase recorded for the pass/fail boundary is decremented to track the phase drift. Thereafter, by phase-jumping by a predetermined offset to the now-decremented pass/fail boundary, a decremented (adjusted) transmit clock phase is effected, compensating for the drift. If pattern match is detected in the pass-boundary phase and pattern mismatch is detected in the fail-boundary phase, the pass/fail boundary is deemed not to have drifted since the last calibration operation and thus no change in the phase adjust values for the pass/fail boundary or the transmit clock phase is recorded.

While the above-described calibration approach enables a phase increment, decrement or hold during each calibration update, in an alternative embodiment, each calibration operation may decrement or increment (no hold state) the clock phase being calibrated, thus potentially suffering some clock dithering in return for the benefit of a simpler control circuit (e.g., state machine) implementation. In such an embodiment, the results of several calibration operations may be accumulated and then applied to determine a phase update according to majority vote. In either case, only a single phase jump need be made between the boundary and sampling clock phases.

After the periodic timing calibration of the controller-side transmit clock phases is completed for the even-numbered signaling links, the memory controller issues a calibration command via the CA links to reverse the data multiplexing direction and the same sequence of calibration operations is carried out with respect to the odd numbered links.

After completion of the periodic timing calibration operations for the even-link and odd-link transmit clock phases, corresponding periodic timing calibration operations are carried out as shown in FIG. 9B to adjust the even-link and odd-link receive clock phases. In one embodiment, the receive clock calibration follows on the heels of the transmit clock phase adjustment so that the memory-side loopback path from odd-link deserializer to even-link serializer is already established. Otherwise, the memory controller may issue a command via the command path to establish that loopback path. In either case, once the odd-to-even loopback path is established, the memory controller begins transmitting pattern F data (or other periodic timing calibration data) via the odd-numbered signaling link (i.e., via multiplexer 451*o*, through packet/bit alignment circuit 193*o* and phase-shifting serializer 191*o*) and receives the looped-back data via the even-link deserializer. As with the transmit clock, the receive clock phase is offset to the previously recorded pass/fail boundary during the periodic timing calibration to determine whether pass/fail boundary has moved and, if so, in which direction. That is, if the pass-boundary phase still yields a passing result, but the fail-boundary phase now yields a passing result instead of a failing result, the bit adjustment values for the pass-fail boundary are shifted in the direction of the fail-boundary phase to counteract the phase drift, yielding a corresponding shift in the receive clock phase due to the fixed phase offset maintained between the now-shifted pass/fail boundary and the receive clock. If the pass-boundary phase yields a failing result, the bit adjustment value for the pass-fail boundary is shifted in the direction of the pass-boundary phase, yielding a corresponding shift in the receive clock phase to counteract the phase drift. If there is no movement in the pass/fail boundary, the receive clock phase is left without change. As discussed in regard to the transmit clock phase, in an alternative embodiment, the receive clock phase may be incremented or decremented in each update (i.e., no hold state). After periodic timing calibration is completed for the even-numbered-link receive clocks, the memory controller issues a command to the memory device to reverse the data loopback connection (to enable data transmitted by the even-numbered signaling links to be looped back via the odd-numbered signaling links) and thus enable the same periodic timing calibration sequence to be carried out for the odd-numbered-link receive clocks.

Still referring to FIGS. 9A and 9B, in an alternative embodiment, instead of using a loopback arrangement for transmit timing calibration, memory write and read back operations (including operations directed to predetermined registers rather than the core storage array) may be carried out to effect periodic calibration (adjustment) of the transmit clock phase. Similarly, memory read operations and/or memory-to-controller pattern transmission (i.e., as described in reference to FIG. 6A) may be used to periodically calibrate (adjust) the receive clock phase. In such embodiments, loopback circuitry may be partly or wholly omitted and all links may potentially be calibrated simultaneously rather than sequentially calibrating the even- and odd-numbered links of the various link pairs. In either case, the same phase, bit and packet alignment values to enable link-by-link drift compensation may be maintained within the controller-side calibration circuitry as described above.

Figure 10A:
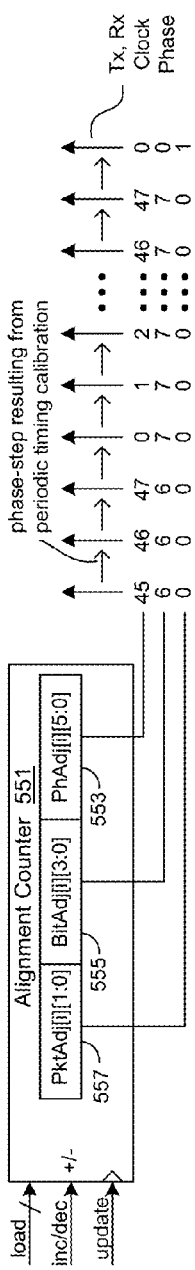
FIG. 10A depicts an embodiment of an alignment counter that corresponds to the six-bit phase adjustment circuitry described in reference to FIGS. 3A and 3C.

In one embodiment, the bit adjustment values maintained by the controller-side calibration circuitry are maintained within an up/down alignment counter to enable overflow (or underflow) in the phase adjustment value to carry (or borrow) to the bit adjustment value and, likewise, to enable overflow/underflow in the bit adjustment value to carry to/borrow from the packet adjustment value. This arrangement is shown in FIG. 10A in an alignment-counter embodiment (551) that corresponds to the six-bit phase adjustment circuitry described in reference to FIGS. 3A and 3C. That is, only 48 of the 64 possible phase adjust values are used (i.e., the upper three phase adjust bits are used to select one of six possible pairs clock phases thus leaving two phase-selection values unused and therefore sixteen total phase-adjust values unused) so that circuitry to effect modulo 48 counting (i.e., increment from 47 to 0 and decrement from 0 to 47) for the phase-adjust field 553 is provided within the phase counter. Accordingly, when a phase adjust value of 47 is incremented, the resulting rollover produces a carry to the bit adjust field 555, in effect advancing the phase of the clock from the most latent edge within a given bit time, to the least latent (most advanced) edge within the more latent bit time. Similarly, upon advancing the phase to the point that the phase adjust field has reached a maximum count (47) and the bit adjust field has also reached a maximum count (7), a subsequent increment in the clock edge crosses a packet boundary, so that the phase adjust value and bit adjust value are effectively reset to zero and the packet adjust field 557 incremented, thereby selecting the most advanced clock phase in the first bit time within the more latent packet interval. Similar underflow occurs, borrowing from (decrementing) the bit adjust value in response to an underflowing phase adjust value (decrement from 0 to 47), and borrowing from the packet adjust value in response to an underflowing bit adjust value.

Still referring to FIG. 10A, the alignment counter 551 includes inputs to receive an increment/decrement signal ("inc/dec"), load signal ("load") and an update signal ("update"), as well as a parallel port to enable an alignment count value (i.e., a 12-bit count value in the embodiment shown) to be loaded into the counter. In one embodiment, the increment/decrement signal is applied, during periodic timing calibration and in response to an triggering edge of the update signal, to increment or decrement the alignment count (the counter content). The load signal is asserted during initial calibration to enable an alignment value determined during initial calibration (e.g., a median or other statistical center point between eye edges determined by a processor or other circuitry within the memory controller core) to be loaded into the alignment counter.

Figure 10C:
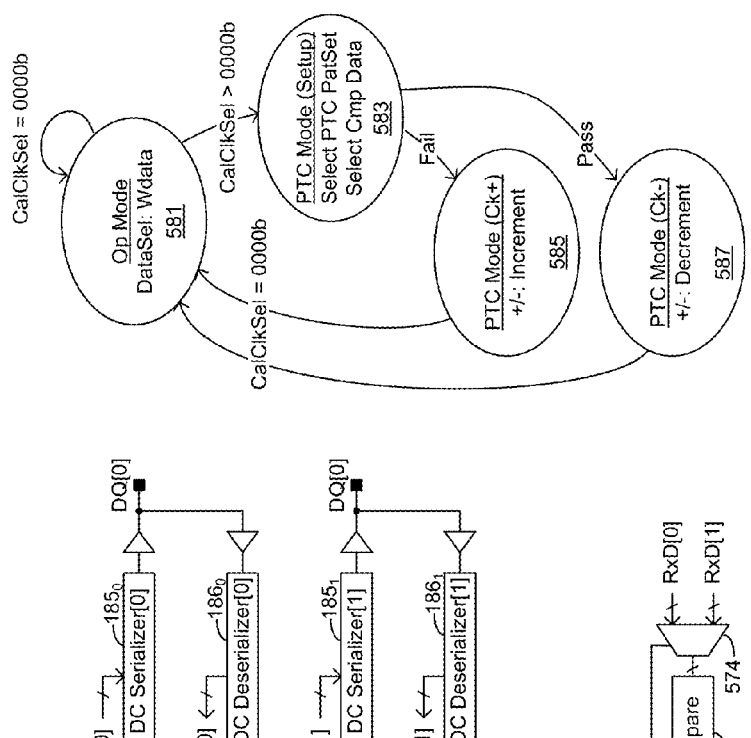
FIGS. 10B and 10C illustrate an embodiment of periodic timing calibration circuitry and a corresponding state diagram.
Figure 10B:
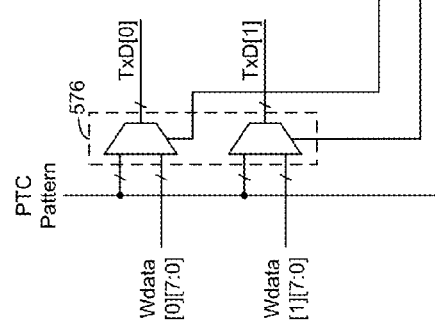

FIG. 10B illustrates a circuit arrangement that may be employed during periodic timing calibration to update alignment counters for each of the transmit and receive clock phases for an odd/even signaling link pair; DQ[0] and DQ[0] in this example. As shown, two alignment counters are provided for each of the four clock phases; four alignment counters per link and therefore eight alignment counters for the link pair ($551_{Tx0}$, $551_{Tb0}$, $551_{Rx0}$, $5515_{Rb0}$, $551_{Tx1}$, $551_{Tb1}$, $551_{Rx1}$, $551_{Rb1}$). Referring to link DQ[0], for example (link DQ[0] is identically implemented), a transmit-clock alignment counter $551_{Tx0}$ is provided to control the transmit clock phase (including bit and packet alignment), while a transmit-boundary alignment counter $551_{Tb0}$ is provided to control (and record) the corresponding PTC boundary phase (i.e., a transmit clock phase determined to sit at the pass/fail boundary when a spectrally-limited PTC test pattern is applied). Similarly, a receive-clock alignment counter $551_{Rx0}$ is provided to control the receive clock phase, and a receive-boundary alignment counter $551_{Rb0}$ is provided to control (and record) the corresponding PTC boundary phase (i.e., a receive clock phase determined to sit at the pass/fail boundary when the PTC test pattern is applied).

In the embodiment shown, each of the alignment counters (collectively, 551) is initialized during the above-described initial calibration sequence. In one implementation, for example, the alignment counters for the clock phases are iteratively parallel-loaded by controller-core circuitry until a final calibrated clock phase is determined for each link. Thereafter, the alignment counters for the PTC boundary phases may similarly be iteratively parallel-loaded by controller-core circuitry until a final boundary phase corresponding to a pass-fail boundary (determined in response to spectrally-limited PTC test pattern) is determined for each link.

Continuing with FIG. 10B, a multiplexer is provided in connection with each clock-phase/boundary-phase pair of alignment counters (as shown at 575) to select the alignment count from either the clock-phase alignment counter or the boundary-phase alignment counter to be provided to the corresponding drift-compensating serializer $185_0/185_1$ or drift-compensating deserializer $186_0/186_1$. The calibration-clock select signal (CalClkSel) described above is provided to control the alignment-count selection. In the particular example shown, the calibration-clock select signal is a 4-bit signal, with each bit being supplied to a respective one of the multiplexers 575 for the four pairs of alignment counters, thereby enabling selection of either the boundary-phase (for PTC) or the clock-phase (for live data transmission/reception) for the deserializer and serializer of both data links. As shown, a state machine 571 (which may be the same, or at least a part of the finite state machines described above in connection with periodic and/or initial timing calibration) also receives the calibration-clock select signal, as well as the output of a compare circuit 573 (e.g., part of the match circuits described above). Referring to FIG. 10C (an exemplary state diagram for state machine 571) and FIG. 10B, so long as all the calibration-clock select bits remain deasserted, the state machine remains in an operational mode 581 and outputs a pair of data select signals to multiplexers 576 (e.g., corresponding generally to data selection multiplexers described above in reference to the initial and periodic timing calibration operations) to select core data lanes, Tdata[0] [7:0] and Tdata[1][7:0], to source the transmit data TxD[0] and TxD[1] delivered to the DQ[0] and DQ[0] serializers ($185_0$, $185_1$), respectively. If any one of the calibration-clock select bits is asserted (i.e., CalClkSel>0000b), the state machine transitions to a periodic timing calibration (PTC) mode 583 in which the PTC test pattern is selected (via multiplexers 576) as the source of transmit data delivered to the link serializers $185_0/185_1$ and also issuing a control signal to multiplexer 574 to select the output of deserializer $186_0$ or deserializer $186_1$ for evaluation, according to the link under calibration. That is, if either of the two CalClkSel bits corresponding to link DQ[0] is asserted, the state machine selects data from the DQ[0] deserializer (i.e., RxD[1]) to be supplied to the compare circuit 573. Otherwise, data from the DQ[0] deserializer (RxD[[0]) is supplied to the compare circuit. After the PTC test pattern has been transmitted by the link serializer, received by the link deserializer and compared with the expected value within the compare circuit, the state machine transitions to either a clock-phase increment state 585 or a clock-phase decrement state 587 according to whether the comparison result indicates a pass or fail condition, respectively (although the correspondence between increment/decrement and pass/fail may be inverted as circumstances dictate). In the increment state, the state machine raises the increment/decrement output, "inc/dec," to indicate an increment operation and asserts the update signal (shown in FIG. 10A, but omitted from 10B to avoid obscuring the circuit elements shown) to enable the corresponding boundary-phase and clock-phase clock counters to be incremented. Similarly, in the decrement state, the state machine lowers the increment/decrement output to specify a decrement operation and asserts the update signal to enable the CalClkSel-selected pair of alignment counters to be decremented. By this operation, the clock phases and corresponding PTC boundary phases loaded into the alignment counters at initial calibration are incremented and decremented together, using the timing drift information indicated by movement of the PTC boundary phase to adjust the sampling and transmit clocks for each of the signaling links.

Clock-Stopped Low Power Mode

FIG. 11A illustrates an exemplary clocking arrangement used within the embodiment of FIG. 2A, explicitly showing the clock stop logic 601 and clock buffer 603 for the controller I/O clock (PCK8) and the clock stop logic 605 and clock buffer 607 for the data-rate system clock (PCK4) forwarded to the memory device. Referring to detail view 610 of the PCK4 clock-stop logic 605, a clock-enable signal (ENPCK4) is asserted and deasserted (logic high and low, respectively, in this example) by power-mode logic within the controller core to enable and disable (or start and stop) the PCK4 clock. In one embodiment, the power-mode logic is clocked by the controller core clock, PCK1, so that, when asserted or deasserted, the clock-enable signal remains asserted or deasserted for an integer number of PCK1 cycles. This arrangement ensures that, as the clock-enable signal is lowered to establish a clock-stopped low power mode and then later raised to restart the clock, the phase relationship between the controller core clock (PCK1) and memory core clock (MCK1) is maintained, thereby preserving the bit alignment and packet alignment established during initial calibration even through clock stop and restart. Note that in this particular example, the controller core and memory core are clocked at the same rate. In alternative embodiments, the controller core and memory core may be clocked at different rates (and thus drive serialization and deserialization pipelines of different depth). In that case, the clock stop interval may be limited to an integer number of the core clock signal having the longest period. For example, if the controller core clock rate is increased to 800 MHz, but the memory core clock rate remains at 400 MHz, the clock stop interval may be constrained to be an integer number of memory core clock cycles (2.5 nS in this example), thus ensuring that the phase between the controller core clock and memory core clock is maintained.

FIG. 11B is an exemplary timing diagram of the clock-stop (or clock pause) operation of the FIG. 11A clocking architecture. The waveforms depicted include the memory controller and memory device core clocks, PCK1 and MCK1, as well as the system clock, PCK4, and a version of the system clock that exists internally to the clock generation circuit PCK4i. Also depicted are the clock-enable signal, ENPCK4 and a re-timed version of the clock-enable signal, ENPCK4r.

In essence, the clock-enable signal is used to gate the internal PCK4i clock and thus to either enable or disable toggling of the PCK4 system clock. Because the controller core clock domain and the system clock domain are permitted to have an arbitrary phase offset relative to one another (and the clock-enable signal may have an arbitrary phase offset relative to an edge of PCK1), the clock-enable signal may rise or fall during any state of the PCK4i clock and thus, if applied directly to gate the system clock, may gate the clock off or on during a logic-high state of the PCK4i clock and thereby yield undesirable runt (i.e., shortened) pulses on the system clock line. This consequence (runt pulse generation) is avoided within the clock-stop logic of FIG. 11A by including re-timing logic 611 (shown in detail view 610) that re-times the core-domain clock-enable signal (ENPCK4) into the PCK4i clock domain while maintaining a fixed phase offset between rising and falling edges of the re-timed clock-enable signal (ENPCK4r) and the controller core clock. More specifically, in the embodiment shown, the system clock is gated on or off only during the logic-low phase of the PCK4i clock so that no runt pulses are generated, and yet the time interval between deassertion and assertion of the re-timed clock-enable signal is maintained as an integer-number of core clock cycles, thereby preserving the calibration-compensated phase relationship between the memory core clock and controller core clock.

Continuing with FIGS. 11A and 11B, the re-timed clock-enable signal is ANDed with PCK4i in gate 613, and thus, when deasserted, blocks a number of pulses that correspond to an integer number of cycles of the controller core clock (PCK1) from appearing in the PCK4 waveform. By this operation, PCK4 is gated-off (suppressed; prevented from toggling) and therefore stops cleanly and remains stopped for an interval that corresponds to an integer number of PCK1 cycles (one cycle in this example). Because PCK4 is received within the memory device and propagated through an open-loop clock driving circuit (e.g., formed by buffers 223 and 229) to yield (without frequency change) the data-rate clock signal, MCK4, and ultimately the memory-side transmit and receive clocks, the clean stoppage (or pausing) of PCK4 yields a correspondingly clean stoppage of those clocks as well, thereby cleanly suspending operation of the memory-side serializers and deserializers. Operation of the counterpart controller-side deserializers and serializers is also cleanly suspended by stoppage of the controller-side I/O clock within clock-stop logic 601.

In one embodiment, memory-side divider circuit 225 is implemented by a 4-state, modulo-4 counter (e.g., including increment logic 616 and state register 621 as shown at 614) in which the most significant bit toggles after every two cycles of the MCK4 clock and thus is output as the memory-side core clock, MCK1. Noting that the modulo-4 counter may generally power up in any of the four states shown at the counter output (with MSB outlined), the phase-relationship between MCK1 and the controller core clock, PCK1, may thus take on an arbitrary one of four initial phase offsets that are phase-spaced by a cycle of the MCK4 signal and thus two bit times. In the embodiment of FIGS. 2A (and 11A), this initial phase relationship between PCK1 and MCK4, whatever it may be, is accounted for in the initial calibration of the bit adjustment and packet adjustment values within the drift-compensating serializers and deserializers. Because PCK1 continues to toggle during stoppage of the PCK4/MCK4 signal, any stoppage of PCK4/MCK4 that does not suppress a number of PCK4 pulses equal to the PCK4-to-PCK1 clock ratio (4 in this example) will change the phase relationship between PCK1 and MCK1 upon clock re-start, and thus result in loss of bit and packet synchronization relative to the controller-core clock domain. On the other hand, by cleanly stopping PCK4 for an integer number of PCK1 cycles, the number of suppressed PCK4 (and thus MCK4) pulses is ensured to equal the PCK4 to PCK1 clock ratio and thus will maintain the PCK1-to-MCK1 phase relationship to which the initial calibration settings are aligned and thus enable properly framed and packet-aligned data to be transferred to the controller core domain without error on clock restart. This result is illustrated in FIG. 11B by the state of the modulo-2 counter (00, 01, 10, 11, 00, . . . ) in conjunction with edges of MCK4 and showing that suppression of N*(PCK4-to-PCK1 ratio) of PCK4 clock pulses during the clock-stop interval preserves the PCK1 to MCK1 phase relationship upon clock re-start denoting multiplication).

Figure 11C:
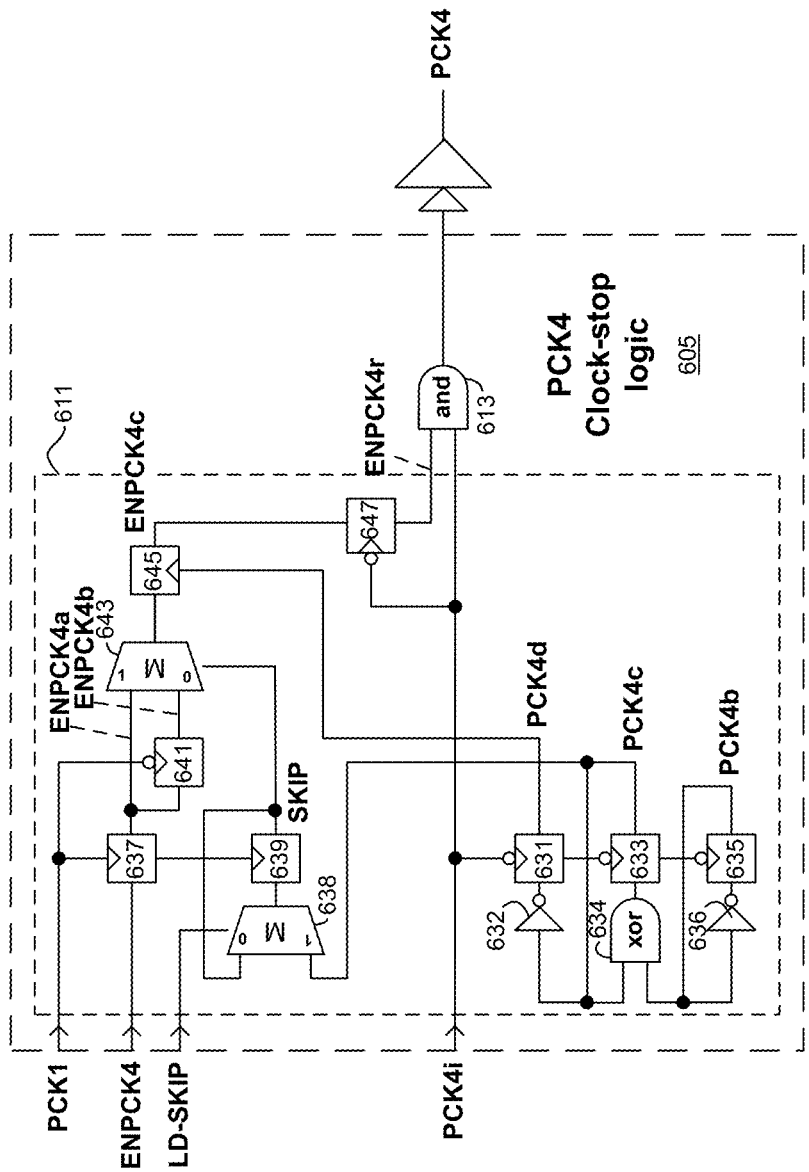
FIGS. 11C and 11D illustrate a more detailed embodiment of a clock-stop logic circuit and corresponding timing diagram.
Figure 11D:
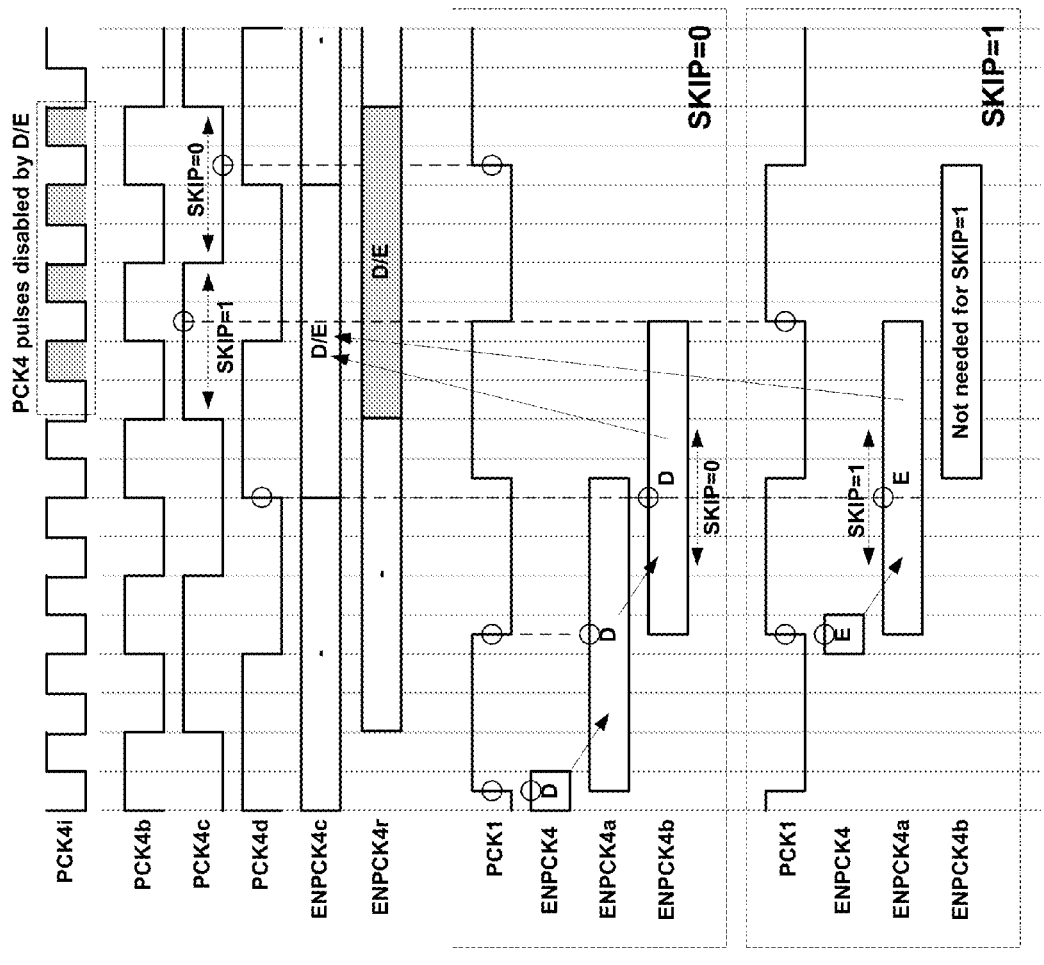

FIGS. 11C and 11D illustrate a more detailed embodiment of the system-clock clock-stop logic 605 and corresponding timing diagram. The clock-stop logic includes a logic AND gate 613 that corresponds to gate 613 of FIG. 11A, as well as re-timing logic formed by flip-flops 631, 633, 635, 637, 639, 641, 645 and 647, logic elements 632, 634 and 636, and multiplexers 638 and 643. As discussed, the re-timing circuitry serves to re-time the clock-enable signal from the controller core, ENPCK4, into the domain of system clock PCK4. An initial step in this operation is to sample the clock-enable signal with the core clock signal and thus align any transition within ENPCK4 with a transition of the core clock signal and ensure that a signal representative of the clock-enable signal enable signal (i.e., the clock-enable sample) is held steady for at least one core-clock cycle. Further, a one-time load-skip operation is performed at system initialization (in response to a load-skip signal (LD-SKIP)) to determine the phase of the PCK1 signal with respect to a same-frequency clock signal generated in the PCK4 domain and referred to as PCK4c. More specifically, when load-skip is raised, multiplexer 638 passes the PCK4c to the input of flop stage 639, thereby enabling PCK4c to be sampled by the ensuing rising edge of PCK1. The output of flop stage 639, referred to herein as the skip signal, is latched by the deassertion of load-skip, and will be logic '1' or '0' depending on whether PCK4c was high or low, respectively, at the PCK1 rising edge. Because the phase relationship between PCK4c and PCK1 remains unchanged during system operation, load-skip need only be asserted once, at power up (or system reset) to resolve the state of the skip signal.

Continuing, the clock enable signal ENPCK4 is sampled by flop stage 637 in response to a rising edge of PCK1 to generate a rising-PCK1-edge-aligned clock-enable signal, ENPCK4a, that is ensured to remain in the same state for an integer number of PCK1 cycles. ENPCK4a is itself sampled in flop 641 in response to the succeeding falling PCK1 edge to generate negative-PCK1-edge aligned clock-enable signal, ENPCK4b, also ensured to remain in the same state for an integer number of PCK1 cycles. As shown in FIG. 11D, the two PCK1-aligned clock-enable signals, ENPCK4a and ENPCK4b, represent instances of a PCK1-aligned clock-enable signal that are valid over the same time interval but in alternative circumstances; in one case when the skip signal is high (ENPCK4a) and in the other case when the skip signal is low (ENPCK4b). Accordingly, by selecting between the two PCK1-aligned clock-enable signals in multiplexer 643 according to the state of the skip signal, a PCK1-aligned clock-enable signal having the same start and stop time is selected and output to re-timing flop stage 645 in either case. Further, the selected PCK1-aligned clock-enable signal is ensured to span a rising edge of a quadrature clock signal PCK4d (i.e., a clock signal having the same frequency as PCK1 and PCK4c, but a quadrature phase relationship with respect to PCK4c) supplied to the trigger input of the re-timing flop stage 645. Finally, because each edge of PCK4d is generated in response to a negative going edge of data-rate clock PCK4i (by virtue of flop 631), the rising edge of PCK4d used to trigger the re-timing flop stage 645 and thus sample the PCK1-aligned clock-enable signal occurs immediately after PCK4i goes low. By this design, a full (or nearly a full) PCK4i clock cycle of setup and hold time is provided before the re-timed clock-enable signal, ENPCK4c, is sampled in another re-timing flop stage 647 by the next falling edge of PCK4i to produce the final re-timed clock-enable signal, ENPCK4r, used to gate PCK4 on and off. As shown in FIG. 11D, the net result is that the final re-timed clock-enable signal, ENPCK4r, changes state only in response to a low-going edge of PCK4i and only after an integer number of PCK1 clock cycles have transpired since the last state change. By this operation, problematic runt pulses on the PCK4 output are avoided and the clock phase relationship between PCK1 and PCK4 is maintained through clock stop and re-start, thereby preserving the calibrated state of the drift-compensating serializer and deserializer circuitry within the memory controller.

The techniques and circuitry shown in FIGS. 11C and 11D may also be applied within the clock-stop logic for the controller-side I/O clock, PCK8, thereby avoiding runt pulses on the PCK8 clock line and ensuring that the number of PCK8 pulses that are disabled (or suppressed) during clock stop matches, accounting for the 2:1 clock ratio, the number of disabled PCK4 pulses.

Figure 11E:
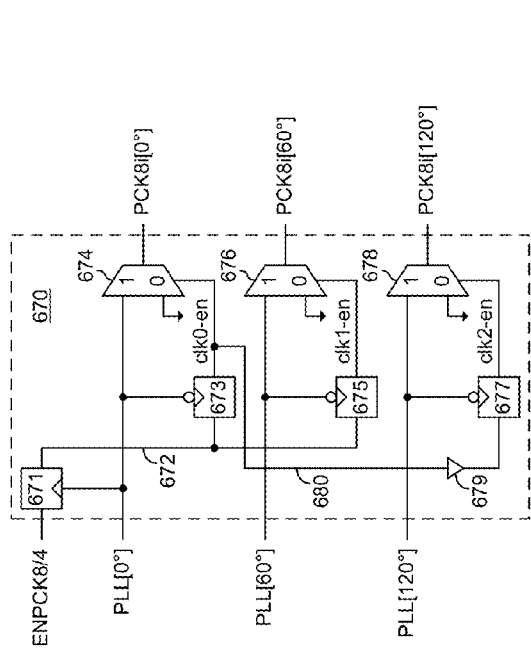
FIGS. 11E-11G illustrate an alternative clock-stop architecture and corresponding circuit and timing diagrams.
Figure 11F:
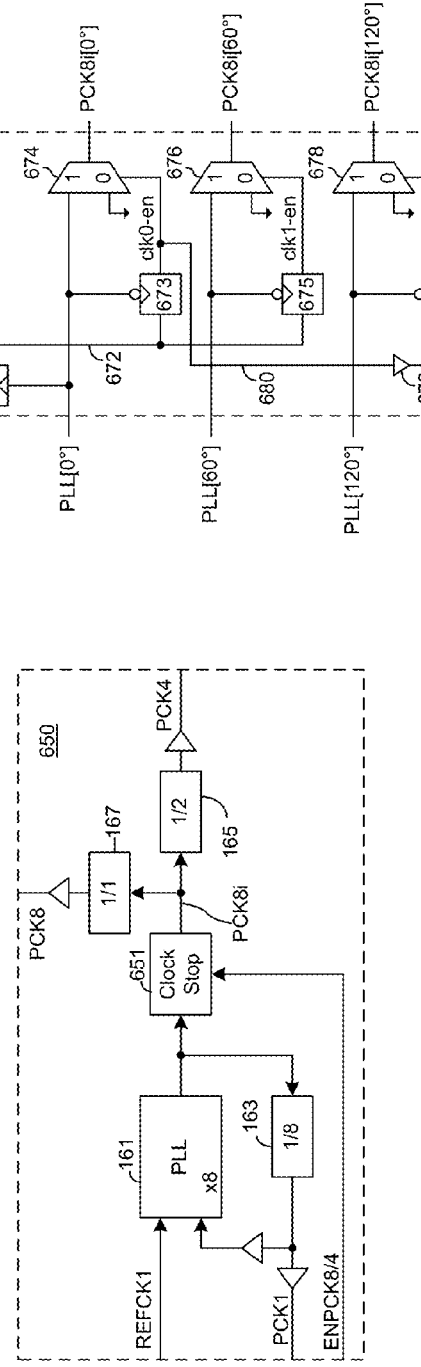
Figure 11G:
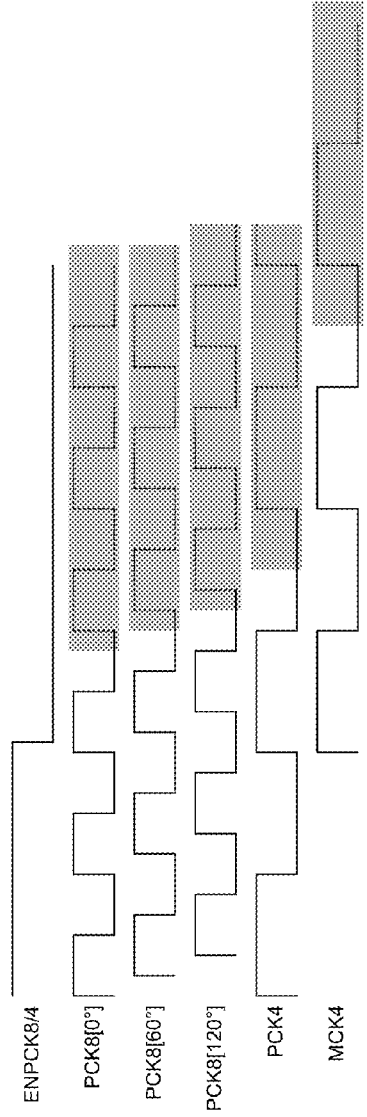

FIGS. 11E-11G illustrate an alternative clock-stop architecture 650 and corresponding circuit and timing diagrams. In contrast to the separate PCK4 and PCK8 clock-stop circuits in the architecture of FIG. 11A, the clock-stop architecture 650 includes a single clock-stop logic circuit 651 that disables toggling of the internal PCK8 clock phases (PCK8i) that yield the final PCK8 clock phases and, after frequency division, the system clock signal PCK4. Except for the absence of clock-stop circuits 601 and 605, and the provision of a solitary clock-enable signal (ENPCK8/4) instead of multiple clock-enable signals, the functional elements of architecture 650 operate generally as described in reference to their like-numbered counterparts in FIG. 11A. Also, as in the embodiment of FIG. 11A, the controller core clock, PCK1, may continue to toggle after the PCK8i clock phases (and therefore the PCK8 and PCK4 clocks) have been stopped.

FIG. 11F illustrates an embodiment of a clock-stop circuit 670 that may be used to implement the clock-stop circuit 651 of FIG. 11E. As shown, a clock-enable signal (ENPCK8/4) from the controller core domain is sampled in response to the baseline PLL output phase, PLL[0°] (a clock phase having an 8× frequency relative to the core clock) in flip-flop 671, thereby re-timing the clock-enable signal into the PLL-output clock domain as re-timed enable signal 672. Other re-timing circuits may be used to re-time the clock-enable signal in alternative embodiments, including a staged re-timing circuit that transfers the clock-enable signal through a sequence of timing domains before finally retiming into the PLL output clock domain. The re-timed enable signal 672 is sampled in response to a falling edge of PLL[0°] to lower a clock0-enable signal (clk0-en) at the start of the logic-low half-cycle of the PLL[0°] clock signal. A multiplexer 674 (or other selector circuit) responds to the lowered clock0-enable signal by decoupling the corresponding PCK8i output (PCK8i[0°]) from PLL[0°] and coupling the PCK8i output to ground to hold the output low and effect a clock stop. The re-timed clock-enable signal 672 is similarly sampled by the falling edge of PLL[60°] to lower clock1-enable signal (clk1-en) at the start of the logic-low half cycle of the PLL[60°] clock signal. Multiplexer 676 responds to the lowered clock1-enable signal by decoupling the PCK8[60°] output from PLL [60°] and coupling the output to ground. Finally, a more delayed instance of the re-timed clock-enable signal 680 (generated, for example, by a buffer-delayed instance of the clock0-enable signal) is sampled in response to the falling edge of PLL[120°] to lower clock2-enable signal (clk2-en) at the start of the logic-low half-cycle of the PLL[120°] clock signal. Multiplexer 678 responds to the lowered clock2-enable signal by decoupling the PCK8i[120] output from PLL [120°] and coupling the output to ground. As shown by the shaded clock-stop region of FIG. 11G (showing suppressed clock pulses in dashed outline), the clean stoppage of the PCK8i clock phases in response to the lowered clock-enable signal yields correspondingly clean stoppage of the PCK8[0°, 60°, 120°] clock phases, the PCK4 clock phase and thus the memory-side clocks, MCK4 (and MCK1, not shown). Clean re-start of all stopped (or paused or disabled) clocks is similarly achieved by raising the clock-enable signal (ENPCK8/4). That is, the rising edge of the clock-enable signal (further re-timed as necessary to meet setup and hold time requirements for each PLL output phase) is sampled in response to the low-going edge of the PLL clock phase to be re-enabled, switching the multiplexer selection at the start of the logic-low interval for each PLL clock phase to enable glitchless re-coupling of the PLL clock phase to the corresponding PCK8i clock node. Although not specifically shown in FIGS. 11F and 11G, complementary instances of the 0°, 60° and 120° PLL clocks (180°, 240° and 300°) may similarly be disabled and enabled according to the state of the clock0-enable, clock1-enable and clock2-enable signals, respectively. Also, as in the various embodiments described above, more or fewer PLL output phases may be generated in alternative embodiments.

Entering and Exiting Clock-Stop Mode—System Operation

In one embodiment, clock-stop low power mode is entered whenever the memory controller has completed all requested memory transactions and thus run out of work. In one embodiment, this idle state is determined by power mode logic within the memory controller core which monitors a queue of pending transactions ("transaction queue") and is thus informed when the transaction queue is emptied. Rather than stop the controller I/O and system clocks immediately upon emptying the queue, the power mode logic waits at least long enough for the last transaction pulled from the queue (i.e., the final transaction) to be completed, at least from the stand point of the memory device and the controller I/O circuitry, and then deasserts the clock enable signals, ENPCK4 and ENPCK8, to cleanly stop the controller I/O and system clock signals (PCK8 and PCK4, respectively).

Figure 12A:
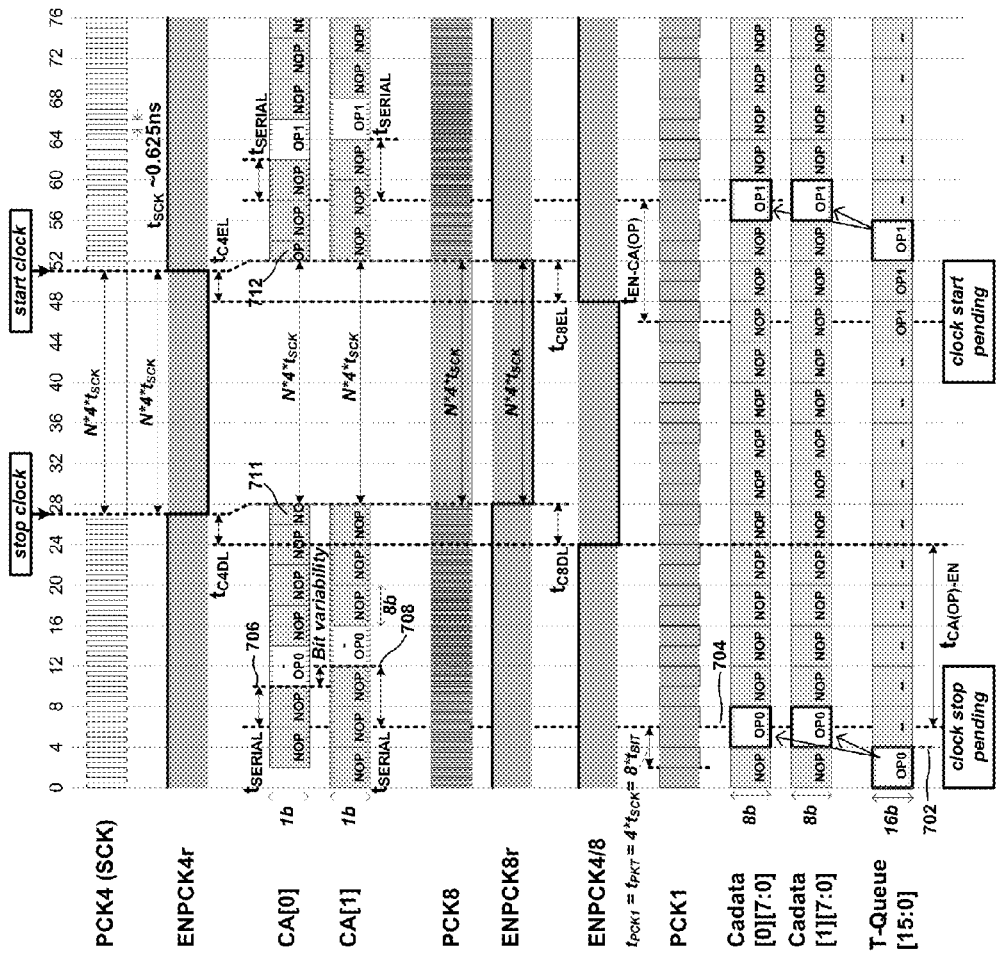
FIG. 12A is an exemplary timing diagram of clock signals, clock-enable signals and command/address signals at the memory controller during an interval that includes entry and exit from a clock-stopped low power mode.

FIG. 12A is an exemplary timing diagram of clock signals, clock-enable signals and command/address signals at the memory controller during an interval that includes entry and exit from a clock-stopped low power mode. The clock signals include the controller core clock PCK1, the system clock signal, SCK (PCK4 within the memory controller), and the controller I/O clock PCK8. Continuing the exemplary embodiments described above, data and commands are transmitted at 3.2 Gb/s; two bits per 0.625 nS system clock cycle and eight bits per 2.5 nS (nanosecond) core clock cycle. By this arrangement, an 8:1 serialization pipeline is established, with outgoing information presented to each drift-compensating serializer as an 8-bit packet (i.e., byte) during a given cycle of the core clock signal, while the bits of a previously presented packet are serially transmitted in respective bit-times (bit-time or $t_{BIT}=t_{PCK8}$ (PCK8 period)) during that same core clock cycle. Thus, as shown in FIG. 12A, $t_{PCK1}=t_{PKT}=4*t_{SCK}=8*t_{BIT}$, where '*' denotes multiplication. Different transmission frequencies, clock ratios, serialization ratios and packet sizes may be selected in alternative embodiments.

Within the memory controller, packets of data and command/address (CA) bits are supplied to the I/O circuitry via 8-bit wide data lanes and CA lanes, respectively. In one embodiment, each memory access command and corresponding address are packed into two eight-bit packets that may thus transmitted over the two CA links (CA[0] and CA[1]) in a single packet-time. When no packets remain to be sent, "no-operation" commands, depicted as "NOP" command packets (e.g., zero-filled packets) are transmitted to the memory device via the command path (CA[0], CA[1]), and the controller core begins a countdown to completion of the last memory access command transmitted on the command path (the "final command"). During the countdown, clock-stop mode is said to be pending, and the power-mode logic within the controller core is in pre-clock-stop state in which all clocks continue to toggle to provide timing edges necessary for write data to be stored within the memory core in the case of a final write operation, or for read data to be returned from the memory core, deserialized and presented at the controller I/O-to-core interface in the case of a final memory read command. If no new transaction is queued within the transaction queue by the time the all operations associated with the final command are completed within the memory device and controller I/O circuitry, the power-mode logic deasserts the clock-enable signals, ENPCK4 and ENPCK8 for the system clock and controller I/O clocks, PCK4 (SCK) and PCK8, respectively.

Within FIG. 12A, entry into clock-stop mode begins with transfer (removal or dequeuing) of the final remaining memory access request from a 16-bit wide transaction queue (T-Queue[15:0]) to the controller I/O circuitry via 8-bit wide command lanes Cadata[0][7:0] and Cadata[1][7:0]. The command data lanes themselves may be implemented within the packet-alignment circuit (i.e., packet alignment FIFO or skip circuit) that enables crossing from the core clock domain to the framing clock domain for a given signaling link. Thus, each successive command, whether a NOP or memory-access command (OP), may be forwarded within the packet-alignment circuit in response to a falling edge of the core clock (PCK1), transferred into the framing clock domain a calibrated (and link-specific) number of bit-times later and then serialized for transmission via the CA[0] and CA[1] links. Thus, a final operation, designated "OP0," is transferred from the transaction queue to the command lanes at time 702, forwarded across the packet-alignment circuit starting at time 704 (in response to a falling PCK1 edge) and then transferred from the packet-alignment circuit to a serial shift register within the controller-side deserialization circuitry (e.g., formed by the flop-stages 315 shown FIG. 3D) after a serialization delay, $t_{SERIAL}$, that corresponds to a PCK1 cycle plus the bit-wise offset between the de-framing clock signal (TCK1[i] in FIG. 3D) and PCK1. Thereafter, data is shifted out of the serial shift register bit by bit to effect serial data transmission over the CA[0]/CA[1] signaling link.

The bit-variability between the different signaling links is emphasized in FIG. 12A by the 4-bit-time difference between the serialization delays for the CA[0] and CA[1] signaling links. That is, the bit-wise offset between the core clock and the de-framing clock for link CA[0] (i.e., between PCK1 and TCK1[i]) is zero, so that the low-order packet of OP0 is transferred to the serial shift register for the CA[0] link one PCK1 cycle ($t_{SERIAL}$=8 bit-times) after being transferred from the transaction queue to the CA[0] packet-alignment circuit, and thus transmitted bit serially over the CA[0] signaling link starting at time 706. Thus, the serialization delay, $t_{SERIAL}$, is one PCK1 cycle or 8 bit-times. By contrast, a four-bit offset exists between the core clock and de-framing clock for link CA[1] (i.e., between PCK1 and TCK1[i+1]) so that, following transfer of the high-order packet of OP0 from the transaction queue to the CA[1] packet-alignment circuit, a 12-bit-time serialization delay elapses (or transpires) before the packet is transmitted over the CA[1] signaling link (starting at time 708). Overall, the difference between the 8-bit-time and 12-bit-time serialization delays yields a 4-bit-time offset (or bit-variability) between controller-side transmission of the low- and high-order packets of OP0, not counting any sub-bit-time phase offset that may exist between the transmit clocks for the CA[0] and CA[1] links (i.e., phase offset between TCK8[i] and TCK8[i+1]). Overall, the bit-variability and sub-bit phase offset result in time-staggered transmission of associated command/address packets and data packets to enable memory-side data sampling, deserialization and I/O-to-core transfer all without memory-side clock adjustment circuitry. Though not shown in FIG. 12A, a similar bit-variability and sub-bit phase offset is tolerated within controller-side data deserializers to enable memory-side core-to-I/O transfer, serialization and data transmission without memory-side clock adjustment circuitry.

Continuing with the clock-stop example in FIG. 12A, upon transferring the final memory access operation (i.e., OP0) from the transaction queue to the command lanes for links CA[0] and CA[1], the power-mode logic determines that the transaction queue is empty and thus begins a countdown to deassertion of the clock-enable signals for the system clock and controller I/O clock. In one embodiment, the countdown time is operation specific and thus specified as $t_{CA(OP)-EN}$, with "OP" indicating the nature of the memory access request (e.g., row operation such as activate or precharge, or column operation such as memory read or memory write, though operation times particular to other non-DRAM types of memory storage may apply, such as program and erase times). Alternatively, a fixed countdown time may be applied, irrespective of the type of operation being performed. In either case, the goal is to ensure that sufficient clocking edges are provided to the memory device and the controller I/O circuitry to complete the last memory access operation. In general, the worst-case latency between emptying the transaction queue occurs in a memory read operation, which includes the command serialization time (including worst-case bit variability), propagation over the command path, the data retrieval and serialization latency of the memory device (referred to collectively herein as the CAS latency), the read data propagation time on the data path, and finally the controller-side data deserialization time. In an operation-specific embodiment, the power-mode logic may index a register bank (or lookup table) based on the final operation and thereby retrieve a countdown value (e.g., number of core clock cycles to transpire before deasserting the clock-enable signals). In a fixed-count embodiment, the countdown value may be programmed at system start-up based run-time or production-time or design-time measurement of the worst-case time to complete a memory read operation, or by programming a one-time register at system production time, or even implementing a hard-wired, worst-case count value.

However implemented, if a new memory access request is inserted into the transaction queue (or otherwise received) during the countdown to clock stop (i.e., while the power mode logic is in a clock-stop-pending mode), the pending clock-stop is aborted and the power mode logic returns to active mode, continuing to monitor the transaction queue for empty state. But if no new memory access request is queued within the transaction queue prior to countdown completion, the power mode logic deasserts the clock-enable signals, ENPCK4 and ENPCK8, thus triggering a clock-stop operation.

As described above, ENPCK4 and ENPCK8 are generated within the core clock domain and thus are re-timed within the PCK4 and PCK8 domains to ensure clean stopping (or pausing or disabling) of the PCK4 and PCK8 clocks. Further, in an embodiment in which the PCK4 and PCK8 domains (i.e., the system clock and controller I/O clock domains) are permitted to be phase offset from one another (e.g., as in the embodiment of FIG. 2A), the deassertion times of the re-timed clock-enable signals, ENPCK4r and ENPCK8r, may be different, thereby resulting in different clock stop times for the PCK4 and PCK8 clocks. In the exemplary timing diagram of FIG. 12A, this variation in clock-stop times is shown by the two bit-time (two PCK8 cycles, one PCK4 cycle) offset between the PCK4 clock-stop time and PCK8 clock-stop time. That is, the re-timing delay, $t_{C8DL}$ (or disable latency), in the PCK8 clock-stop logic, is two bit-times longer than the re-timing delay, $t_{C4DL}$, in the PCK4 clock-stop logic. Because both clocks are stopped for an integer number of PCK1 cycles, the same two-bit-time offset applies at clock re-start so that the same number of clock pulses are generated, after accounting for any clock ratio (2:1 in this example), in the PCK8 and PCK4 clock domains.

One significant challenge in stopping the controller I/O clock is demonstrated by the bit-variability permitted within the various controller-side serializer/deserializer circuits. That is, because bit-variability is permitted between the controller-side timing domains for the different signaling links (in effect staggering those domains as necessary to achieve alignment with counterpart uncompensated memory-side timing domains), the packet boundaries for the different links are themselves offset. From a clock-stop perspective, no matter where the controller I/O clock is stopped, one or more CA packets may be only partly serialized, in effect fracturing the packet into parts that appear on either side of the clock-stop interval (e.g., 711 and 712). Because PCK8 is stopped cleanly for an integer number of PCK1 cycles, however, the remaining fraction of the packet (712) is properly serialized upon clock re-start, and a new packet de-framed and transmitted at a packet boundary that reflects the pre-established relationship between the controller-side de-framing clock and core clock, PCK1. That is, the bit-wise (and intra-bit phase) offset between the controller core clock (PCK1) and de-framing clock (e.g., TCK8[i]) is maintained so that the remaining bits of any clock-stop-fractured packet are transmitted and a new packet de-framed as though no clock-stop had occurred. Visually, this may be imagined by slicing the diagram of FIG. 12A along the start-clock boundary and shifting the portion of the diagram that appears after clock re-start left to line up with the clock-stop boundary. As can be seen, packet framing boundaries are maintained so that all clock-stop-fractured packets are made whole upon clock re-start.

Reflecting on the clock-forwarding architecture described thus far, because any number of system clock pulses may be in flight (i.e., propagating on the clock link) to the memory device, the specific system clock edge used to enable reception or transmission of a bit on a given signaling link will generally be offset in time relative to a nominally aligned edge of the controller I/O clock. That is, assuming that a controller I/O clock edge and system clock edge are output simultaneously from the controller-side clock generator, the I/O clock edge will generally be applied to time a data reception event within the controller-side I/O circuitry while the system clock edge is still en-route to the memory device or to the memory device I/O circuitry. From a clock-stop perspective, this means that even if the system clock and controller I/O clock are stopped simultaneously at the memory controller, the memory device will nevertheless experience more clock edges than the controller I/O circuitry (accounting for clock ratio), as the longer system clock pipeline takes longer to drain. And similarly, from a clock-start perspective, if the system clock and controller I/O clock are started simultaneously, the controller I/O circuitry will begin receiving clock pulses before the memory-side I/O circuitry due to the longer memory-side clock pipeline. This presents a substantial challenge for managing fractured packets as any remaining portion of the packet may be transmitted by the controller I/O circuitry may arrive at the memory device, before (or after) system clock edges have arrived to sample the incoming data. More generally, bits of any command or data packet transmitted on clock-restart may be dropped if they arrive at the memory device before clocking edges are available to time their reception. In one embodiment, this complexity is managed by (i) transmission of no-operation (NOP or no-op) commands for an interval leading up to clock-stop and for an interval following clock re-start, and (ii) ensuring that the phase relationship between the controller-side core clock (PCK1) and memory-side core clock (MCK1) is maintained through the clock-stop interval. First, no-op transmission immediately before and after the clock-stop interval insures that no meaningful commands or data is dropped as the forwarded-clock pipeline fills. That is, because no data is transmitted in conjunction with the no-op commands, and no memory access commands are specified, loss of bits initially transmitted upon clock-restart is of no consequence. Second, by maintaining the PCK1 to MCK1 phase relationship, the relationship between the controller-side framing/de-framing clock signals and the memory-side framing/de-framing clock signals established at initial calibration are maintained upon clock-restart. That is, when meaningful (i.e., not no-op) commands (CAs) and data are eventually sent over the command and data paths, the commands and data will be properly framed by the receiving device, enabling system operation to continue without need to re-align counter-part framing/de-framing clocks. Further, because of the open-loop clock distribution architecture within the memory device, the phasing of the memory-side transmit and receive clocks remains substantially unchanged through clock-stop, so that the phase-adjustments in place within the controller-side serializer/de-serializer circuitry prior to clock-stop remain valid after clock re-start, thereby enabling immediate and reliable data and command transmission upon clock re-start.

Continuing with FIG. 12A, after clock stop, the core clock continues to run (i.e., oscillate, toggle) so that the controller core may continue to receive and queue host-requested memory transactions and the power-mode logic may continue to monitor the transaction queue to determine whether and when a new transaction request is pending. Upon detecting that a new transaction request is queued, the power mode logic transitions to a clock-start-pending state and raises (asserts) the clock-enable signals ENPCK4 and ENPCK8 at the succeeding rising PCK1 edge. The clock-stop logic for PCK4 and PCK8 respond to assertion of the core-domain clock-enable signals by raising re-timed clock-enable signals ENPCK4r and ENPCK8r after respective re-timing delays (or enable-latencies), $t_{C4EL}$ and $t_{C8EL}$. In the particular example shown, the deassertion- and re-assertion re-timing delays match (i.e., $t_{C4DL}=t_{C4EL}$ and $t_{C8DL}=t_{C8EL}$). This will be the case, so long as the deassertion time of the ENPCK4 and ENPCK8 signals is an integer number of PCK1 clock cycles, as in this example. In the event that the ENPCK4 or ENPCK8 deassertion time is not a whole number of PCK1 cycles, the clock-stop logic will re-time the corresponding clock-enable signal to enforce the integer PCK1 clock-stop interval, though the clock-stop re-timing delay and clock-start timing delay will not match.

After the re-timing delay transpires, the PCK4 and PCK8 clock-stop circuits raise the re-timed clock-enable signals, ENPCK4r and ENPCK8r, respectively, thus enabling the system clock (SCK, PCK4) and controller core clock to begin toggling. As discussed, the controller core pads the re-start interval with some number of no-op commands to ensure that the system clock pulses have reached the controller I/O circuitry before transmitting a memory command corresponding to the newly queued memory transaction request. Thus, the new transaction request (shown as "OP1") is not transferred to the command lanes until some number of core clock cycles after being queued (in this example, after a two-cycle delay), so that no-op commands are transmitted upon clock-restart. The power-mode logic begins a re-start countdown upon detecting the newly queued transaction request, OP1, enabling OP1 to be dequeued one PCK1 cycle before the countdown ends (thus providing time for padding no-ops), thereby loading OP1 into the command lanes in time for transfer to the serializers at the conclusion of the restart-countdown. Thereafter (after interval $t_{EN-CA(op)}$), the OP1 command is serialized and transmitted via CA[0] and CA[1] links, maintaining the calibrated alignment between the de-framing clock edges and core-clock edges (and thus the link-to-link bit variability) after clock re-start.

Figure 12B:
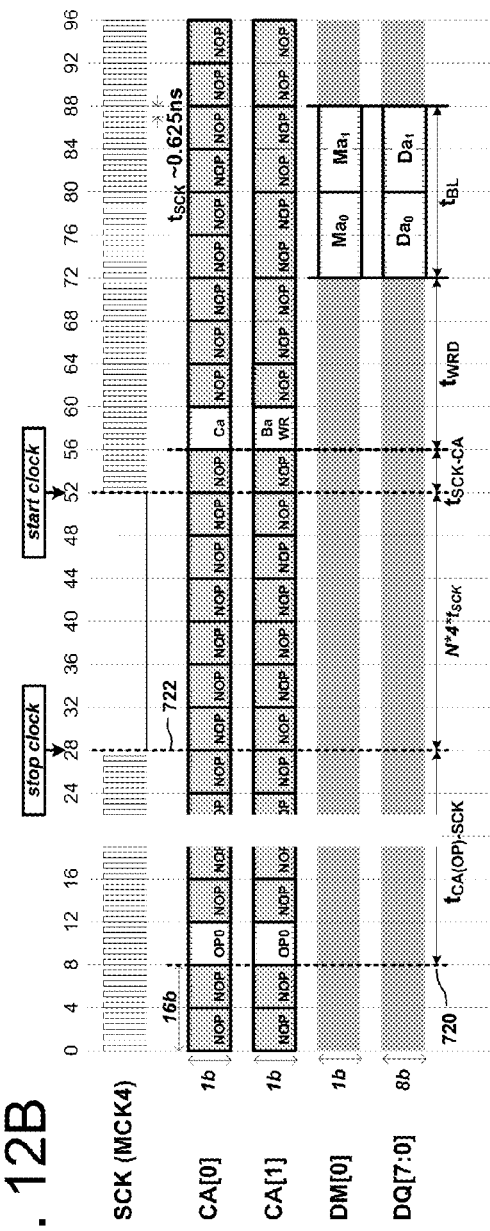
FIGS. 12B and 12C illustrate clock-stop mode entry and exit from the perspective of the memory device.
Figure 12C:
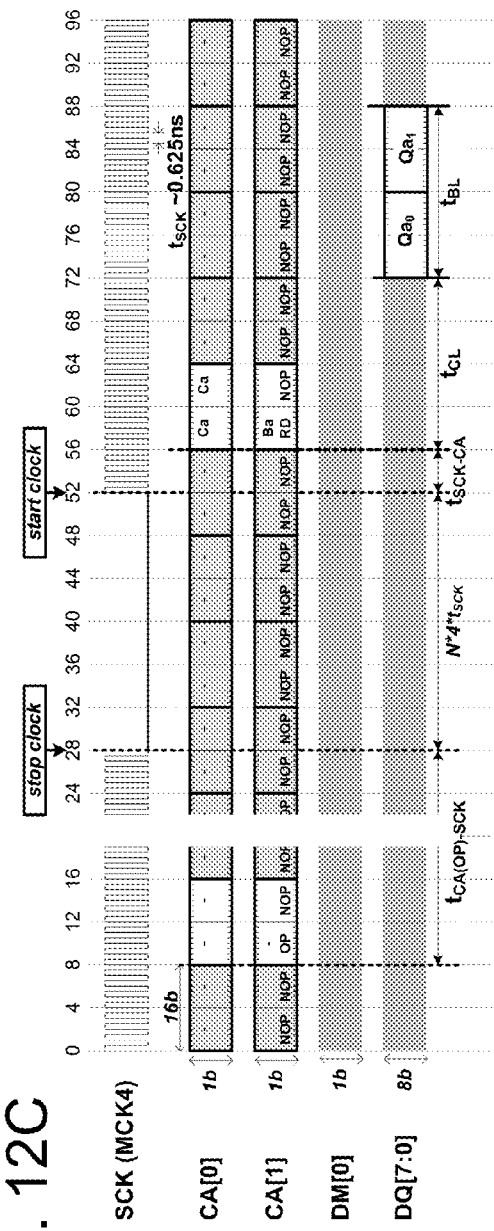

FIGS. 12B and 12C illustrate clock-stop mode entry and exit from the perspective of the memory device. Referring first to FIG. 12B which illustrates a memory write operation following clock re-start, a final operation is received and transacted at time 720, followed by a countdown to a clock stop at time 722. Note that the countdown interval shown is enforced by the power-mode logic within the controller as described above and is overlaid on the memory-side timing diagram of FIG. 12B simply to show that the clock-stop event is pending after arrival of the final command, OP0. As shown, a sequence of no-op commands follows OP0, thus enabling the memory-side data serialization/deserialization circuitry and core logic to complete the operation specified by OP0 before clock stop occurs. After the countdown interval transpires, the clock stops as shown, effecting a clock-stop low power operation of the memory device. Note that while the clock-stop is shown as coinciding with the framing boundary over the CA links, this is not required under the system operation. Instead, any number of system clock pulses may be en route to the memory device (depending on the depth of the wave pipeline over the clock link, and the on-memory clock latency of the open-loop clock distribution architecture) and thus yield clock stop at an implementation-specific (and/or device location-specific, if multiple memory devices are present and disposed at disparate locations from the memory controller) time between framing boundaries. As discussed above, this consequence is accounted for in one embodiment through the transmission of no-ops to ensure that no data packets or meaningful command packets are progressing through the memory-side deserializer/serializer circuitry (i.e., not fractured) when the clock stops. When the clock re-starts (at system clock cycle 52 in this example), one or more no-op commands are received, padding the startup sequence so that clock edges are arriving within the memory-side I/O circuitry before memory access commands and/or data arrive. In the example shown, at least one full no-op command is received prior to receipt of a write command (WR) and accompanying bank address (Ba, to select one of multiple memory banks within the memory core) and column address (Ca, to select one of multiple columns within a page of data resident within the sense amplifiers of the selected bank). A time, $t_{WRD}$ (write-command-to-data) after registration of the write command, write data packets and corresponding data mask packets are received over an interval, $t_{BL}$ (burst-length or burst time). Overall, a total of 32 bytes and 32 corresponding mask bits are received and transferred to the memory core to be written within the bank (and starting at the column offset) specified in connection with the write command.

FIG. 12C illustrates essentially the same clock-stop-mode entry/exit as FIG. 12B, but in the context of a memory read operation. In this case, a time $t_{CL}$ (column-address-strobe (CAS) latency) elapses between registration of a memory read (i.e., command to read data from the memory core from bank addresses Ba and column address Ca) and output of 32 bytes of read data (four serialized packets transmitted on each data link over interval, tBL).

Figure 13:
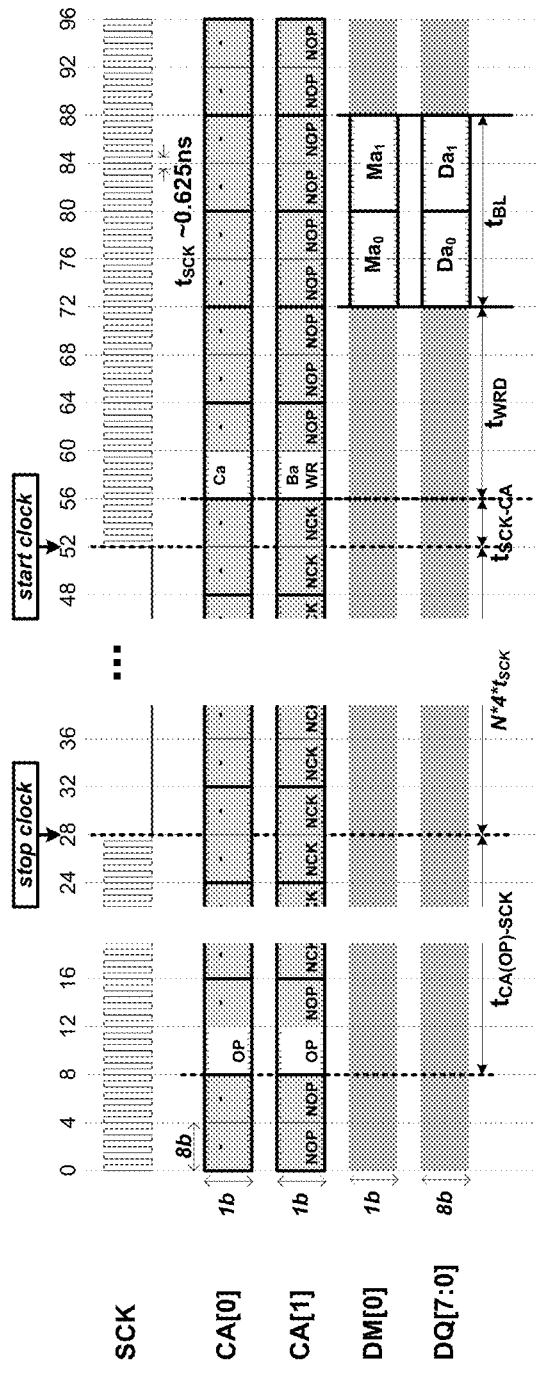
FIG. 13 illustrates clock-stop entry and exit according to an alternative embodiment that permits the clock-stop interval to extend over a non-integral number of core clock cycles.

FIG. 13 illustrates clock-stop entry and exit according to an alternative embodiment that permits the clock-stop interval to extend over a fractional or non-integral number of core clock cycles. As discussed, constraining the clock-stop interval to an integer number of core clock cycles ensures that, when the memory-side core clock is restarted after clock-stop, the phase relationship between the memory-side core-clock (MCK1) and controller core clock (PCK1) is maintained. Recalling that MCK1 may, at least in the embodiment of FIG. 2A, have one of four phase relationships to PCK1, according to the four possible states of the divide-by-four circuit used to generate MCK1 from MCK4, it follows that, if the integral-core-clock constraint is released, the memory core clock may have one of four possible phase relationships with respect to the controller core clock on clock re-start. From the standpoint of the memory-side serializer/deserializer circuitry, this means that, absent knowledge of the clock-stop interval, any one of four packet-framing/de-framing clocks may apply, each being aligned with one of four different n*2 bit-time offsets relative to MCK1 (i.e., offset by 0, 2, 4 or 6 bit times relative to MCK1). Accordingly, in one embodiment, the memory device includes a 4:1 multiplexer to allow selection of one-of-four packet-framing/de-framing clocks upon clock re-start. Further, instead of transmitting zero-valued no-operation commands upon clock-restart, the memory controller transmits a combined no-op, clock-alignment command, shown in FIG. 13 as a "NCK" command. As an example, each NCK command may include a single pair of '1's in a predetermined bit position within the NCK packet (e.g., "11 00 00

00"). By framing the incoming command stream with each of the four possible framing/de-framing clocks upon clock-start, and comparing the four differently framed packets with the expected NCK packet value, the framing clock that yielded the expected NCK may be selected as the memory-side framing/de-framing clock going forward.

Adjusting the chip-to-chip core-clock phase offset

As discussed in reference to FIG. 11A, absent circuitry to force a predetermined power-on/reset state, the exemplary modulo-4 counter (225, 616) provided to generate the memory-side core clock, MCK1 (i.e., by dividing the memory-side I/O clock (MCK4) by four), may power up in any one of four possible states (00, 01, 10, 11) and thus arbitrarily establish one of four possible phase relationships between MCK1 and the controller-side core clock (PCK1). Because each MCK4 cycle spans two-bit times, the four possible phase MCK1-to-PCK1 phase relationships are spaced in equal 2-bit-time phase offsets from one another (not counting any phase offset due to propagation over the system clock link or clock buffer delays). In one embodiment, the MCK1-to-PCK1 phase relationship is set at power-up (or reset) and thereafter accounted for without modification through the calibration of the bit-alignment and packet-alignment circuitry within the drift-compensating serializer/deserializer circuits of the memory controller. Because this may result in increased latency in some circumstances, a latency advantage may be achieved in an alternative embodiment in which the MCK4 divider 225 is adjusted during initial calibration to a state in which the most latent data link is advanced in phase relative to the controller-side core clock domain (imagine advancing the timing of FCK1[0] in FIG. 3D by two bit times) and thus reduce the worst-case link timing and by extension the minimum read latency.

Figure 14A:
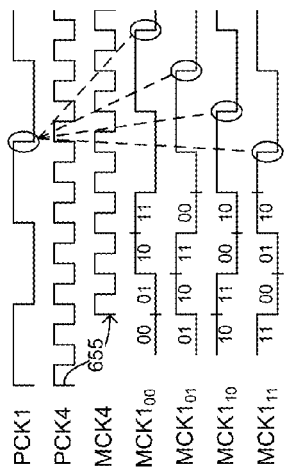
FIGS. 14A-14C relate to an embodiment of a phase-alignment circuit that enables adjustment of the phase offset between the core clock signals within the memory controller and memory device.
Figure 14B:
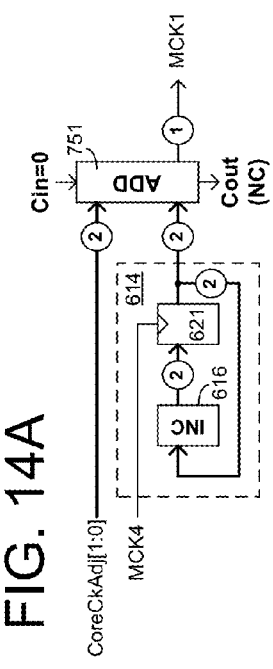

FIG. 14A illustrates an embodiment of clock divider that includes, together with the modulo-4 counter 614 described in reference to FIG. 11A (i.e., formed by increment logic 616 and 2-bit register 621), a modulo-4 adder 751 that adds a 2-bit core-clock adjustment value (CoreCkAdj[1:0]) to the count output to produce the clock-divider output. By this arrangement, the clock-divider output may be shifted from any arbitrary initial value (determined at power-up/reset of the modulo-4 counter 614), to any of the four possible output states (00, 01, 10, 11), thereby enabling the phase of MCK1 (i.e., the MSB of the divider output) to be adjusted relative to PCK1 by 2-bit-time increments (or quadrature steps of PCK1). FIG. 14B illustrates this result, showing the four exemplary phases of MCK1 relative to PCK1 for each of four settings of the core-clock adjust value (shown as a subscript to MCK1). For ease of understanding, it is assumed that the modulo-4 counter 614 initially powers up in state '00b' so that, at an initial rising edge of MCK4 (occurring after some period of delay relative to an initial rising edge of PCK4 as shown at 655), the divider output transitions from '00' to '01', or from '01' to '10' or from '10' to '11' or from '11' to '00', depending on the state of the core-clock adjust value of generates a phase-adjustable MCK1. As shown, the net effect of each increment in the core-clock adjust value is to advance MCK1 relative to PCK1 by two bit-times.

Figure 14C:
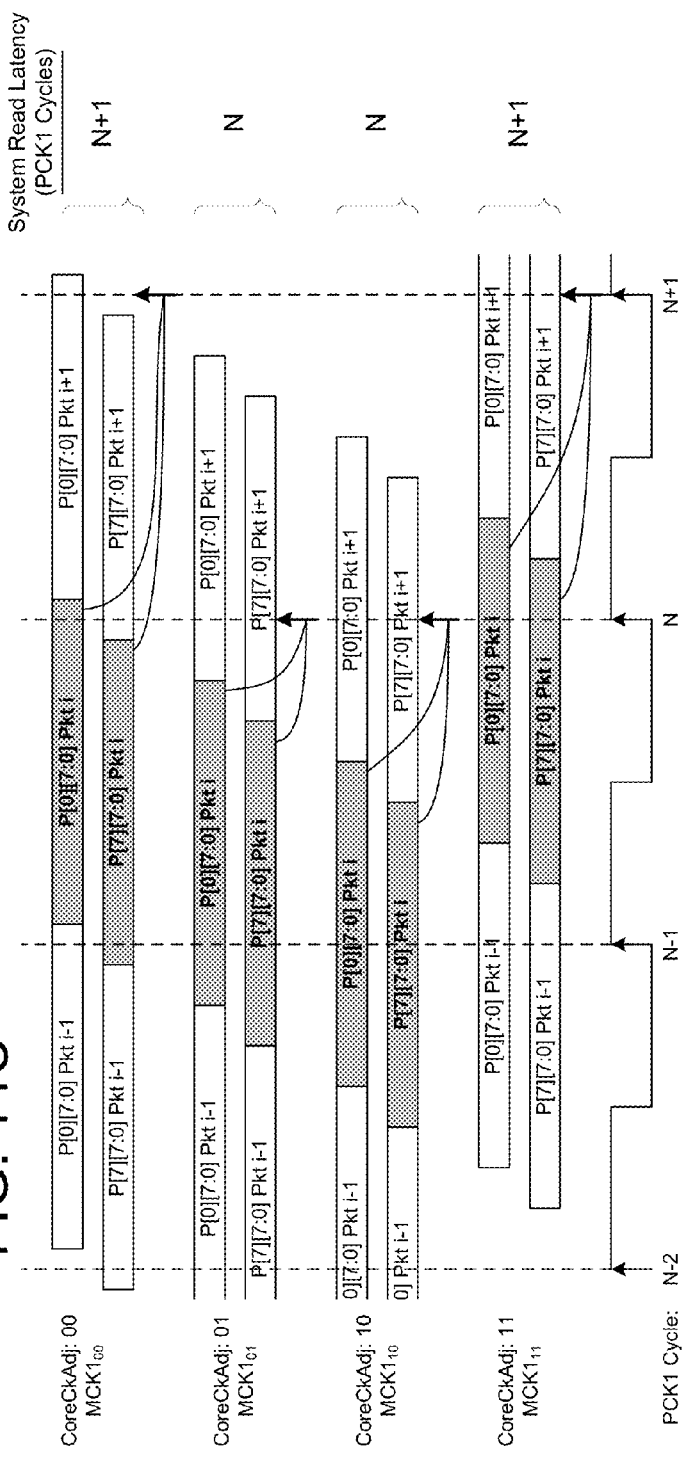

FIG. 14C illustrates an exemplary alignment of controller-side packet-framing boundaries relative to PCK1 edges for each of four settings of the core-clock adjustment value, CoreCkAdj[1:0]. In the example shown, it is assumed that read data is returned with the least latency on link DQ[0] and with the most latency on link DQ[0], and further that packets arriving via DQ[0] are framed just after a PCK1 sampling edge, while packets arriving via DQ[0] are framed just prior to the PCK1 sampling edge. In an embodiment that employs the packet alignment technique described above in reference to FIGS. 3C-3E, the system read-latency is set to the worst-case minimum, and thus to the N+1 latency (N+1 PCK1 cycles) of link DQ[0] as shown for the $MCK1_{00}$ case (i.e., CoreCkAdj[1:0]='00'). By advancing the phase of the memory-side core clock by two bit-times, however (i.e., as shown at $MCK_{01}$), all incoming packets arrive two bit-times earlier relative to the PCK1 sampling edge, and thus may be sampled in response to the $N^{th}$ sampling edge of PCK1 instead of edge N+1, thereby reducing the system read-latency by one PCK1 clock cycle (i.e., effecting a system read latency of N PCK1 cycles). A similar result is achieved when MCK1 is advanced by another 2-bit-time interval ($MCK_{10}$), providing even more controller-side margin (and thus potentially more drift tolerance). When MCK1 is further advanced by another 2-bit-time interval, however (shown at $MCK_{11}$), a PCK1 serializing boundary is missed (i.e., data from the core is not ready for serialization at such an advanced time), thus resulting in data serialization with respect to a one-cycle delayed MCK1 edge and therefore even more latent arrival at the memory controller than in the $MCK1_{00}$ case.

As FIG. 14C demonstrates, a reduced system latency may be achieved with some, but not all core-clock adjustment settings. Accordingly, in one embodiment, each core-clock adjustment setting is tested in turn, for example, by executing the bit-alignment and packet-alignment operations described above, to determine the minimum system latency achievable with each setting. In the event that more than one setting yields the same minimum system latency the median setting or other statistical center of those yielding the same minimum latency may be selected to provide maximum drift tolerance in either direction. In the example of FIG. 14C, because there are two core-clock adjustment settings that yield the same minimum, additional information may be gathered to determine which of the two settings provides the greatest drift tolerance (selecting that setting to be the calibration result) or a predetermined selection may be made (e.g., always select the highest-valued core-clock adjustment, or the last tested adjustment to yield the minimum latency).

Referring again to FIG. 14A, in one embodiment, the core-clock adjustment setting (CoreCkAdj[1:0]) is communicated to the memory device via a side-band link, thereby enabling the setting to be revised at the conclusion of controller-side deserializer calibration and prior to controller-side serializer calibration. Alternatively, complete calibration may be performed (deserializer and serializer) followed by core-clock adjustment, iterating as necessary.

Considering that the memory-side core-clock adjustment shifts the phases of the memory-side core clock and controller-side core clock relative to one another, it follows that the same relative phase shift may alternatively be achieved by shifting the phase of the controller-side core clock rather than the memory-side core clock. In one embodiment, for example, divide-by-8 circuit 163 of FIG. 2A is modified to enable the phase of PCK1 to be advanced to any of eight divider states and thus to enable PCK1 to be shifted relative to MCK1. In another embodiment, divide-by-2 circuit 165 of FIG. 2A is modified to enable the phase of PCK4 to be advanced by half cycle (in effect, inverted). Further, instead of clock phase shifting, an adjustment mechanism that suppresses some number of (1, 2 or 3) of PCK4 pulses within the controller-side PCK4 clock stop logic to set the initial phase relationship between MCK1 and PCK1 to achieve the aforementioned latency advantage. In yet another embodiment, a phase-shifting circuit (e.g., an interpolator) may be provided at the output of the PLL to enable the forwarded clock to be phase-stepped with resolution as desired (and practicable) to establish a reduced system latency with fully calibrated drift tolerance (e.g., stepping or searching through phase settings to find the boundaries of the minimum latency window and establishing a final phase centered between the boundaries).

Glitchless Phase Jumping

In one embodiment, the above-described clock-stop logic is employed at the start and end of a periodic timing calibration operation to suppress (or mask) glitches that may otherwise occur in the controller-side receive and transmit clocks during phase jumping. That is, as shown in FIG. 15A, when the phase of the data sampling clock for a given link, RCK8 [i], abruptly transitions (i.e., phase-jumps in response to Cal-ClkSel assertion) from the eye-centered phase used to receive live data ($RCK8[i]_{LIVE}$) to the boundary phase used to detect timing drift ($RCK8[i]_{PTC}$), a runt clock pulse 775 short enough to glitch the deserializer framing logic may appear on the clock line, as shown by the net clock waveform, $RCK8[i]_{NET}$. More specifically, the runt pulse 775 may be so short in duration as to render indeterminate action within the packet-framing circuitry (i.e., possibly counted by the counter circuitry used to generate the framing clock, possibly not) and thus yield packet framing errors upon returning to live data transfer (i.e., exiting periodic timing calibration). In general, such clock glitches and resulting logic glitches may be avoided by suppressing the controller-side clock during PTC phase jumping operations.

FIG. 15B is a timing diagram illustrating a pre-PTC clock-stop operation and the resulting non-glitching clock waveform that results ($RCK8[i]_{NET}$). In general, a single-core-clock-cycle clock-stop interval is inserted in each transition between live operation (i.e., run-time read and write data transfer) and PTC operation. The clock-stop interval enables the transition between live-mode and PTC-mode clock phase selections to be effected while the receive clock is disabled, suppressing any potential runt pulses along with all other receive clock pulses during the clock-stop interval and thus rendering the phase jump transparent to the deserializer framing logic. Upon clock re-start, receive clock pulses are counted without error by the framing logic, despite the new (PTC) clock phase. This operation is shown in FIG. 15B by the ordinally numbered pulses, with pulses 0, 1 and 2 being counted in response to the live-mode receive clock phase ($RCK8[i]L_{WE}$) and pulses 3, 4, 5, 6, 7, etc. being counted in response to the PTC-mode receive clock phase ($RCK8[i]_{PTC}$). The suppressed pulses in the live-mode clock and PTC-mode clock are shown in gray shading 778. Note that the PTC mode clock is shown as toggling concurrently with the live-mode clock to demonstrate the offset between the two clock phases. In actuality, only the net clock result $RCK8[i]_{NET}$ appears on the RCK8[i] clock line. The net suppressed pulses, including suppressed runt pulse 780, are also shown in gray at 781. Finally, in order to avoid runt pulses in the return phase jump from PTC-mode to live-mode, another single-PCK1-cycle clock stop operation is carried out as shown at 782.

FIGS. 16A-16F relate to an alternative manner of performing periodic-timing calibration that enables glitchless phase jumping without clock-stoppage. In general, the alternative approach involves an altogether different clock-drift detection that obviates arbitrary phase jumping in favor of one or more half-bit-time (or half-unit-interval(UI)) phase jumps in any transition into or out of PTC-mode. As discussed below, by limiting each half-UI phase jump to a transition to a new clock phase that leads the former clock phase by a half-UI, all clock pulses are ensured to be at least a half-UI in duration and thus no shorter than the pulse width of an RCK8[i] clock pulse. Finally, in one embodiment, the exit from PTC mode involves a sequence of three half-UI phase jumps carried out in successive core-clock cycles, and thus effecting a total controller-side phase advance of two unit intervals (4*0.5UI=2UI) in the transitions into and out of PTC mode. Accordingly, to maintain the packet-framing synchronization with respect to memory-side framing and de-framing logic, the memory controller delays the framing clock by two unit intervals (two-bit times) upon exit from PTC mode.

FIG. 16A illustrates a periodic timing calibration based on samples of a signaling waveform captured at the transitions between data eyes rather than during the eye-opening itself. In general, an incoming sequence of data values may be sampled in response to a receive clock signal (RCK) at data-eye midpoints to yield a sequence of data samples ($s_i$, $s_{i+1}$, $s_{i+2}$, $s_{i+3}$, ...) that correspond to the conveyed data values ($d_i$, $d_{i+1}$, $d_{i+2}$, $d_{i+3}$, ...). Further, by oversampling the signaling waveform, additionally capturing samples at the transitions (edges) between data eyes or "edge samples" ($e_i$, $e_{i+1}$, $e_{i+2}$, $e_{i+3}$, ...), phase information may be obtained whenever the edge sample fails to match either the preceding or succeeding data sample. More specifically, because a unit interval is, by definition, the time between successive edges in a signaling waveform, if the waveform is sampled twice per unit interval, once in response to a sampling clock signal to generate a data sample and again response to a half-UI-shifted version of the sampling clock (or edge clock) to generate an edge sample, disagreement between an edge sample and its preceding or succeeding data sample is, in effect, an indication that a transition occurred in the signaling waveform (from '1' to '0' or vice-versa) and that the edge sample was captured too late or too early, respectively, relative to the ideal edge sampling point. This result is shown in FIG. 16A by two early/late inequalities: if $e_i$ not equal to $s_i$ the sample was captured after the transition from $s_i$ to $s_{i+1}$ and therefore late; if $e_i$ is not equal to $s_{i+1}$, the sample was captured prior to the transition from $s_i$ to $s_{i+1}$ and therefore early. Accordingly, phase error information may be generated by determining whether the majority of early/late indications obtained over a given time interval (or over a predetermined number of edge samples) indicate that the edge clock (and therefore the sampling clock) is early or late relative to the ideal sampling point (where early/late indications are in balance) and adjusting the phase of the edge and sampling clocks accordingly.

In one embodiment, the above-described early/late determination is effected during a periodic-timing-calibration (PTC) operation without oversampling and instead by transmitting a known data pattern and generating corresponding edge samples using a half-UI-shifted receive clock (i.e., an edge clock). FIG. 16B illustrates an embodiment of a phase-error detector 801 that compares a set of edge samples ($e_0$, $e_1$, ..., $e_{n-1}$) with known data samples ($d_0$, $d_1$, ..., $d_{n-1}$, $d_n$) in exclusive NOR (XNOR) gates 803 and supplying the resulting sample-early/sample-late (sE/sL) to voting logic 804. In one embodiment, the voting logic is a combinatorial logic circuit that generates a phase increment/decrement signal ("Inc/Dec") according to whether the early indications or late indicates predominate (constitute the majority vote) and outputs the increment/decrement signal to update the alignment count of the receive clock signal.

FIG. 16C illustrates an exemplary sequence of operations carried out to effect a phase update during periodic timing calibration of a controller-side drift-compensating deserializer. Starting at 821, the receive clock is phase-advanced by a half UI (0.5UI). Thereafter, memory-side transmission of a predetermined (or predictable) test data pattern is initiated. In one implementation, for example, a side-link command is issued to the memory device to initiate test pattern transmission. Alternatively, the memory device may be placed in the above-described loopback mode, and the test pattern transmitted from the memory controller to memory device, then re-transmitted from memory device to memory controller in a loopback operation. In either case, at 823, the memory controller samples the incoming test pattern with a half-UI shifted receive clock to generate a sequence of edge samples at 825. The edge samples are evaluated at decision block 827 to determine whether clock-early indications ($e_i < > d_i$) or clock-late indications ($e_i < > d_{i+1}$) predominate. If clock-early indications constitute the majority, the receive clock is deemed late relative to the desired sampling point, and the corresponding alignment count is decremented at 828 to advance the clock phase. Conversely, if clock-late indications constitute the majority, the receive clock is deemed early relative to the desired sampling point, and the corresponding alignment count is incremented at 829 to retard the clock phase. Thereafter, the receive clock is advanced by 1.5 UI at 831 to restore the pre-calibration phase. In one embodiment, this phase advance is effected by a sequence of three 0.5UI phase advance operations to restore the pre-calibration phase as discussed below in reference to FIGS. 16D and 16E. Finally, at 833, two bit-time delay is introduced in the framing clock generator to compensate for the additional pulses that result from the net 2UI phase advance of the receive clock. This operation is described in further detail in reference to FIG. 16F.

FIG. 16D illustrates an embodiment of a clock-phase-shifting circuit that provides a glitchless 0.5UI phase advance in response to a phase-advance signal ("Adv0.5UI). As shown, the circuit includes a ring-coupled pair of differential edge-triggered flip-flops 841, 843 that are clocked by rising and falling (positive and negative) edges of the bit-rate receive clock (RCK8[i]), respectively. The inverting and non-inverting outputs of the positive-edge-triggered flip-flop 841 are coupled to corresponding inverting and non-inverting inputs of the negative-edge-triggered flip-flop 843, while the inverting and non-inverting outputs of the negative-edge-triggered flip-flop 843 are cross-coupled to the non-inverting and inverting inputs of the positive-edge-triggered flip-flop 841. By this arrangement, the positive (non-inverted) and negative (inverted) outputs of the positive-edge-triggered flip-flop 841 transition in response to each rising edge of the bit-rate clock (RCK8[i]), cycling once every two bit-times, while the positive and negative outputs of the negative-edge-triggered flip-flop 843 transition in response to each falling edge of the bit-rate clock, cycling once every two bit-times, but in quadrature relation (half-UI-offset) relative to the outputs of the positive-edge-triggered flip-flop 841. Thus, as shown in FIG. 16E, four half-bit-rate clock signals are generated, iCK_P and iCK_N (positive and negative "in-phase" clocks) and qCK_P and qCK_N (positive and negative "quadrature" clocks), phase-distributed by half-UI phase-offsets within a 2UI interval (i.e., one cycle of a half-bit-rate clock cycle). As shown in FIG. 16D, the four clock signals are supplied to input ports of a multiplexer 847 and selected for output in response to the output of a 2-bit (modulo-4) counter 845. In one embodiment, the counter 845 is implemented as a gray-code counter (e.g., count sequence=00,01,11,10,00, ... ) to avoid output glitching and is advanced in response to the phase-advance signal (Adv0.5UI) to select the different clock signals in sequence to effect phase-jumps from one half-bit-rate clock to the next. By this operation, and by limiting each phase jump to a jump from one half-bit-rate clock to a half-UI-advanced instance of the half-bit-rate clock (i.e., from iCK_P to qCK_N, from qCK_N to iCK_N, from iCK_N to qCK_P and, finally, from qCK_P back to iCK_P, as shown by arrows 850), the worst-case (shortest-duration) runt pulse is ensured to be at least 0.5UI in duration as shown at 851 and 853, no matter when the advance signal is incremented. Accordingly, by ensuring that all logic circuits are capable of deterministic response to 0.5UI-spaced clock edges (i.e., capable of being clocked by a data-rate frequency clock), determinant, glitchless circuit operation is ensured.

Still referring to FIG. 16D, it can be seen that a return 0.5UI phase jump from a given half-bit-rate clock to a half-UI-delayed clock (i.e., as generally desired to restore live operation after periodic timing calibration is complete) does not yield the same glitchless clock result. That is, runt pulses of indeterminate duration may be produced depending on when the phase jump is initiated. In one embodiment, such runt pulses are avoided by effecting the return to the original (pre-PTC) clock phase by a sequence of three additional half-UI phase jumps—1.5UI in total—executed in successive core-clock cycles. Finally, because the net effect of the four 0.5UI phase advances (one to provide an edge clock during PTC, three to restore the data sampling clock phase) is to advance the phase of the resultant clock by 2 unit intervals, the counter circuitry used to generate the bit framing clock is delayed by two unit intervals to maintain synchronization with respect to memory-side packet framing. This effect is shown conceptually in FIG. 16F which shows that the sequence of four half-UI phase jumps results in two additional bit-timing edges within the controller-side clock (RCK4) relative to the counterpart memory-side clock (MCK4). In one embodiment, a framing clock delay circuit is provided within the deserializer of FIG. 3A, to subtract two from the modulo-8 counter used to generate the framing clock signals, RCK1 and FCK1 upon exit from PTC mode, thus restoring the proper packet-framing boundary.

Returning to FIG. 16D, it can be seen that one consequence of the phase-jumping circuitry is to yield a half-bit-rate receive clock, RCK4[i]. In one embodiment, this consequence is accommodated by revising the controller-side serializer/deserializer circuitry to clock-in/clock-out data in response to both rising and falling edges of the half-bit-rate clock. In one embodiment, for example, the half-bit-rate serializer/deserializer circuits of FIGS. 4A and 4B are implemented within the memory controller, applying the alignment-count-controlled packet-framing clocks instead of MCK1.

Although FIGS. 16A-16F have been described in reference to controller-side receive clock timing, counterpart 0.5UI phase jump operations (and transmit-clock generating circuitry) may be executed to effect periodic timing calibration of the transmit clock phase. For example, by phase-advancing the transmit clock phase by 0.5UI, and then receiving the resulting memory-side-captured edge samples (e.g., via loopback), the same increment/decrement decision may be made, in this case advancing the transmit clock phase (i.e., advancing the data phase and effectively retarding the memory-side sampling instant) if the edge samples indicate an early memory-side sampling instant and decrementing the transmit clock phase if the edge samples indicate a late memory-side sampling instant. Similarly, upon exit from PTC, the phase of the transmit clock may be advanced by 1.5UI in a sequence of 0.5UI phase jumps to restore the pre-calibration transmit phase (now adjusted according to edge drift). Finally, the controller-side de-framing clock may be delayed by a count of two to correct for the two additional timing edges (relative to memory-side timing) that result from the four 0.5UI phase jumps.

System Applications of Memory System Having Low-Power Clock-Stop Mode

Memory systems having low-power clock-stop mode have been described thus far in the context of a memory controller and single memory device. While such tightly-coupled controller/memory systems may be used in a number of mobile applications, a single memory controller integrated-circuit (controller IC) may alternatively control multiple memory devices (memory ICs) disposed in a variety of architectures. Further, multiple memory controller channels may be implemented in a single IC, each controlling a separate group of one or more memory ICs and thus permitting a single clock circuit to generate clock signals for multiple controller-side I/O circuits and open-loop memory-side clock distribution circuits.

FIG. 17A illustrates an embodiment of a pause-able-clock memory system 750 having a single controller IC 751 and multiple memory ICs $755_0$-$755_{n-1}$. In the embodiment shown, the memory devices (collectively, 755) are disposed on a memory module 753 (generally, a circuit board having an edge connector for removable connection to a backplane or motherboard, and thus permitting memory capacity expansion as additional memory modules are inserted) and individually include an I/O interface and open-loop clock distribution arrangement as shown in FIG. 2A. In that case, each of the signaling-link groups shown (752) may include a point-to-point connection between the memory controller and a respective one of the memory devices and may include dedicated clock, CA and data links (and data-mask, if needed). Alternatively, some or all the signaling links may be distributed to all the memory devices of the memory module (e.g., clock link coupled to all memory devices in multi-drop fashion, and/or command link(s) coupled to all the memory devices in multi-drop fashion). Additionally, each signaling link may be coupled to multiple memory devices (e.g., data links being coupled to a slice of memory devices across a number of memory modules, as in data links [0 to N−1] being coupled to a first memory IC on each of multiple memory modules 753, data links [N+1 to 2N] being couple to a second memory IC on each of the memory modules, etc.) thus establishing multi-drop data and/or command paths. In the latter event, additional timing compensation values may apply depending on the memory module (or group of memory devices selected from two or more such groups on the same module) selected for a given memory access transaction. In that case, packet, bit and phase adjust values may be switched dynamically, depending on the group of memory devices targeted for a given memory access transaction, with separate set of alignment registers maintained for each group.

FIG. 17B illustrates another memory system embodiment, in this case having a module-mounted buffer IC 775 that implements an interface 777 corresponding to the memory-side I/O interface shown in FIG. 2A. By this arrangement, a high-speed signaling system having clock-stopped low-power mode may be implemented between the memory controller 771 and buffer IC 775, with more conventional interfaces 729 implemented between the buffer IC and memory devices $781_0$-$781_{N-1}$, $782_0$-$782_{N-1}$ disposed alongside the buffer IC 775 on the memory module 773. In one embodiment, for example, command/address values include not only bank, row and column addresses, but also addresses of individual memory devices 781, 782 (or groups of memory devices) to which the buffer IC 775 is to forward the command. The buffer IC may additionally include a data input/output buffer to queue incoming write data for eventual distribution to an address-selected memory device (or memory device group), and read data to be forwarded to the memory controller. As an example, in one embodiment, the buffer IC-to-memory device interfaces are relatively slow signaling interfaces that do not require on-memory PLL/DLL to maintain link integrity, or may be implemented using standard strobe-based signaling.

Tiered Power Modes

In one embodiment, the mesochronous low-power signaling system described above supports two other power modes in addition to the active operating mode (active mode) and clock-stopped low-power mode described above: a power-down mode in which biasing current sources within signal transmitter and receiver circuits are shut down, and a deep powerdown mode in which the controller-side PLL (element 161 of FIG. 2A) may be disabled along with logic circuitry within the controller core. Transition between all the power modes may be managed by the power-mode logic described above in response to command traffic from the controller core. The power modes (also referred to herein as power states) may be used to trade increasing exit latency for decreasing power consumption. The following table (Table 1) summarizes memory-controller power state performance in one implementation, showing the active-mode (P4) as well as the three low-power modes:

TABLE 1

| Power Mode | Exit Latency (PCK1 Cycles) | Controller Interface power vs. peak interface DQ bandwidth | | |
|---|---|---|---|---|
| | | 2.7 GB/s | 3.2 GB/s | 4.3 GB/s |
| P4 (active) | — | 80.8 | 91.6 | 114.7 |
| P3 (clock-stop; idle) | 0 | 15.0 | 15.7 | 17.4 |
| P2 (powerdown) | 10 | 4.6 | 5.2 | 6.5 |
| P1 (deep powerdown) | 130 | 0.4 | 0.4 | 0.4 |

As shown, in the P4 (active) mode, 4.3 GB/s (giga-bytes per second) DQ bandwidth is provided at 114.7 mW (3.3 mW/Gb/s). In the P3 mode, the clock distribution is paused as described above and the DQ output drivers, input amplifiers, and data samplers may additionally be disabled. In P2 mode, all transceivers are disabled (including the clock transmitter and receiver circuitry) and only the clock multiplier is active. In P1 mode, only leakage power is consumed. The entry latency of each power state may be made programmable (with a minimum of zero parallel (PCK1) clock cycles), providing enhanced flow control of the state transitions. The fast power-state transition times allow efficient use of burst transfers when peak bandwidth is not required. Details of the memory access policy and traffic profile may determine power state utilization and ultimate efficiency. As discussed above, when the controller-to-memory signaling interface is idle, power is saved by synchronously pausing the clock distribution at its root, cleanly halting the downstream circuitry in both the memory controller and memory device and enabling the fast power-state transition times shown in the table above.

Transition between the different power modes may be managed by the power mode logic 111 of FIG. 1A based on, for example, the status of the transaction queue 109 (empty or loaded) and/or explicit power-related control signals from a host processor or host controller. In one embodiment, shown for example in FIG. 18A, the power mode logic 111 includes a state machine that transitions to progressively lower power modes—active (P4) to clock-stopped (P3) to powerdown (P2) to deep powerdown (P1)—as the time without memory access request increases. Thus, when the transaction queue is first emptied and the last-dequeued transaction is completed (i.e., all I/O operations relating to the transaction are completed), the power mode logic transitions from the active state to the idle state, deasserting clock-enable signal(s) to pause the system clock signal and controller I/O clock signals. Thereafter, if the transaction queue continues to remain empty for a predetermined or programmed number of memory access cycles, the power mode logic may transition from the idle state to the powerdown state, issuing signals to disable transmitters and receivers within the memory device and memory controller. If the transaction queue remains empty for an extended time interval (e.g., another programmable time interval) after entering powerdown mode P2, or if an explicit host command to enter a further-reduced power mode is received, the power mode logic may enter a deep powerdown state by disabling operation of the controller-side PLL along with circuitry within the controller-side core (e.g., circuitry for interfacing with a host-side data path). Note that in an embodiment in which the controller-core clock is generated by the PLL, an alternate clock source may be switchably provided (e.g., via a multiplexer) to circuitry required to respond to any memory access request or wake-up/power-up command from the host processor or host controller. Also, instead of generating the controller core clock by frequency-dividing the PCK8 signal as shown in FIG. 2A, the reference clock signal or a recovered version thereof may be used as the controller-core clock, thus ensuring core-clock clock availability even after PLL shut down.

Still referring to FIG. 18A, when a memory access request or explicit wake-up/power-up command is received from the host controller/host processor, the power mode logic responds by transitioning the memory system from the deep power down state (P1) to power down state P2 by turning on the controller-side PLL and other disabled controller-core circuitry. Thereafter, the power mode logic transitions the system from power down state P2 to clock-stop state P3 by enabling the controller and memory side clock and command/address transmitters and counter-part memory-side receivers. Finally, the power mode logic transitions the system from clock-stop (idle) state P3 to active state P4 by enabling the system clock signal and controller I/O clock signals to toggle.

Figure 18B:
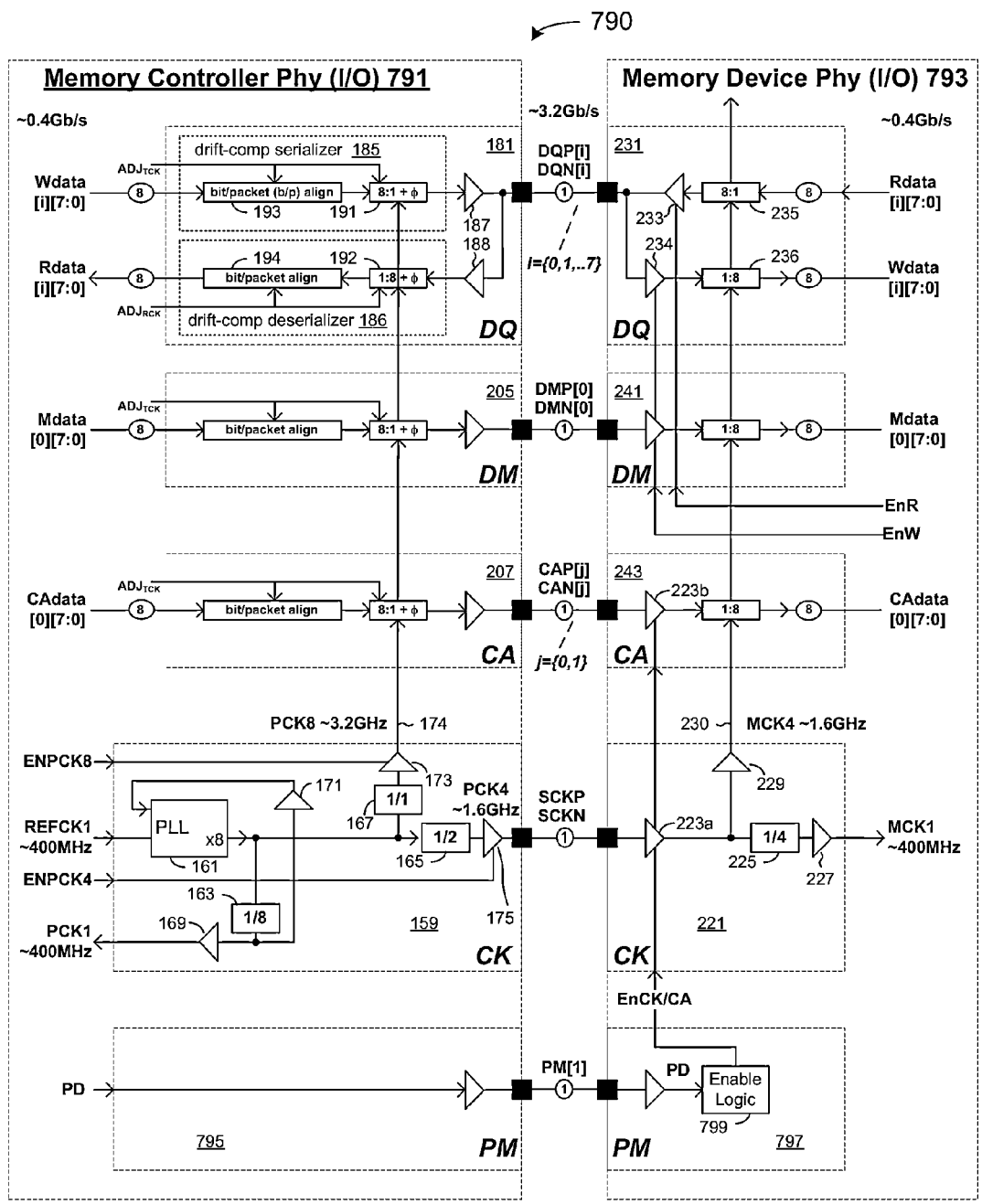
FIG. 18B illustrates a memory system architecture that corresponds to the embodiment of FIG. 2A, but showing additional detail with respect to circuit shut-down in progressively reduced power modes.

FIG. 18B illustrates a memory system architecture 790 that corresponds to the embodiment of FIG. 2A, but showing additional detail with respect to circuit shut-down in the P4, P3 and P2 power modes. Referring first to the memory-side I/O circuitry 793, enable-read and enable-write signals (EnR and EnW) are provided from the memory core to selectively enable and disable signal receivers (234) for data and mask links 231, 241 and signal transmitters 233 for the data links 231 according to the column operation being performed. That is, during an active-mode (P4) memory read operation in which no write data or write-mask is to be received, request decoding logic within the memory core logic lowers the enable-write signal (EnW) to shut-off power-consuming circuitry within the write-data and write-mask receivers, thereby reducing power consumption. Similarly, during an active-mode memory write operation in which no read data is to be transmitted, the memory core logic lowers the enable-read signal (EnR) to shut off power-consuming circuitry within the read-data transmitters.

In one embodiment, I/O amplifier shut-down is effected by disabling one or more bias current source(s) within a differential or single-ended receiver/transmitter provided to receive/transmit data signals. FIG. 18C illustrates an exemplary embodiment of a differential amplifier 810 that may form part of such a receiver or transmitter. As shown, amplifier 810 includes a passive or active pull-up load 811, differentially coupled input transistors 813a/813b, biasing current source 815 and shut-down transistor 817. When the enable-write or enable-read signal (generically, "En") is raised, the shut-down transistor 817 is switched to a conducting state to enable flow of a DC bias current within the biasing current source 815 and thus enable the output nodes of the differential amplifier (outP, outN) to be differentially raised and lowered according to the differential signal applied at input nodes inP and inN of the amplifier. When the enable signal is lowered, the shut-down transistor 817 is switched to a substantially non-conducting state to disable flow of the DC bias current and thus renders the amplifier into a reduced power state. In alternative embodiments, the shut-down maybe effected by including the shutdown transistor or other switching element at other locations within the amplifier 810 including, for example and without limitation, within the biasing current source 815.

It should be noted that the signal receivers 234 and transmitters 233 shown in FIG. 18B may do more than amplify incoming and outgoing signals and thus may include circuitry in addition to (or as an alternative to) the exemplary amplifier of FIG. 18C. For example, the receiver and/or transmitter circuits ("receiver/transmitter") may additionally perform level-shifting operations (e.g., shifting between small-swing signals conveyed on the signaling link and logic-level signals provided to deserializing circuitry or received from serializing circuitry). The receiver/transmitter may perform timed sampling/output operations, increase the current drive with or without voltage amplification/attenuation; provide slew-rate control, supply voltage regulation, etc. Any or all of these operations may use steady-state ("DC") current sources or other power-consuming circuits that may be quickly disabled and enabled (i.e., turned off and on) in response to enable signals.

FIG. 18D is a timing diagram illustrating command-based assertion of the enable-write and enable-read signals (EnW and EnR) in response to incoming memory write and memory read requests, respectively. The memory-side I/O clock signal (MCK4), command/address signals, data mask, and read/write data signals all have the general timing relationships as described above in reference to FIGS. 12A-12C. In the specific command sequence shown, a column write command (WR) including a bank address (Ba) and column address (Ca) are received within the memory device at time 821, with corresponding write data to arrive a predetermined time, $t_{WRD}$, later. Request decoding logic responds to the write command by raising the write-enable signal (EnW) after a write-enable interval ($t_{WR\text{-}ENW}$) elapses, thus enabling operation of the data-input receivers (i.e., write-data and data-mask receivers) in advance of the incoming write data, providing a time $t_{ENW\text{-}D}$ for the receivers to stabilize. After the write data has been received, if no subsequent write request has been received and thus no immediately-succeeding (i.e., back-to-back) write data reception scheduled, the request decoding logic may deassert the enable-write signal after time interval $t_{D\text{-}ENW}$ to return the data-input receivers to the reduced power state. Note that specific time intervals are shown for purposes of example only; different $t_{WRD}$, $T_{WR\text{-}ENW}$, $t_{ENW\text{-}D}$ and $t_{D\text{-}ENW}$ intervals may be implemented in alternative embodiments.

Still referring to FIG. 18D, a column read command (RD) including a bank address (Ba) and column address (Ca) are received within the memory device at time 823, with corresponding read data to be output a predetermined time, $t_{CL}$, later. The request decoding logic responds to the read command by raising the read-enable signal (EnR) after a read-enable interval ($t_{RD\text{-}ENR}$) elapses, thus enabling operation of the data-output transmitters (i.e., read-data transmitters) prior to read-data transmission, providing a time $t_{ENR-Q}$ for the transmitters to stabilize. After the read data has been output, if no subsequent read operation has been received and thus no immediately-succeeding (i.e., back-to-back) read data transmission scheduled, the request decoding logic may deassert the enable-read signal after time interval $t_{Q-ENR}$ to return the data-output transmitters to the reduced power state. Note that specific time intervals are shown for purposes of example only; different $t_{CL}$, $t_{RD-ENR}$, $t_{ENR-Q}$ and $t_{Q-ENR}$, intervals may be implemented in alternative embodiments.

Returning to FIG. 18B, a powerdown signal or command (PD) is asserted by the power-mode logic within the controller core upon determining that the transaction queue continues to remain empty after transitioning to the clock-stopped low power mode, P3 (i.e., idle mode). The powerdown signal is forwarded to the memory device via a power mode driver 795, link (PM[1]), and receiver 797 where it is received within an enable logic circuit 799 which lowers a command-enable signal, EnCK/CA in response. The command-enable signal is supplied to input receivers 223*a*/223*b* and within the system clock interface 221 and command/address interface 243, and thus, when lowered, disables the input receivers for the corresponding clock and command/address links to establish the further-reduced power state, referred to herein as the powerdown mode, P2.

FIG. 18E is a timing diagram illustrating powerdown mode entry and exit, with the exit being triggered by a memory write request. As shown, a final command memory access request (OP) is received starting at time 833 and processed during the interval, $t_{CA(OP)-CK}$, that precedes entry into a clock-stopped low power mode (i.e., at clock cycle 32). As discussed above, the tCA(OP)-CK interval may be different for different commands and represents the time needed to complete (i.e., supply clock edges for completion of) the last memory access request dequeued from the transaction queue. A memory read operation may require more clock edges to finish than a row precharge command, for example.

If the transaction queue continues to remain empty for a predetermined or programmed time interval ($t_{CK-PM}$) after clock stop, the controller-side power-mode logic asserts the powerdown signal (PD), which results in deassertion of the command-enable signal, EnCk/CA a short time later (i.e., after delay $t_{PM-EN}$), thereby disabling the input receivers for the system-clock and command/address links and establishing the powerdown mode.

It should be noted that powerdown mode (P2) may alternatively or additionally entered in response to a command transmitted via the command/address path. Such an arrangement would permit the powerdown control to be included (e.g., as an embedded bit or bits) with one or commands indicating other operations while in P4 or P3 modes. After entry into to the powerdown mode via a command received on the command path, the powerdown signal may be used to trigger re-enabling of the command path and clock signal receivers and thus effect transition back to clock-stop mode (P3).

When a new memory access request is queued within the controller-side transaction queue, the power mode logic lowers the powerdown signal to enable a transition from the powerdown mode to the clock-stopped mode (i.e., from P2 to P3). The memory-side enable logic (799 of FIG. 18B) responds to deassertion of the powerdown signal by raising the command-enable signal a short time later (i.e., after interval $t_{PM-EN}$) enabling the input receivers for the clock and command/address links and thus readying the memory device for return to active mode. Accordingly, a time interval ($t_{EN-CK}$) after the command-enable signal is raised, the system clock is re-started to transition the memory device from clock-stopped mode back to active mode (P3 to P4). Shortly thereafter, the memory access request which triggered the return to active mode is received within the memory device via the command path, followed by corresponding data a predetermined time later. In the particular embodiment shown, the memory access request is a column write request so that the enable-write signal is asserted to enable the input amplifiers of the write-data receivers to receive write data at the time shown. The memory access request may alternatively be a column read request as shown in FIG. 18D (in which case the enable-read signal will be raised after a time $t_{RD-ENR}$ to enable operation of the read-data amplifiers), or a row access request.

Reflecting on the power-mode transitions and supporting circuitry described in reference to FIGS. 18A-18E, it should be noted that additional refinement in power mode control may be provided. For example, while the input receivers for the system clock and the command/address links are shown as being enabled by a single control signal, separate enable signals may be provided for those links in alternative embodiments, thus enabling one link to be disabled/enabled before or after the other or to enable links independently of one another. Further, the signal applied to enable the input receiver for the clock link (or one or more additional enable signals) may additionally be supplied to clock buffers 229 and 227, particularly if those buffers are implemented by circuits that draw non-negligible current (e.g., current mode logic). Additionally, while the power mode signal is depicted as being supplied via a dedicated link, the powerdown signal may alternatively be transmitted via a shared link (e.g., time-multiplexed onto the sideband link shown in FIG. 2) to reduce pin count. Logic circuitry may also be provided within the controller-side circuitry to synchronize the powerdown signal with the controller-core clock signal or another controller-side timing signal. Further, while not specifically shown in FIG. 18B, additional enable signals may be provided to selectively enable controller side transmitter and receiver circuits according to the operations being carried out and the power mode. For example, signals corresponding to the enable-read and enable-write signals (EnR, EnW) may be provided from the controller core logic to the data receiver and data/mask transmitter circuits (e.g., elements 188, 187 of FIG. 18B) to disable the data/mask transmitters (and enable the data receivers) during memory read operations and to disable the data receivers (and enable the data/mask transmitters) during memory write operations. Also, the powerdown signal may be used to selectively enable the command/address transmitters within command/address serializers 207 and any clock transmitters 175 and on-chip clock distribution circuits 173, thus enabling a powerdown mode (P2) within the memory controller and providing a power savings over and above the clock-stop operation itself. The timing of the controller-side enable-read/enable-write and powerdown signals corresponds generally to the timing shown for counter-part memory-side signals in FIGS. 18D and 18E.

In addition to the foregoing options and alternatives, the $t_{CK-PM}$ time interval that is to transpire before transitioning from clock-stop mode to powerdown mode may be programmably selected (e.g., programmed into a register within the controller-side power mode logic) according to system operating policy or application demands. More generally, all the timing intervals shown in FIGS. 18D and 18E are provided for purposes of example only, are not necessarily to scale, and may vary as necessary to meet operational requirements.

Electronic Representation of Physical Embodiments

It should be noted that the various integrated circuits, dice and packages disclosed herein may be described using computer aided design tools and expressed (or represented), as data and/or instructions embodied in various computer-readable media, in terms of their behavioral, register transfer, logic component, transistor layout geometries, and/or other characteristics.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. A signal driving circuit is said to "output" a signal to a signal receiving circuit when the signal driving circuit asserts (or deasserts, if explicitly stated or indicated by context) the signal on a signal line coupled between the signal driving and signal receiving circuits. The expression "timing signal" is used herein to refer to a signal that controls the timing of one or more actions within an integrated circuit device and includes clock signals, strobe signals and the like. "Clock signal" is used herein to refer to a periodic timing signal used to coordinate actions between circuits on one or more integrated circuit devices and includes both free-running and gated (i.e., pauseable or stop-able) oscillatory signals. "Strobe signal" is used herein to refer to a timing signal that transitions to mark the presence of data at the input to a device or circuit being strobed and thus that may exhibit periodicity during a burst data transmission, but otherwise (except for transition away from a parked condition or other limited pre-amble or post-ample transition) remains in a steady-state in the absence of data transmission. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory controller comprising:
    a transaction queue to store memory read and write requests that, to be serviced, require operation of synchronous data transmission and reception circuits, respectively, within a memory device; and
    power control circuitry to:
        output, to the memory device, a first signal in a first state to enable operation of the synchronous data transmission and reception circuits within the memory device;
        determine that the transaction queue has reached a predetermined state; and
        in response to determining that the transaction queue has reached the predetermined state, output, to the memory device, the first signal in a second state to disable operation of the synchronous data transmission and reception circuits within the memory device.

2. The memory controller of claim 1 wherein the power control circuitry to output the first signal in the first state and the second state comprises clock generation circuitry to output the first signal in an oscillating state and in a non-oscillating state, respectively, wherein when output in the first state, the first signal oscillates at a predetermined frequency.

3. The memory controller of claim 2 wherein the clock generation circuitry to output the first signal in the oscillating state to enable operation of the synchronous data transmission and reception circuits within the memory device comprises circuitry to output the first signal in the oscillating state to enable corresponding oscillation of a timing signal delivered to at least one of the synchronous data transmission or reception circuits within the memory device.

4. The memory controller of claim 2 wherein the predetermined oscillation frequency of the first signal establishes at least one of a data reception rate of the synchronous data reception circuits within the memory device or a data transmission rate of the synchronous data transmission circuits within the memory device.

5. The memory controller of claim 1 wherein the power control circuitry to determine that the transaction queue has reached the predetermined state comprises circuitry to determine that the transaction queue is empty or will be empty within a deterministic time.

6. The memory controller of claim 1 wherein the power control circuitry to output the first signal in the second state in response to determining that the transaction queue has reached the predetermined state comprises circuitry to transition the first signal from the first state to the second state a predetermined time after a sole remaining memory read or write request has been emptied from the transaction queue, wherein the predetermined time after the sole remaining memory read or write request has been emptied from the transaction queue comprises a sufficient time for the memory device to receive and service the sole remaining memory read or write request.

7. The memory controller of claim 6 wherein the power control circuitry to output the first signal in the first state comprises circuitry to output the first signal in an oscillating state, and wherein the sufficient time for the memory device to receive and service the sole remaining memory read or write request comprises a predetermined number of oscillation cycles of the first signal before the first signal is rendered to the second state, the second state being a steady, non-oscillating state.

8. The memory controller of claim 1 further comprising synchronous data transmission and reception circuits to transmit write data to the memory device and receive read data from the memory device, respectively, and wherein the power control circuitry comprises circuitry to disable oscillation of a first clock signal that enables operation of the synchronous data transmission and reception circuits within the memory controller in response to determining that the transaction queue has reached the predetermined state.

9. The memory controller of claim 8 further comprising circuitry to generate a second clock signal that oscillates at a lower frequency than the first clock signal and that remains oscillating at the lower frequency while oscillation of the first clock signal is disabled.

10. The memory controller of claim 1 wherein the power control circuitry comprises circuitry to determine that the transaction queue has exited the predetermined state by virtue of storage therein of a newly received memory read request or memory write request, and, in response to determining that the transaction queue has exited the predetermined state, to output the first signal in the first state to re-enable operation of the synchronous data transmission and reception circuits within the memory device.

11. A method of operation within a memory controller, the method comprising:
outputting, to a memory device, a first signal in a first state to enable operation of synchronous data transmission and reception circuits within the memory device;
storing, within a transaction queue, memory read and write requests that, to be serviced, require operation of the synchronous data transmission and reception circuits, respectively, within the memory device;
determining that the transaction queue has reached a predetermined state; and
in response to determining that the transaction queue has reached the predetermined state, outputting, to the memory device, the first signal in a second state to disable operation of the synchronous data transmission and reception circuits within the memory device.

12. The method of claim 11 wherein outputting the first signal in the first state comprises outputting the first signal in an oscillating state such that the first signal oscillates at a predetermined frequency, and wherein outputting the first signal in a second state comprises outputting the first signal in a non-oscillating state.

13. The method of claim 12 wherein outputting the first signal in the oscillating state to enable operation of the synchronous data transmission and reception circuits within the memory device comprises outputting the first signal in the oscillating state to enable corresponding oscillation of a timing signal delivered to at least one of the synchronous data transmission or reception circuits within the memory device.

14. The method of claim 12 wherein the predetermined oscillation frequency of the first signal establishes at least one of a data reception rate of the synchronous data reception circuits within the memory device or a data transmission rate of the synchronous data transmission circuits within the memory device.

15. The method of claim 11 wherein determining that the transaction queue has reached the predetermined state comprises determining that the transaction queue is empty or will be empty within a deterministic time.

16. The method of claim 11 wherein outputting the first signal in the second state in response to determining that the transaction queue has reached the predetermined state comprises transitioning the first signal from the first state to the second state a predetermined time after a sole remaining memory read or write request has been emptied from the transaction queue, wherein the predetermined time after the sole remaining memory read or write request has been emptied from the transaction queue comprises a sufficient time for the memory device to receive and service the sole remaining memory read or write request.

17. The method of claim 16 wherein outputting the first signal in the first state comprises outputting the first signal in an oscillating state, and wherein the sufficient time for the memory device to receive and service the sole remaining memory read or write request comprises a predetermined number of oscillation cycles of the first signal before the first signal is rendered to the second state, the second state being a steady, non-oscillating state.

18. The method of claim 11 further comprising disabling oscillation of a first clock signal that enables operation of synchronous data transmission and reception circuits within the memory controller in response to determining that the transaction queue has reached the predetermined state, the method further comprising generating a second clock signal that oscillates at a lower frequency than the first clock signal and that remains oscillating at the lower frequency while oscillation of the first clock signal is disabled.

19. The method of claim 11 further comprising, after outputting the first signal in the second state, determining that the transaction queue has exited the predetermined state by virtue of storage therein of a newly received memory read request or memory write request, and, in response to determining that the transaction queue has exited the predetermined state, outputting the first signal in the first state to re-enable operation of the synchronous data transmission and reception circuits within the memory device.

20. A non-transitory machine readable medium that stores data representative of an integrated-circuit memory controller comprising:
a transaction queue to store memory read and write requests that, to be serviced, require operation of synchronous data transmission and reception circuits, respectively, within a memory device; and
power control circuitry to:
output, to the memory device, a first signal in a first state to enable operation of the synchronous data transmission and reception circuits within the memory device;
determine that the transaction queue has reached a predetermined state; and
in response to determining that the transaction queue has reached the predetermined state, output, to the memory device, the first signal in a second state to disable operation of the synchronous data transmission and reception circuits within the memory device.

* * * * *